United States Patent [19]
Kawashima et al.

[11] Patent Number: 5,894,588
[45] Date of Patent: Apr. 13, 1999

[54] DATA TRANSMITTING APPARATUS, DATA RECORDING APPARATUS, DATA TRANSMITTING METHOD, AND DATA RECORDING METHOD

[75] Inventors: Tetsuji Kawashima; Tatsuya Inokuchi, both of Kanagawa, Japan

[73] Assignee: Sony Corporation, Tokyo, Japan

[21] Appl. No.: 08/905,812

[22] Filed: Aug. 4, 1997

Related U.S. Application Data

[62] Division of application No. 08/564,144, Feb. 13, 1996, Pat. No. 5,805,932.

[30] Foreign Application Priority Data

Apr. 22, 1994 [JP] Japan .................................. 6-084950
Sep. 12, 1994 [JP] Japan .................................. 6-216928

[51] Int. Cl.$^6$ .................................................... G06F 3/023
[52] U.S. Cl. ............................................ 395/888; 360/8
[58] Field of Search ............................ 360/8; 395/888

[56] References Cited

U.S. PATENT DOCUMENTS

| | | | |
|---|---|---|---|
| 4,568,983 | 2/1986 | Bobick | 358/409 |
| 4,758,899 | 7/1988 | Tsukiyama | 360/8 |
| 4,937,681 | 6/1990 | Fujinawa et al. | 358/426 |
| 5,194,995 | 3/1993 | Severtson et al. | 360/48 |
| 5,210,829 | 5/1993 | Bitner | 395/877 |
| 5,237,460 | 8/1993 | Miller et al. | 360/8 |
| 5,278,970 | 1/1994 | Pence | 395/888 |
| 5,357,614 | 10/1994 | Pattisam et al. | 395/888 |
| 5,561,824 | 10/1996 | Carreiro et al. | 395/872 |

FOREIGN PATENT DOCUMENTS 0313191   10/1987   European Pat. Off. .

*Primary Examiner*—Thomas C. Lee
*Assistant Examiner*—Anderson I. Chen
*Attorney, Agent, or Firm*—Frommer Lawrence & Haug, LLP.; William S. Frommer

[57] ABSTRACT

A difference/compression ratio calculating means 76 in a data processing means 71 of a data transmitting apparatus according to the present invention calculates an actual difference and an actual compression ratio based on the data length of pre-compression data received from a data source 2 through pre-compression data receiving means 74 and the data length of compressed data outputted from a data compression circuit 67. If the actual difference is equal to or greater than a preset difference $\alpha$ and the actual compression ratio is equal to and greater than a preset compression ratio $\beta$, then the compressed data is transmitted to a data destination 3 through a transfer request data output means 79. Otherwise, the pre-compression data is transmitted to the data destination 3. With this arrangement, it is possible to prevent a phenomenon in which the size of compressed data which occupies a storage area in the data destination 3 is substantially the same as the size of uncompressed data which occupies the storage area, and also to avoid wasteful data expansion in the data destination 3.

22 Claims, 40 Drawing Sheets

FIG. 22

| BYTE No. | CONTENTS | RECORDED DATA |
|---|---|---|
| 0 | ID OF DDS | 0 A |
| 1 | ID OF DDS | 0 A |
| 2 | RESERVED | 0 0 |
| 3 | UNCERTIFIED<br>CERTIFIED | 0 2<br>0 1 |
| ⋮ | ⋮ | ⋮ |
| P | FILE ALLOCATION TABLE | O O |
| P+1 | FILE ALLOCATION TABLE | O O |
| ⋮ | ⋮ | ⋮ |
| P+Q | FILE ALLOCATION TABLE | O O |
| ⋮ | ⋮ | ⋮ |
| 2047 | RESERVED | 0 0 |

DDS SECTOR

FAT: { P, P+1, ..., P+Q }

FIG. 23

| | DATA MANAGEMENT INFORMATION IN HOST COMPUTER (a,b) | | DATA MANAGEMENT INFORMATION ON MAGNETOOPTICAL DISK (c,d,e) | | |
|---|---|---|---|---|---|
| RECORD 0 | 4900 | 4999 | 2000 | 2049 | 2050 |
| RECORD 1 | 0 | 0 | 2050 | 2099 | FFFF00 |
| RECORD 2 | 10000 | 10099 | 5000 | 5049 | FFFF01 |
| RECORD 3 | 0 | 0 | 0 | 0 | 0 |
| ...... | | | | | |
| RECORD N | 0 | 0 | 0 | 0 | 0 |

FIG. 27

RECORDED STATUS TABLE

2000/50 = 40TH BIT
2050/50 = 41ST BIT
5000/50 = 100TH BIT

DATA TRANSMITTING APPARATUS, DATA RECORDING APPARATUS, DATA TRANSMITTING METHOD, AND DATA RECORDING METHOD

This application is a division of application Ser. No. 08/564,144, filed Feb. 13, 1996 now U.S. Pat. No. 5,805,932.

TECHNICAL FIELD

The present invention relates to an apparatus for and a method of transmitting data, compressed by a loss-less data compression process, between memories, communication devices (including computer terminals), processors, or a host computer and an external memory.

The present invention further relates to an apparatus for and a method of recording data, transferred from an external source and compressed by a loss-less data compression process, on a recording medium, and more particularly to an apparatus for and a method of recording data in an external memory that can be connected to a host computer through an interface bus, e.g., a magnetic disk device such as a hard disk drive, a flexible disk drive, or the like for recording data on and reproducing data from a magnetic disk, or an optical disk drive for recording data on and reproducing data from a recordable optical disk such as a magnetooptical disk, a phase-change disk, or the like.

BACKGROUND ART

Generally, computers have a CPU (central processing unit) for reading program instructions stored in a main memory through a memory control unit and executing the program instructions to process various data and control various devices.

Program instructions are steps of a program (algorithms) for processing data or the like, and a program is normally composed of program instructions as a number of steps.

Some computers effect only simple processing according to a registered small-scale program which is composed of a relatively small number of program instructions. In such computers, a program is already registered in a ROM in the computer. However, a modern computer which carries out a number of data processing operations and control operations is required to have a separate memory means for storing a number of programs and data having a large data length.

It has been customary to employ an auxiliary memory device such as a hard disk drive, an optical disk drive employing a recordable optical disk such as a magnetooptical disk, or a bulk-type semiconductor memory, and connect such an auxiliary memory device to a computer through an interface bus for storing programs and data of large capacity in the auxiliary memory device. According to selective startup or a reading request from an OS (operating system) or an application program, a program or data stored in the auxiliary memory device is read into a main memory device for effecting data processing and controlling operations.

Present trends toward larger-capacity external memory devices have resulted in various techniques proposed to increase the recording capacity of magnetic disks and optical disks.

With the advent of multimedia information processing in recent years, the amount of information required by software applications, e.g., the capacity of programs and the capacity of data handled by programs, has increased at a rate greater than the rate at which the storage capacity of the external memory device increases. Therefore, the data compression technology tends to be more and more important.

One of the data compression techniques which is of the loss-less type (entropy coding or loss-less cording) that causes no data loss is drawing attention because it can increase an apparent capacity when data is recorded in an external memory device and also can effectively use communication lines when data is transmitted.

According to a data compression process based on the loss-less data compression technique, data is compressed by reducing redundant data contained in the data. When the compressed data is expanded, the uncompressed data prior to compression is fully restored without any loss of information.

However, the loss-less data compression technique is of such a nature that a compression ratio at which to compress data, i.e., the ratio of the data length of uncompressed data to the data length of compressed data, remains unknown until all the data is compressed because the compression data varies depending on the content of the data to be compressed.

According to the loss-less data compression technique, furthermore, binary bit map data or the like which has a very high level of redundancy is required to be compressed at a high compression ratio of 5 or more. If data that has already been compressed by a certain data compression process is to be further compressed by the loss-less data compression process, then the data will be expanded in many cases. Therefore, the loss-less data compression technique is very difficult to use.

In the case where data is compressed at a low compression ratio, e.g., in the case where compressed data is of a size which is 99% of original uncompressed data, no merit is attained by data compression since the data length of the uncompressed data and the data length of the compressed data remain almost the same though the data is definitely compressed.

For example, it is assumed that data to be stored in a random-access external memory device such as a magnetic disk drive or the like is compressed to increase an apparent storage capacity of the external memory device. The external memory device stores data in fixed lengths, e.g., blocks of 512 bytes. Therefore, if 1 Kbytes of data are stored in the external memory device, then they are stored over two blocks.

If such 1 Kbytes of data are compressed and the compressed data has a data length of 512 bytes or less, then the compressed data occupies one block of storage area on the disk. Therefore, the size of storage area which is occupied on the disk by the compressed data is ½ of the size of storage area which is occupied on the disk by the uncompressed data, an advantage that is offered by the data compression.

However, if the compressed data has a data length greater than 512 bytes, then the compressed data actually occupies two blocks of storage area on the disk even though the data has been compressed, and the size of storage area which is occupied on the disk by the compressed data is the same as the size of storage area which is occupied on the disk by the uncompressed data.

In such a case, the entire system only causes a wasteful expenditure of the time required for data compression (if the data is expanded, the time required for data compression/expansion), and the electric energy required by the CPU and a hardware arrangement dedicated for data compression, and may possibly suffer poor performance due to the data compression. If the compressed data is read from the external memory device for transmission to the computer, then since the data needs to be expanded, the time required for expanding the data is also consumed wastefully.

In communications applications where compressed data is divided into packets of fixed length for transmission, there are instances in which the number of packets occupied by uncompressed data and the number of packets occupied by compressed data may be the same as each other, posing a limitation on efforts to improve the entire system performance.

If data is compressed according to the loss-less data compression process to shorten a time required to transfer data between a computer and an external memory device for the purpose of using communication lines more effectively, then a transfer time $t_{AC_1}$ required for transmitting the compressed data is shorter than a transfer time $t_{A1}$ required for transmitting the uncompressed data, as shown in FIG. 43 of the accompanying drawings.

When the data is compressed, a time $t_{B1}$ required for data compression/expansion is newly needed in addition to an actual data transfer time $t_{C1}$. However, since the data to be actually transmitted is compressed, the apparent data length is reduced. Therefore, the data compression shortens the transfer time as a whole. In order to shorten the transfer time, it is necessary to compress the data rapidly to reduce the time $t_{B1}$ required for data compression/expansion.

If the data is compressed at a low compression ratio, then, as shown in FIG. 44 of the accompanying drawings, because an actual data transfer time $t_{C2}$ is not reduced substantially, the addition of a time $t_{B2}$ required for data compression/expansion results in a transfer time $t_{AC2}$ required for transmitting the compressed data which is longer than a transfer time $t_{A2}$ required for transmitting the uncompressed data.

Consequently, the data compression does not offer merits, but instead lowers the overall system performance.

For data transmission between a host computer and an external memory device, the host computer performs the above function of loss-less data compression. With a plurality of external memory devices connected to the host computer, however, a long calculating time is required to compress data for transmitting different data from the host computer to the plural external memory devices, and hence a considerable period of time is necessary until the transfer of data to all the external memory devices is completed.

Stated otherwise, for transmitting different data from the host computer to the plural external memory devices, the host computer is tied up with the data compression, and cannot perform other processing.

Naturally, the apparent storage capacity of only those external memory devices which are connected to a host computer capable of compressing data can be increased. That is, only those external memory devices connected to a host computer capable of compressing data are given the advantages of data compression. An external memory device having a disk on which compressed data is recorded can be operation for data reproduction by only a host computer capable of expanding compressed data.

If an external memory device incorporates a data compression function for allowing individual external memory devices to compress data, then the time required for a host computer to compress data can be eliminated, and a host computer having no data compression capability can enjoy the advantages of data compression at external memory devices, i.e., an increased apparent storage capacity. Such a host computer is then able to handle various programs and data.

A data compression function that can be incorporated in an external memory device may be performed by a loss-less data compression technique by which expanded data is made exactly the same as input data, e.g., the known Huffmann coding technique or LZW (Lempel-Ziv and Welch) coding technique, rather than a data compression technique that causes a data loss, which is used to compress digital audio data converted from analog audio data or digital image data, e.g., the known discrete cosine coding technique. If such a loss-less data compression technique is employed, then the compression ratio varies depending on the contents of supplied data, e.g., depending on how much the same words, the same expressions, etc. are used in the data.

Specifically, if it is assumed that a compression ratio to be expected (hereinafter referred to as an "expected compression ratio") when uncompressed data is compressed by the loss-less data compression technique has a value of 2, then when one logic block of data having a certain data length which is transferred from a host computer is compressed by an external memory device, the compressed data has a data length equal to one physical block whose size is ½ of one logic block provided the data is compressed as expected, i.e., the data is compressed at the same compression ratio as the expected compression ratio. In this instance, two physical blocks are equal to one logic block.

Therefore, an optical disk having a physical capacity of 500 MB (MegaByte) has an apparent capacity of 1 GB (GigaByte) as seen from the host computer. However, when the loss-less data compression technique is employed, since the data length of compressed data may not necessarily be ½ or less of the data length of the uncompressed data, one logic block of transferred data may not be contained within one physical block.

Inasmuch as data compression may possibly result in data expansion, one logic block of data may be expanded into data over three or more physical blocks. Such a phenomenon occurs when an actual compression ratio is less than 1.

In this case, the system performance is lowered regardless of efforts to increase the performance by increasing the apparent capacity by way of data compression. Specifically, even though data is compressed, a physical capacity which the compressed data occupies on an optical disk remains the same as or is greater than the capacity of one logic block. When the compressed data is to be read, a time is required to expand the compressed data. Consequently, the compressed data occupies the same space on the optical disk as would if the data were not compressed, and an additional time is needed to expand the compressed data when it is to be read. As a result, it is possible for the system to fail to offer any advantages from data compression.

Data is randomly recorded on and reproduced from a magnetic disk or an optical disk. For recording compressed data over two or more physical blocks on an optical disk, for example, the data is randomly recorded in physical blocks, for example.

There are occasions where mutually related compressed data over two or more physical blocks are recorded in physical blocks at spatially spaced positions on a magnetic or optical disk. Such instances manifest themselves where data is to be randomly recorded on a magnetic or optical disk on which data has already been recorded. When data are to be read from the magnetic or optical disk, a seeking (searching) process for searching for the mutually related compressed data is time-consuming, resulting in a long access time.

The present invention has been made in view of the above problems. It is an object of the present invention to provide an apparatus for and a method of transmitting data for increasing overall system performance by transmitting either uncompressed data or compressed data based on the data length of the uncompressed data, the data length of the compressed data, and a preset condition.

Another object of the present invention is to provide an apparatus for and a method of recording data for making it unnecessary to expand recorded data, of the data recorded on a recording medium, whose actual compression ratio satisfies a certain condition, so that the data can be read from the recording medium at a greatly increased rate.

Still another object of the present invention is to provide an apparatus for and a method of recording data for preventing two or more physical blocks of data from being recorded in physical blocks at physically spaced positions, but recording them in areas corresponding to two or more successive physical blocks for thereby effectively shortening a seek time consumed for reading data.

DISCLOSURE OF THE INVENTION

An apparatus for transmitting data according to the present invention comprises pre-compression data holding means for holding pre-compression data, data compressing means for compressing the pre-compression data held by the pre-compression data holding means, compressed data holding means for holding compressed data from the data compressing means, decision means for determining data to be transmitted, based on data lengths of the pre-compression data and the compressed data and a preset condition, and data transmitting means for transmitting either one of the pre-compression data held by the pre-compression data holding means and the compressed data held by the compressed data holding means, based on the data determined by the decision means.

The pre-compression data held by the pre-compression data holding means is compressed by the data compressing means, and the compressed data is held by the compressed data holding means.

The decision means determines data to be transmitted, based on data lengths of the pre-compression data and the compressed data and a preset condition. Based on the data determined by the decision means, the data transmitting means transmits either one of the pre-compression data and the compressed data.

For example, if the preset condition is satisfied, then the compressed data is transmitted, and if the preset condition is not satisfied, then the pre-compression data is transmitted.

As a result, it is possible to prevent a phenomenon in which the size of compressed data which occupies a storage area in a data destination is substantially the same as the size of uncompressed data which occupies the storage area, and also to avoid wasteful data expansion in the data destination.

The decision means may comprise means for determining the data to be transmitted, based on an actual difference between the data lengths of the pre-compression data and the compressed data and a preset difference, determining the data to be transmitted as the compressed data if the actual difference is at least the preset difference, and determining the data to be transmitted as the pre-compression data if the actual difference is smaller than the preset difference.

Alternatively, the decision means may comprise means for determining the data to be transmitted, based on an actual compression ratio of the data length of the pre-compression data to the data length of the compressed data and a preset compression ratio, determining the data to be transmitted as the compressed data if the actual compression ratio is at least the preset compression ratio, and determining the data to be transmitted as the pre-compression data if the actual compression ratio is smaller than the preset compression ratio.

Further alternatively, the decision means may comprise means for determining the data to be transmitted as the compressed data if an actual difference between the data lengths of the pre-compression data and the compressed data is at least a preset difference and also if an actual compression ratio of the data length of the pre-compression data to the data length of the compressed data is at least a preset compression ratio, and determining the data to be transmitted as the pre-compression data otherwise.

It is assumed that an arrangement is employed to transfer compressed data when the actual difference is at least the preset difference. With the preset difference being 512 bytes, for example, if the pre-compression data has a data length of 2 Kbytes, then compressed data is transferred when the data length of the compressed data is 1.5 Kbytes or shorter.

Similarly, if the pre-compression data has a data length of 1 Mbytes (1000 Kbytes), then compressed data is transferred when the data length of the compressed data is 999.5 Kbytes or shorter.

The ratio (actual compression ratio) of the pre-compression data (data length=1000 Kbytes) to the compressed data (data length=999.5 Kbytes) is about 1.0005, and the percentage of the data length (corresponding to the data length difference) removed by the data compression with respect to the data length of the pre-compression data is only 0.05%. With this compression ratio, the data length of the compressed data remains substantially the same as the data length of the pre-compression data.

Consequently, when it is determined whether the compressed data or the pre-compression data is to be transferred based on only the comparison between the actual difference and the preset difference, if the actual difference is equal to or greater than the preset difference, then the compressed data is transferred even though the data length of the compressed data remains substantially the same as the data length of the pre-compression data. As a consequence, the compressed data needs to be expanded over a period of time which is not short, resulting in a wasteful expenditure of time.

According to the above decision process, however, compressed data is transferred only when the actual difference is at least the preset difference and the actual compression ratio is at least the preset compression ratio, as described above. Thus, even when the actual difference is at least the preset difference, no compressed data is transferred, but the pre-compression data is transferred, if the actual compression ratio is smaller than the preset compression ratio. In this case, no time-consuming data expansion process is carried out in the data destination, so that any wasteful expenditure of time occurs in the data destination. In this manner, the overall system performance is improved.

The decision means may comprise means for determining whether an actual compression ratio of the data length of the pre-compression data to the data length of the compressed data satisfies either one of two preset conditions, determining the data to be transmitted as the pre-compression data if the actual compression ratio satisfies one of the two conditions, and determining the data to be transmitted as the compressed data if the actual compression ratio satisfies the other of the two conditions.

The above one of the two conditions may be 0<the actual compression ratio $\epsilon<\beta(\beta-1)$ and the other of the two conditions may be the actual compression ratio $\epsilon \geq \beta(\beta-1)$ where $\beta$ is a compression ratio to be expected when the pre-compression data is compressed.

The data transmitting apparatus may further comprise preset value changing means for changing the preset compression ratio or the preset difference and the preset compression ratio and the preset difference to optional values. With the preset value changing means, it is possible to change the preset difference and the preset compression ratio which have been set for shipment into a preset difference and a preset compression ratio that have been logically or experimentally established on a system (hardware and software) created by the operator (user). As a consequence, data can be compressed under data compressing conditions optimum for the system created by the operator (user), making it possible to improve the quality of file management. This leads to an increase in the overall system performance.

To achieve the above object, there is also provided in accordance with the present invention an apparatus for transmitting data, comprising pre-compression data holding means for holding pre-compression data, data compressing means for compressing the pre-compression data held by the pre-compression data holding means in units of a predetermined data length, compressed data holding means for holding compressed data from the data compressing means, decision means for determining data to be transmitted, based on a data length of partial compressed data produced by compressing a portion of the pre-compression data with the data compressing means, a data length of the portion of the pre-compression data, and a preset condition, and data transmitting means for transmitting either one of the pre-compression data held by the pre-compression data holding means and the compressed data held by the compressed data holding means, based on the data determined by the decision means.

The pre-compression data held by the pre-compression data holding means is compressed in units of a predetermined data length by the data compressing means, and the compressed data is successively by the compressed data holding means.

The decision means determines data to be transmitted, based on a data length of partial compressed data produced by compressing a portion of the pre-compression data with the data compressing means, a data length of the portion of the pre-compression data, and a preset condition. Based on the data determined by the decision means, either one of the pre-compression data and the compressed data is transmitted from the data transmitting means.

For example, if the preset condition is satisfied, then the compressed data is transmitted, and if the preset condition is not satisfied, then the pre-compression data is transmitted.

As a result, it is possible to prevent a phenomenon in which the size of compressed data which occupies a storage area in a data destination is substantially the same as the size of uncompressed data which occupies the storage area, and also to avoid wasteful data expansion in the data destination.

With this arrangement, not all the pre-compression data is compressed, but data to be transmitted is determined based on a data length of partial compressed data produced by compressing a portion of the pre-compression data with the data compressing means, a data length of the portion of the pre-compression data, and a preset condition. Therefore, it is possible to shorten the time required to compress the data.

The data transmitting apparatus may further comprise data deleting means for successively deleting the pre-compression data compressed by the data compressing means. This allows the pre-compression data holding means to be used highly efficiently and a system shutdown due to a storage capacity shortage can be avoided.

The decision means may comprise means for determining the data to be transmitted, based on a predicted compression ratio of the data length of the portion of the pre-compression data to the data length of the partial compressed data, and a preset compression ratio, determining the data to be transmitted as the compressed data if the predicted compression ratio is at least the preset compression ratio, and determining the data to be transmitted as the pre-compression data if the predicted compression ratio is smaller than the preset compression ratio.

The data compressing means may comprise means for stopping compressing the pre-compression data after the portion of the pre-compression data is compressed when the decision means determines the data to be transmitted as the pre-compression data. In this case, since the pre-compression data is not compressed after the portion of the pre-compression data is compressed when the decision means determines the data to be transmitted as the pre-compression data, it is possible to shorten the overall processing time, i.e., the period of time from the time when the pre-compression data is compressed to the time when the pre-compression data or the compressed data is transmitted.

The data transmitting apparatus may further comprise weighting means for weighting the predicted compression ratio depending on the type of data. With the weighting means, irrespective of the type of data, any error of the predicted compression ratio with respect to the expected final compression ratio is minimized, thus improving the overall system performance.

The data transmitting apparatus may further comprise preset value changing means for changing the preset compression ratio to an optional value. With the preset value changing means, it is possible to change the preset difference and the preset compression ratio which have been set for shipment into a preset difference and a preset compression ratio that have been logically or experimentally established on a system (hardware and software) created by the operator (user). As a consequence, data can be compressed under data compressing conditions optimum for the system created by the operator (user), making it possible to improve the quality of file management. This leads to an increase in the overall system performance.

To achieve the above object, there is also provided in accordance with the present invention an apparatus for recording data, comprising data recording means for recording data on a recording medium, data compressing means for compressing input data, data holding means for pre-compression data which comprises input data that is not compressed and compressed data from the data compressing means, decision means for determining data to be outputted, based on data lengths of the pre-compression data and the compressed data and a preset condition, and data output means for outputting either one of the pre-compression data and the compressed data held by the data holding means to the data recording means, based on the data determined by the decision means.

The pre-compression data held by the data holding means is compressed by the data compressing means, and the compressed data is held by the data holding means.

The decision means determines data to be outputted, based on data lengths of the pre-compression data and the compressed data and a preset condition. Based on the data determined by the decision means, either one of the pre-compression data and the compressed data is outputted to the data recording means by the data output means, and recorded on the recording medium.

For example, if the preset condition is satisfied, then the compressed data is recorded on the recording medium, and if the preset condition is not satisfied, then the pre-compression data is recorded on the recording medium.

As a result, it is possible to prevent a phenomenon in which the size of compressed data which occupies a storage area in a data destination is substantially the same as the size of uncompressed data which occupies the storage area, and also to avoid wasteful data expansion when data is read from the recording medium.

Specifically, the recorded data with its actual compression ratio not satisfying the preset condition, among the data recorded on the recording medium, is not required to be expanded, so that the speed at which the data is read from the recording medium can be increased.

The decision means may comprise means for determining the data to be outputted, based on an actual difference between the data lengths of the pre-compression data and the compressed data and a preset difference, determining the data to be outputted as the compressed data if the actual difference is at least the preset difference, and determining the data to be outputted as the pre-compression data if the actual difference is smaller than the preset difference. With this arrangement, if the actual difference is equal to or greater than the preset difference, then the compressed data is recorded on the recording medium, and if the actual difference is smaller than the preset difference, then the pre-compression data is recorded on the recording medium.

Alternatively, the decision means may comprise means for determining the data to be outputted, based on an actual compression ratio of the data length of the pre-compression data to the data length of the compressed data and a preset compression ratio, determining the data to be outputted as the compressed data if the actual compression ratio is at least the preset compression ratio, and determining the data to be outputted as the pre-compression data if the actual compression ratio is smaller than the preset compression ratio. With this arrangement, if the actual compression ratio is equal to or greater than the preset compression ratio, then the compressed data is recorded on the recording medium, and if the actual compression ratio is smaller than the preset compression ratio, t hen the pre-compression data is recorded on the recording medium.

Further alternatively, the decision means may comprise means for determining the data to be outputted as the compressed data if an actual difference between the data lengths of the pre-compression data and the compressed data is at least a preset difference and also if an actual compression ratio of the data length of the pre-compression data to the data length of the compressed data is at least a preset compression ratio, and determining the data to be outputted as the pre-compression data otherwise. With this arrangement, if the actual difference is equal to or greater than the preset difference and also if the actual compression ratio is equal to or greater than the preset compression ratio, then the compressed data is recorded on the recording medium. Otherwise, the pre-compression data is recorded on the recording medium.

Still further alternatively, the decision means may comprise means for determining whether an actual compression ratio of the data length of the pre-compression data to the data length of the compressed data satisfies either one of two preset conditions, determining the data to be outputted as the pre-compression data if the actual compression ratio satisfies one of the two conditions, and determining the data to be outputted as the compressed data if the actual compression ratio satisfies the other of the two conditions. With this arrangement, if the actual compression ratio satisfies one of the two conditions, then the pre-compression data is recorded on the recording medium, and if the actual compression ratio satisfies the other of the two conditions, then the compressed data is recorded on the recording medium.

The above one of the two conditions may be $0<$ the actual compression ratio $\epsilon<\beta(\beta-1)$ and the other of the two conditions may be the actual compression ratio $\epsilon \geq \beta(\beta-1)$ where $\beta$ is a compression ratio to be expected when the pre-compression data is compressed.

In this case, the input data is compressed by the data compressing means, the compressed data is held by the data holding means, and data which is the input data not compressed is held as pre-compression data by the data holding means. The decision means determines the relationship between the actual compression ratio $\epsilon$ and the expected compression ratio $\beta$ in the data compressing means. If the actual compression ratio $\epsilon$ and the expected compression ratio $\beta$ are related to each other as represented by $\epsilon \geq \beta(\beta-1)$, i.e., if the data length of the compressed data is substantially smaller than the data length of transferred data, then the compressed data is outputted to the data recording means by the data output means. Therefore, the compressed data is recorded on the recording medium by the data recording means.

If the actual compression ratio e and the expected compression ratio $\beta$ are related to each other as represented by $0<\epsilon<\beta(\beta-1)$, i.e., if the data length of the compressed data is substantially the same as or greater than the data length of the input data, then the pre-compression data is outputted to the data recording means by the data output means. Therefore, the pre-compression data is recorded on the recording medium by the data recording means.

In the data recording apparatus according to the present invention, inasmuch as the data which is the input data not compressed, i.e., the pre-compression data, is recorded on the recording medium if the data length of the compressed data is substantially the same as or greater than the data length of the input data, the data read from the recording medium is not required to be expanded subsequently. Consequently, the speed at which the data is read from the recording medium is increased.

In the data recording apparatus, addresses defined in the input data are referred to as logic addresses with reference to unit logic blocks determined by a data length of the input, and addresses defined by address allocation in recording the compressed data on the recording medium are referred to as physical addresses with reference to unit physical blocks determined by the data length of the compressed data produced after the input data is compressed at the same actual compression ratio $\epsilon$ as the expected compression ratio $\beta$ by the data compressing means. The data output means comprises means for outputting the compressed data or the pre-compression data to the data recording means while specifying a writing physical address of the compressed data or the pre-compression data. With this arrangement, the data recording apparatus operates as follows:

Input data of one logic block is compressed by the data compressing means, and held as compressed data of one physical block or two or more physical blocks by the data holding means. Data which is the input data not compressed is held as pre-compression data of one logic block by the data holding means.

The decision means determines the relationship between the actual compression ratio $\epsilon$ and the expected compression ratio $\beta$ in the data compressing means. If the actual compression ratio $\epsilon$ and the expected compression ratio $\beta$ are related to each other as represented by $\epsilon \geq \beta(\beta-1)$, i.e., if the size (the number of physical blocks) of the compressed data is substantially smaller than the size (the number of physical blocks making up one logic block) of the input data, then the data output means specifies a writing physical address and outputs the compressed data to the data recording means. Therefore, the compressed data is recorded on the recording medium in an area corresponding to the writing physical address by the data recording means.

If the actual compression ratio $\epsilon$ and the expected compression ratio $\beta$ are related to each other as represented by $0<\epsilon<\beta(\beta-1)$, i.e., if the size (the number of physical blocks) of the compressed data is the same as or greater than the size (the number of physical blocks making up one logic block) of the input data, then the data output means specifies a writing physical address and outputs the pre-compression data to the data recording means. Therefore, the pre-compression data is recorded on the recording medium in an area corresponding to the writing physical address by the data recording means.

Since the data, i.e., the pre-compression data, which is the input data not compressed is recorded on the recording medium if the size (the number of physical blocks) of the compressed data is the same as or greater than the size (the number of physical blocks making up one logic block) of the input data, the data read from the recording medium is not required to be expanded subsequently. Consequently, the speed at which the data is read from the recording medium is increased.

The data recording apparatus may further comprise recording means for recording an allocation table representing a correspondence between reading logic addresses of the input data and writing physical addresses of the compressed data or the pre-compression data in a predetermined area of the recording medium.

When the data output means is to specify a writing physical address and selectively output the compressed data and the pre-compression data to the data recording means based on the data determined by the decision means, the data output means refers to the writing physical address corresponding to the reading logic address of the input data from the allocation table, and outputs the compressed data or the pre-compression data while specifying the writing physical address.

Since the data output means can easily confirm, from the allocation table, the correspondence between logic addresses handled by an external source, e.g., a host computer, and physical addresses handled by the data recording apparatus, the host computer, for example, is not required to recognize physical addresses of the recording medium, but can access the data only with logic addresses through the data recording apparatus.

The recording apparatus may further comprise table generating means for generating a record status table composed of record statuses of data recorded on the recording medium as bit information in units of physical blocks, based on the physical addresses registered in the allocation table.

When the data output means is to specify a writing physical address and selectively output the compressed data and the pre-compression data to the data recording means, it is possible to determine the physical address while referring to bit information of the record status table generated by the table generating means.

Since the record statuses can be recognized by simple bits of 1/0, the search time can be made shorter than if writing physical addresses were directly searched while referring physical addresses registered in the allocation table. The time required for program debugging, system maintenance, etc. is shorter than if the record statuses were recognized from physical sector addresses having a complex bit arrangement in data structure.

The data recording apparatus may further comprise individual area searching means for searching a substantially unrecorded area on the recording medium in units of physical blocks to detect a physical address in the unrecorded area, the data output means comprising means for outputting the compressed data or the pre-compression data to the data recording means while specifying the physical address in the unrecorded area detected by the individual area searching means.

With this arrangement, a substantially recorded area on the recording medium is searched in units of physical blocks to detect a physical address in the unrecorded area by the individual area searching means.

Then, the data output means specifies a physical address detected by the individual area searching means as a writing physical address, and outputs the compressed data or the pre-compression data to the data recording means. Consequently, the compressed data or the pre-compression data is recorded in an area corresponding to the writing physical address on the recording medium by the data recording means.

Inasmuch as the compressed data or the pre-compression data is randomly recorded in an optional unrecorded area of unit physical blocks, this arrangement is advantageous for recording compressed data or pre-compression data having a size of unit physical blocks. Compressed data or pre-compression data over two or more physical blocks may be recorded in physically spaced positions in units of a physical block.

The data recording apparatus may further comprise successive area searching means for searching a substantially unrecorded area on the recording medium in units of at least two successive physical blocks to detect a physical address in the unrecorded area if the actual compression ratio $\epsilon$ is smaller than the predicted compression ratio $\beta$ and the compressed data extends over at least two physical blocks, the data output means comprising means for outputting the compressed data or the pre-compression data to the data recording means while specifying the physical address in the unrecorded area detected by the successive area searching means.

The successive area searching means searches a substantially unrecorded area on the recording medium in units of at least two successive physical blocks to detect a physical address in the unrecorded area.

The data output means specifies a physical address detected by the successive area searching means as a writing physical address, and outputs the compressed data or the pre-compression data over two or more physical blocks to the data recording means. Consequently, the compressed data or the pre-compression data is recorded in successive areas corresponding to the writing physical address on the recording medium by the data recording means.

Inasmuch as the compressed data or the pre-compression data over two or more physical blocks is recorded in successive unrecorded areas, the compressed data or the pre-compression data over two or more physical blocks is prevented from being recorded in physically spaced positions in units of a physical block. Therefore, the seek time for reading data can effectively be shortened.

The allocation table may have a first registering area in which the reading logic addresses of the input data and the writing physical addresses of the compressed data or the pre-compression data corresponding to the reading logic addresses are registered, and a second registering area in which the physical addresses of the respective physical blocks, except for a starting physical address, are registered as respective link addresses if the compressed data or the pre-compression data extends over at least two physical blocks, and the data recording apparatus may further comprise means for registering information indicative of no link address and decision data representing whether the data to be recorded on the recording medium is the compressed data or the pre-compression data, in an area corresponding to a final physical block in the second registering area.

In the data recording apparatus, the compressed data and the pre-compression data are selectively recorded on the recording medium depending on the relationship between the actual compression ratio $\epsilon$ and the predicted compression ratio $\beta$ in the data compressing means. The above process needs new information for distinguishing compressed data and pre-compression data from each other.

According to the present invention, however, decision data for distinguishing compressed data and uncompressed data from each other is stored together with information indicative of no link address in an area corresponding to the final physical block in the second registering area of the allocation table. Therefore, it is not necessary to keep a storage area for registering the decision data on the recording medium, with the result that the problem of a reduced data recording capacity is alleviated.

The data transmitting apparatus and the data recording apparatus according to the present invention are not limited to embodiments described below, but may be changed or modified without departing from the scope of the present invention.

According to the present invention, there is also provided a method of transmitting data, comprising the steps of determining data to be transmitted, based on a data length of a pre-compression data which is held, a data length of compressed data produced by compressing the pre-compression data, and a preset condition, and transmitting either one of the pre-compression data and the compressed data based on the data determined to be transmitted.

For example, if the preset condition is satisfied, then the compressed data is transmitted, and if the preset condition is not satisfied, then the pre-compression data is transmitted.

As a result, it is possible to prevent a phenomenon in which the size of compressed data which occupies a storage area in a data destination is substantially the same as the size of uncompressed data which occupies the storage area, and also to avoid wasteful data expansion in the data destination.

The step of determining may comprise the step of determining the data to be transmitted, based on an actual difference between the data lengths of the pre-compression data and the compressed data and a preset difference, and the step of transmitting may comprise the steps of transmitting the compressed data if the actual difference is at least the preset difference, and transmitting the pre-compression data if the actual difference is smaller than the preset difference.

Alternatively, the step of determining may comprise the step of determining the data to be transmitted, based on an actual compression ratio of the data length of the pre-compression data to the data length of the compressed data and a preset compression ratio, and the step of transmitting may comprise the steps of transmitting the compressed data if the actual compression ratio is at least the preset compression ratio, and transmitting the pre-compression data if the actual compression ratio is smaller than the preset compression ratio.

Further alternatively, the step of transmitting comprises the steps of transmitting the compressed data if an actual difference between the data lengths of the pre-compression data and the compressed data is at least a preset difference and also if an actual compression ratio of the data length of the pre-compression data to the data length of the compressed data is at least a preset compression ratio, and transmitting the pre-compression data otherwise.

With such an arrangement, even when the actual difference is at least the preset difference, no compressed data is transferred, but the pre-compression data is transferred, if the actual compression ratio is smaller than the preset compression ratio, i.e., if the data length of the compressed data remains essentially the same as the data length of the pre-compression data. In this case, no time-consuming data expansion process is carried out in the data destination, so that any wasteful expenditure of time occurs in the data destination. In this manner, the overall system performance is improved.

Still further alternatively, the step of determining may comprise the step of determining whether an actual compression ratio of the data length of the pre-compression data to the data length of the compressed data satisfies either one of two preset conditions, and the step of transmitting may comprise the steps of transmitting as the pre-compression data if the actual compression ratio satisfies one of the two conditions, and transmitting the compressed data if the actual compression ratio satisfies the other of the two conditions.

The above one of the two conditions may be 0<the actual compression ratio $\epsilon < \beta(\beta-1)$ and the other of the two conditions may be the actual compression ratio $\epsilon \geq \beta(\beta-1)$ where $\beta$ is a compression ratio to be expected when the pre-compression data is compressed.

The preset compression ratio or the preset difference and the preset compression ratio and the preset difference may be changed to optional values. Then, it is possible to change the preset difference and the preset compression ratio which have been set for shipment into a preset difference and a preset compression ratio that have been logically or experimentally established on a system (hardware and software) created by the operator (user). As a consequence, data can be compressed under data compressing conditions optimum for the system created by the operator (user), making it possible to improve the quality of file management. This leads to an increase in the overall system performance.

According to the present invention, there is further provided a method of transmitting data, comprising the steps of determining data to be transmitted, based on a data length of partial compressed data produced by compressing a portion of pre-compression data which is held, a data length of the portion of the pre-compression data, and a preset condition, and transmitting either one of the pre-compression data and the compressed data based on the data determined to be transmitted.

For example, if the preset condition is satisfied, then the compressed data is transmitted, and if the preset condition is not satisfied, then the pre-compression data is transmitted.

As a result, it is possible to prevent a phenomenon in which the size of compressed data which occupies a storage area in a data destination is substantially the same as the size of uncompressed data which occupies the storage area, and also to avoid wasteful data expansion in the data destination.

According to this method, not all the pre-compression data is compressed, but data to be transmitted is determined based on a data length of partial compressed data produced by compressing a portion of the pre-compression data with the data compressing means, a data length of the portion of the pre-compression data, and a preset condition. Therefore, it is possible to shorten the time required to compress the data.

In the above method, the compressed portion of the pre-compression data may successively be deleted. This allows the pre-compression data holding means to be used highly efficiently and a system shutdown due to a storage capacity shortage can be avoided.

The step of determining may comprise the step of determining the data to be transmitted, based on a predicted compression ratio of the data length of the portion of the pre-compression data to the data length of the partial compressed data, and a preset compression ratio, and the step of transmitting may comprise the steps of transmitting the compressed data if the predicted compression ratio is at least the preset compression ratio, and transmitting the pre-compression data if the predicted compression ratio is smaller than the preset compression ratio.

The method may further comprise the step of stopping compressing the pre-compression data after the portion of the pre-compression data is compressed when the data to be transmitted is determined as the pre-compression data. In this case, since the pre-compression data is not compressed after the portion of the pre-compression data is compressed when the decision means determines the data to be transmitted as the pre-compression data, it is possible to shorten the overall processing time, i.e., the period of time from the time when the pre-compression data is compressed to the time when the pre-compression data or the compressed data is transmitted.

The method may further comprise the step of weighting the predicted compression ratio depending on the type of data. With the weighting step, irrespective of the type of data, any error of the predicted compression ratio with respect to the expected final compression ratio is minimized, thus improving the overall system performance.

The preset compression ratio may be changed to an optional value. It is then possible to change the preset difference and the preset compression ratio which have been set for shipment into a preset difference and a preset compression ratio that have been logically or experimentally established on a system (hardware and software) created by the operator (user). As a consequence, data can be compressed under data compressing conditions optimum for the system created by the operator (user), making it possible to improve the quality of file management. This leads to an increase in the overall system performance.

According to the present invention, there is also provided a method of recording data, comprising the steps of determining data to be recorded, based on a data length of pre-compression data which comprises input data that is not compressed, a data length of compressed data which comprises input data that is compressed, and a preset condition, and recording either one of the pre-compression data and the compressed data on a recording medium based on the data determined to be recorded.

For example, if the preset condition is satisfied, then the compressed data is recorded on the recording medium, and if the preset condition is not satisfied, then the pre-compression data is recorded on the recording medium.

As a result, it is possible to prevent a phenomenon in which the size of compressed data which occupies a storage area in a data destination is substantially the same as the size of uncompressed data which occupies the storage area, and also to avoid wasteful data expansion when data is read from the recording medium.

Specifically, the recorded data with its actual compression ratio not satisfying the preset condition, among the data recorded on the recording medium, is not required to be expanded, so that the speed at which the data is read from the recording medium can be increased.

The step of determining may comprise the step of determining the data to be recorded, based on an actual difference between the data lengths of the pre-compression data and the compressed data and a preset difference. If the actual difference is equal to or greater than the preset difference, the data to be outputted is determined as the compressed data, and if the actual difference is smaller than the preset difference, the data to be outputted is determined as the pre-compression data. Therefore, the compressed data is recorded on the recording medium if the actual difference is at least the preset difference, and the pre-compression data is recorded on the recording medium if the actual difference is smaller than the preset difference.

Alternatively, the step of determining may comprise the step of determining the data to be recorded, based on an actual compression ratio of the data length of the pre-compression data to the data length of the compressed data and a preset compression ratio, and the step of recording may comprise the steps of recording the compressed data if the actual compression ratio is at least the preset compression ratio, and recording the pre-compression data if the actual compression ratio is smaller than the preset compression ratio.

Further alternatively, the step of recording comprises the steps of recording the compressed data if an actual difference between the data lengths of the pre-compression data and the compressed data is at least a preset difference and also if an actual compression ratio of the data length of the pre-compression data to the data length of the compressed data is at least a preset compression ratio, and recording the pre-compression data otherwise.

Still further alternatively, the step of determining comprises the step of determining whether an actual compression ratio of the data length of the pre-compression data to the data length of the compressed data satisfies either one of two preset conditions, and the step of recording comprises the steps of recording the pre-compression data if the actual compression ratio satisfies one of the two conditions, and recording the compressed data if the actual compression ratio satisfies the other of the two conditions.

The above one of the two conditions may be $0 < $ the actual compression ratio $\epsilon < \beta(\beta-1)$ and the other of the two conditions may be the actual compression ratio $\epsilon \geq \beta(\beta-1)$ where $\beta$ is a compression ratio to be expected when the pre-compression data is compressed. If the data length of the compressed data is substantially the same as or greater than the data length of the input data, then the data which is the input data not compressed, i.e., the pre-compression data, is recorded on the recording medium. Therefore, the data read from the recording medium is not required to be expanded subsequently. Consequently, the speed at which the data is read from the recording medium is increased.

In the above data recording method, addresses defined in the input data are referred to as logic addresses with reference to unit logic blocks determined by a data length of the input, and addresses defined by address allocation in recording the compressed data on the recording medium are referred to as physical addresses with reference to unit physical blocks determined by the data length of the compressed data produced after the input data is compressed at the same actual compression ratio ε as the expected compression ratio β. The step of recording may comprise the step of recording the compressed data or the pre-compression data while specifying a writing physical address of the compressed data or the pre-compression data.

If the size (the number of physical blocks) of the compressed data is substantially the same as or greater than the size (the number of physical blocks making up one logic block) of the input data, then the data which is the input data not compressed, i.e., the pre-compression data, is recorded on the recording medium. Therefore, the data read from the recording medium is not required to be expanded subsequently. Consequently, the speed at which the data is read from the recording medium is increased.

The data recording method may further comprise the step of recording an allocation table representing a correspondence between reading logic addresses of the input data and writing physical addresses of the compressed data or the pre-compression data in a predetermined area of the recording medium.

Since the correspondence between logic addresses and physical addresses can easily be confirmed from the allocation table, an externally connected host computer, for example, is not required to recognize physical addresses of the recording medium, but can access the data only with logic addresses.

The data recording method may further comprise the step of generating a record status table composed of record statuses of data recorded on the recording medium as bit information in units of physical blocks, based on the physical addresses registered in the allocation table.

Since the record statuses can be recognized by simple bits of 1/0, the search time can be made shorter than if writing physical addresses were directly searched while referring physical addresses registered in the allocation table. The time required for program debugging, system maintenance, etc. is shorter than if the record statuses were recognized from physical sector addresses having a complex bit arrangement in data structure.

The data recording method may further comprise the step of searching a substantially unrecorded area on the recording medium in units of physical blocks to detect a physical address in the unrecorded area, the step of recording comprising the step of recording the compressed data or the pre-compression data while specifying the physical address in the unrecorded area which is detected.

Inasmuch as the compressed data or the pre-compression data is randomly recorded in an optional unrecorded area of unit physical blocks, this arrangement is advantageous for recording compressed data or pre-compression data having a size of unit physical blocks. Compressed data or pre-compression data over two or more physical blocks may be recorded in physically spaced positions in units of a physical block.

The data recording method may further comprise the step of searching a substantially unrecorded area on the recording medium in units of at least two successive physical blocks to detect a physical address in the unrecorded area if the actual compression ratio is smaller than the predicted compression ratio and the compressed data extends over at least two physical blocks, and the step of recording may comprise the step of recording the compressed data or the pre-compression data while specifying the physical address in the unrecorded area which is detected.

Inasmuch as the compressed data or the pre-compression data over two or more physical blocks is recorded in successive unrecorded areas, the compressed data or the pre-compression data over two or more physical blocks is prevented from being recorded in physically spaced positions in units of a physical block. Therefore, the seek time for reading data can effectively be shortened.

In the data recording method, furthermore, the allocation table may have a first registering area in which the reading logic addresses of the input data and the writing physical addresses of the compressed data or the pre-compression data corresponding to the reading logic addresses are registered, and a second registering area in which the physical addresses of the respective physical blocks, except for a starting physical address, are registered as respective link addresses if the compressed data or the pre-compression data extends over at least two physical blocks. The data recording method may further comprise the step of registering information indicative of no link address and decision data representing whether the data to be recorded on the recording medium is the compressed data or the pre-compression data, in an area corresponding to a final physical block in the second registering area.

In the data recording method, the compressed data and the pre-compression data are selectively recorded on the recording medium depending on the relationship between the actual compression ratio ε and the predicted compression ratio β in the data compression. The above process needs new information for distinguishing compressed data and pre-compression data from each other.

According to the present invention, however, decision data for distinguishing compressed data and uncompressed data from each other is stored together with information indicative of no link address in an area corresponding to the final physical block in the second registering area of the allocation table. Therefore, it is not necessary to keep a storage area for registering the decision data on the recording medium, with the result that the problem of a reduced data recording capacity is alleviated.

The data transmitting method and the data recording method according to the present invention are not limited to embodiments described below, but may be changed or modified without departing from the scope of the present invention.

BRIEF DESCRIPTION OF THE DRAWINGS

FIG. 22 is a diagram showing a byte arrangement of contents of a DDS sector of attribute data recorded in an attribute data recording area of the magnetooptical disk;

FIG. 23 is a diagram showing contents of a DDS sector, particularly contents of a file allocation table, of the attribute data recorded in the attribute data recording area of the magnetooptical disk;

FIG. 27 is a diagram illustrative of contents of a record status table generated by the record status table generating means;

BEST MODE FOR CARRYING OUT THE INVENTION

EMBODIMENTS

Embodiments of data transmitting apparatus according to the present invention will hereinafter be described with reference to FIGS. 1 through 42.

Figure 1:
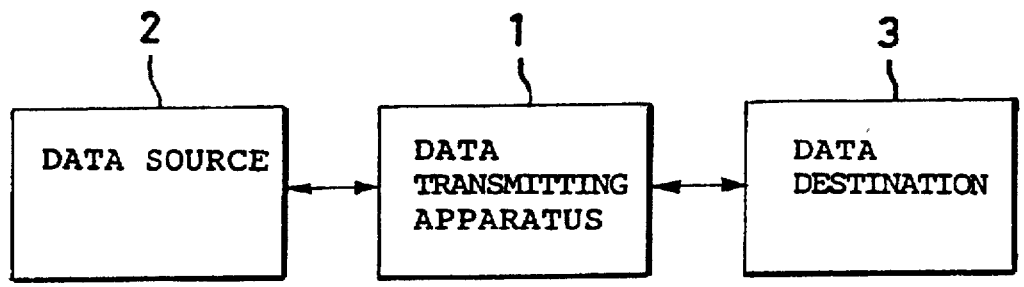
FIG. 1 is a block diagram of a general mode of use of a data transmitting apparatus according to the present invention.

As shown in FIG. 1, a data transmitting apparatus 1 according to an embodiment of the present invention is inserted and connected between a data source 2 and a data destination 3. Each of the data source 2 and the data destination 3 may comprise a data processing system for processing an inputted analog signal or digital data with an analog circuit system or a digital circuit, or a data processing system for processing data according to processing steps (program) predetermined by a computer (CPU) and supplying the processed data through an existing interface circuit to a transmission line (composed of a metal wire or optical fiber).

Each of the data source 2 and the data destination 3 may alternatively comprise a one-chip LSI mounted on a printed wiring board, or a communication device and an external memory device having an internal storage medium comprising a bulk-type memory such as a semiconductor memory or the like or a disk-shaped recording medium such as an optical disk or the like, or a host computer for centralized management of data to be processed.

[Modes of use of the data transmitting apparatus]

Specific examples of some modes of use of the data transmitting apparatus 1 will be described below with reference to FIGS. 2 through 7.

Figure 2:
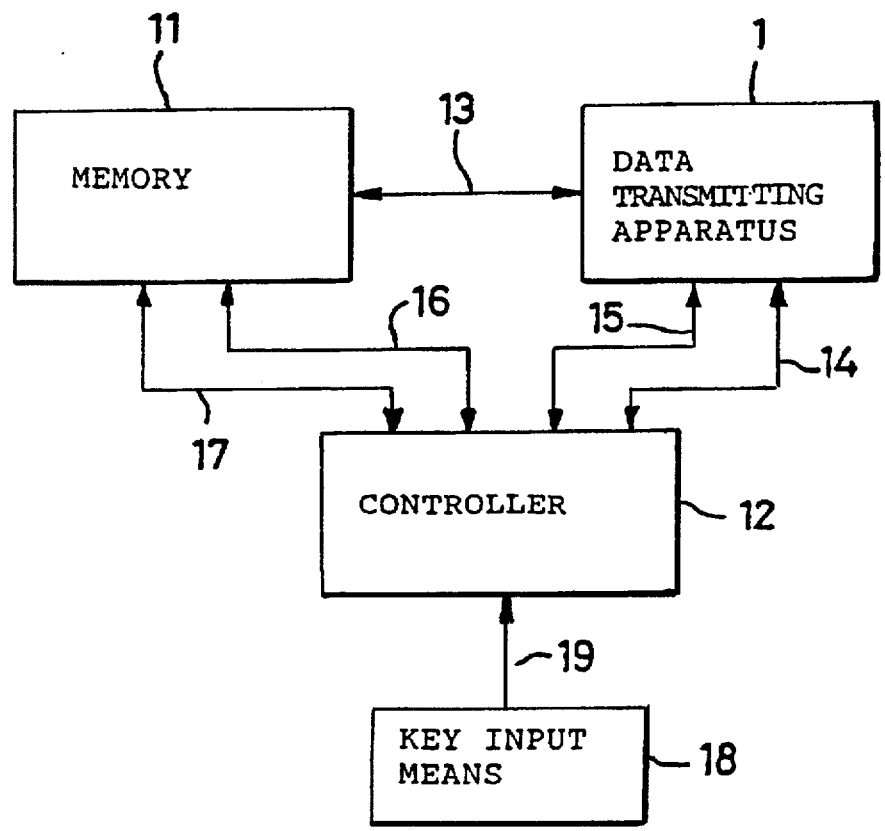
FIG. 2 is a block diagram of a first mode of use of the data transmitting apparatus according to the present invention.

In the example shown in FIG. 2, data is transmitted, i.e., data is read and written, between a number of files that are logically developed in one memory 11 through the data transmitting apparatus 1 under the control of a controller 12.

In th is mod e of use, specifically, the memory 11 and the data transmitting apparatus 1 are connected to each other through a data bus 13, the controller 12 and the data transmitting apparatus 1 are connected to each other through a control bus 14 and a data bus 15, the memory 11 and the controller 12 are connected to each other through a memory control bus 16 and an address bus 17, and the controller 12 and a key input means 18 such as a keyboard or the like are connected to each other through an interface bus 19.

When the key input means 18 is operated to enter a file name of the data source and a file name of the data destination, the controller 12 sends a data transfer request instruction to the data transmitting apparatus 1, and simultaneously outputs an address corresponding to the entered file name of the data source and a read enable signal to the memory 11.

The memory 11 sends data from a corresponding file in the data source through the data bus 13 to the data transmitting apparatus 1. As described in detail later on, the data transmitting apparatus 1 either compresses the transferred data or does not compress the transferred data, and retransmits the data to the memory 11. Prior to the retransmission of the data, the data transmitting apparatus 1 outputs a transfer request signal to the controller 12. In response to the transfer request signal from the data transmitting apparatus 1, the controller 12 outputs an address corresponding to the entered file name of the data destination and a write enable signal to the memory 11.

The compressed data or the data which is not compressed (hereinafter referred to as the "uncompressed data") which is outputted from the data transmitting apparatus 1 is supplied through the data bus 13 to the memory 11, where the data is written in a corresponding file in the data destination.

Figure 3:
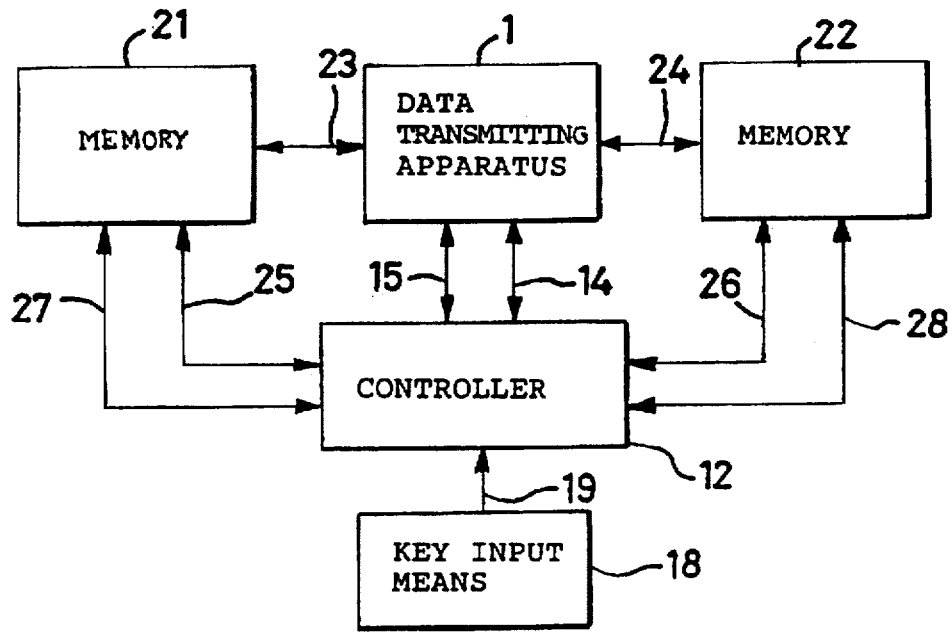
FIG. 3 is a block diagram of a second mode of use of the data transmitting apparatus according to the present invention.

In the example shown in FIG. 3, data is transmitted, i.e., data is read and written, between a number of files that are logically developed in one 21 of two memories 21, 22 and a number of files that are logically developed in the other 22 of the two memories 21, 22 through the data transmitting apparatus 1 under the control of a controller 12.

In this mode of use, specifically, the memories 21, 22 and the data transmitting apparatus 1 are connected to each other through data buses 23, 24, the controller 12 and the data transmitting apparatus 1 are connected to each other through a control bus 14 and a data bus 15, the memories 21, 22 and the controller 12 are connected to each other through memory control buses 25, 26 and address buses 27, 28, and the controller 12 and a key input means 18 are connected to each other through an interface bus 19.

When the key input means 18 is operated to enter the device number and a file name of the memory 21 which is the data source and the device number and a file name of the memory 22 which is the data destination, the controller 12 sends a data transfer request instruction to the data transmitting apparatus 1, and simultaneously outputs an address corresponding to the entered file name of the data source and a read enable signal to the memory 21 which corresponds to the entered device number of the data source, through the address bus 27 and the control bus 25, respectively.

The memory 21 sends data from a corresponding file in the data source through the data bus 23 to the data transmitting apparatus 1. The data transmitting apparatus 1 either compresses the transferred data or does not compress the transferred data, and transmits the data to the memory 22 which is the data destination. Prior to the transmission of the data to the memory 22, the data transmitting apparatus 1 outputs a transfer request signal to the controller 12. In response to the transfer request signal from the data transmitting apparatus 1, the controller 12 outputs an address corresponding to the entered file name of the data destination and a write enable signal to the memory 22 which corresponds to the entered device number of the data destination, through the address bus 28 and the control bus 26, respectively.

The compressed data or the uncompressed data which is outputted from the data transmitting apparatus 1 is supplied through the data bus 24 to the memory 22, where the data is written in a corresponding file in the data destination.

Figure 4:
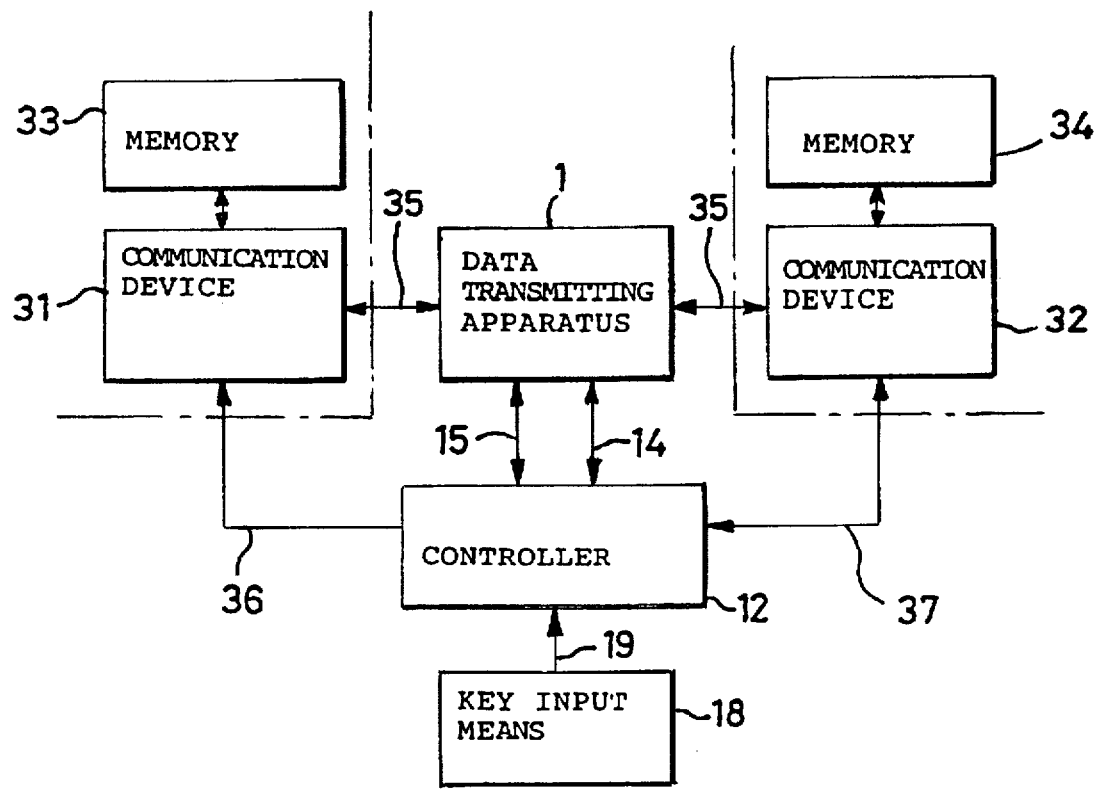
FIG. 4 is a block diagram of a third mode of use of the data transmitting apparatus according to the present invention.

In the example shown in FIG. 4, a data transmitting apparatus 1 is inserted and connected as a relay apparatus between two communication devices (including computer peripherals) 31, 32, and data is transmitted between the communication devices 31, 32 through the data transmitting apparatus 1 under the control of a controller 12. The communication devices 31, 32 are capable of storing communication data supplied to data input/output terminals thereof respectively into memories 33, 34.

In this mode of use, specifically, the communication devices 31, 32 and the data transmitting apparatus 1 are connected to each other through respective data communication paths (including a communication network) 35, the controller 12 and the data transmitting apparatus 1 are connected to each other through a control bus 14 and a data bus 15, the communication devices 31, 32 and the controller 12 are connected to each other through respective control cables 36, 37, and the controller 12 and a key input means 18 such as a keyboard or the like are connected to each other through an interface bus 19.

When the key input means 18 is operated to enter the device number of the communication device 31 as the data source and the device number of the communication device 32 as the data destination, the controller 12 sends a data transfer request instruction to the data transmitting apparatus 1, and simultaneously outputs a data output request signal to the communication device 31 corresponding to the entered device number of the data source through the control cable 36.

The memory 33 combined with the communication device 31 as the data source sends communication data through the data communication path 35 to the data transmitting apparatus 1. The data transmitting apparatus 1 either compresses the transferred data or does not compress the transferred data, and transmits the data to the communication device 32 as the data destination through the data communication path 35. Prior to the transmission of the data to the communication device 32, the data transmitting apparatus 1 outputs a transfer request signal to the controller 12. In response to the transfer request signal from the data transmitting apparatus 1, the controller 12 outputs a data storage request signal to the communication device 32 which corresponds to the entered device number of the data destination through the control cable 37.

The compressed data or the uncompressed data which is outputted from the data transmitting apparatus 1 is supplied through the data communication path 35 to the communication device 32 as the data destination, where the data is written in the memory 34 combined therewith.

Figure 5:
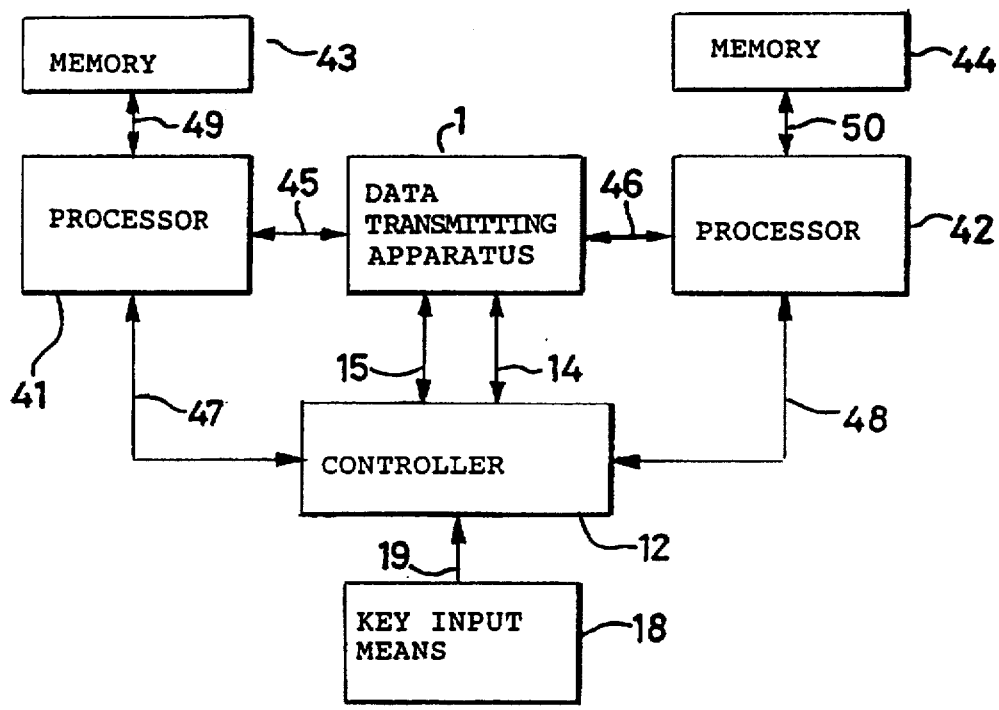
FIG. 5 is a block diagram of a fourth mode of use of the data transmitting apparatus according to the present invention.

In the example shown in FIG. 5, a data transmitting apparatus 1 is inserted and connected between two processors 41, 42 on one printed circuit board, and data is transmitted between the processors 41, 42 through the data transmitting apparatus 1 under the control of a controller 12. The processors 41, 42 are capable of storing processing data supplied to data input/output terminals thereof respectively into memories 43, 44.

In this mode of use, specifically, the processors 41, 42 and the data transmitting apparatus 1 are connected to each other through respective data buses 45, 46, the controller 12 and the data transmitting apparatus 1 are connected to each other through a control bus 14 and a data bus 15, the processors 41, 42 and the controller 12 are connected to each other through respective control buses 47, 48, and the controller 12 and a key input means 18 such as a keyboard or the like are connected to each other through an interface bus 19.

When the key input means 18 is operated to enter the device number of the processor 41 as the data source and the device number of the processor 42 as the data destination, the controller 12 sends a data transfer request instruction to the data transmitting apparatus 1, and simultaneously outputs a data output request signal to the processor 41 corresponding to the entered device number of the data source through the control bus 47.

The memory 43 connected to the processor 41 as the data source through a bus 49 sends data through the data bus 45 the data transmitting apparatus 1. The data transmitting apparatus 1 either compresses the transferred data or does not compress the transferred data, and transmits the data to the processor 42 as the data destination through the data bus 46. Prior to the transmission of the data to the processor 42, the data transmitting apparatus 1 outputs a transfer request signal to the controller 12. In response to the transfer request signal from the data transmitting apparatus 1, the controller 12 outputs a data storage request signal to the processor 42 which corresponds to the entered device number of the data destination through the control bus 48.

The compressed data or the uncompressed data which is outputted from the data transmitting apparatus 1 is supplied through the data bus 46 to the processor 42 as the data destination, where the data is written in the memory 44 connected to the processor 42 through a bus 50.

Figure 6:
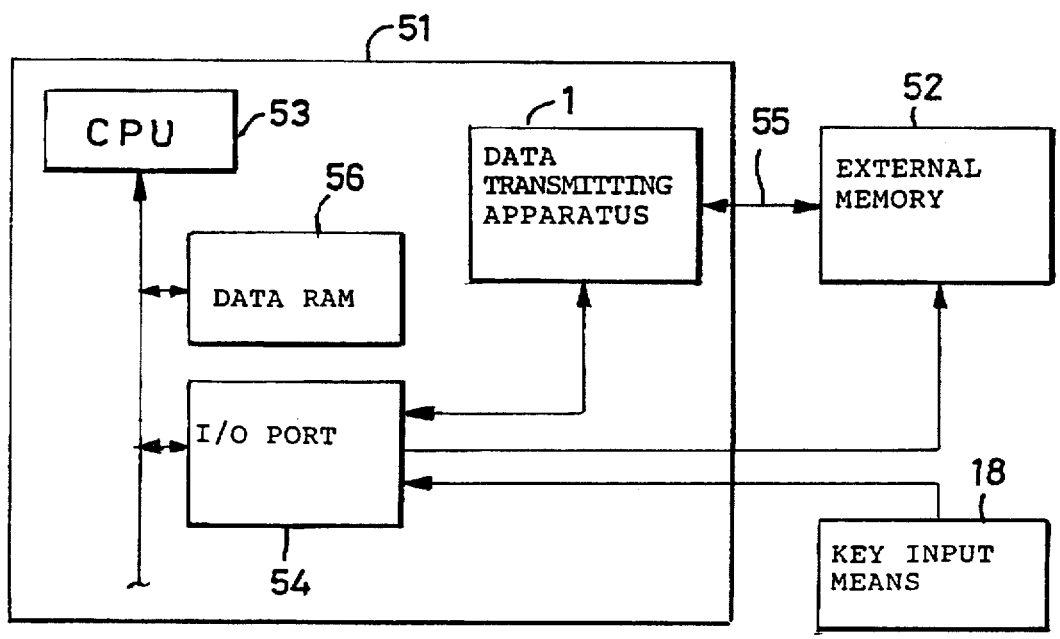
FIG. 6 is a block diagram of a fifth mode of use of the data transmitting apparatus according to the present invention.

In the example shown in FIG. 6, a data transmitting apparatus 1 is used to transmit data between a host computer 51 and an external memory device 52, for example. The data transmitting apparatus 1 is incorporated as a data processing apparatus in the host computer 51.

In this mode of use, specifically, a CPU 53 in the host computer 51 and the data transmitting apparatus 1 are connected to each other through a data bus, a control bus, and an input/output port 54, and the data transmitting apparatus 1 and the external memory device 52 are connected to each other through an interface bus 55.

When a key input means 18 connected to the host computer 51 is operated to enter the file name of a file (a text file, an execution file, or the like) developed in a data RAM 56 in the host computer 51 which serves as the data source, and also the device number of the external memory device 52 which serves as the data destination, the CPU 53 sends a data transfer request signal to the data transmitting apparatus 1, and simultaneously outputs an address corresponding to the entered file name and a read enable signal to the data RAM 56 through an address bus and the control bus, respectively.

The data RAM 56 sends data from the file therein to the data transmitting apparatus 1 through the data bus and the input/output port 54. The data transmitting apparatus 1 either compresses the transferred data or does not compress the transferred data, and transmits the data to the external memory device 52 corresponding to the entered device number of the data destination through the interface bus 55. Prior to the transmission of the data to the external memory device 52, the data transmitting apparatus 1 outputs a transfer request signal to the CPU 53 in the host computer 51. In response to the transfer request signal from the data transmitting apparatus 1, the host computer 51 outputs a data storage request signal to the external memory device 52 which corresponds to the entered device number of the data destination through the interface bus 55.

The compressed data or the uncompressed data which is outputted from the data transmitting apparatus 1 is supplied through the interface bus 55 to the external memory device 52 as the data destination, where the data is written in a storage medium, such as an optical disk, a magnetic disk, a semiconductor memory, or the like, incorporated in the external memory device 52.

Figure 7:
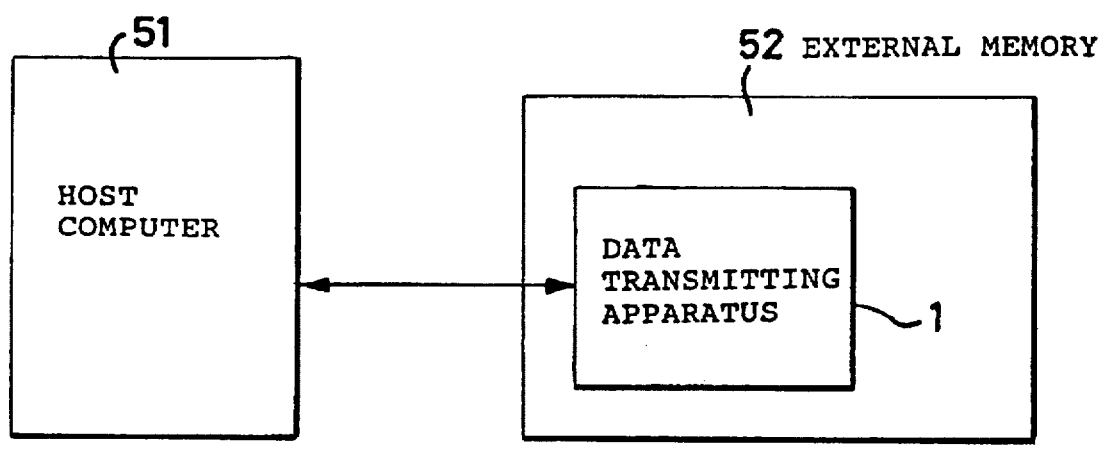
FIG. 7 is a block diagram of a sixth mode of use of the data transmitting apparatus according to the present invention.

In the example shown in FIG. 7, a data transmitting apparatus 1 is used to transmit data between a host computer 51 and an external memory device 52, for example. The data transmitting apparatus 1 is incorporated as a data processing apparatus in the external memory device 52. Specific structure and operation of this example will be described in detail later on.

Specific structure and processing operation of the data transmitting apparatus 1 incorporated in the examples shown in FIGS. 2 through 7 will be described below with reference to FIGS. 8 through 18. In FIGS. 8 through 18, the files in the memory 11 shown in FIG. 2, the memories 21, 22 shown in FIG. 3, the communication devices 31, 32 shown in FIG. 4, the processors 41, 42 shown in FIG. 5, and the host computer 51 and the external memory device 52 shown in FIG. 6 are referred to as the data source 2 and the data destination 3 as shown in FIG. 1.

Figure 8:
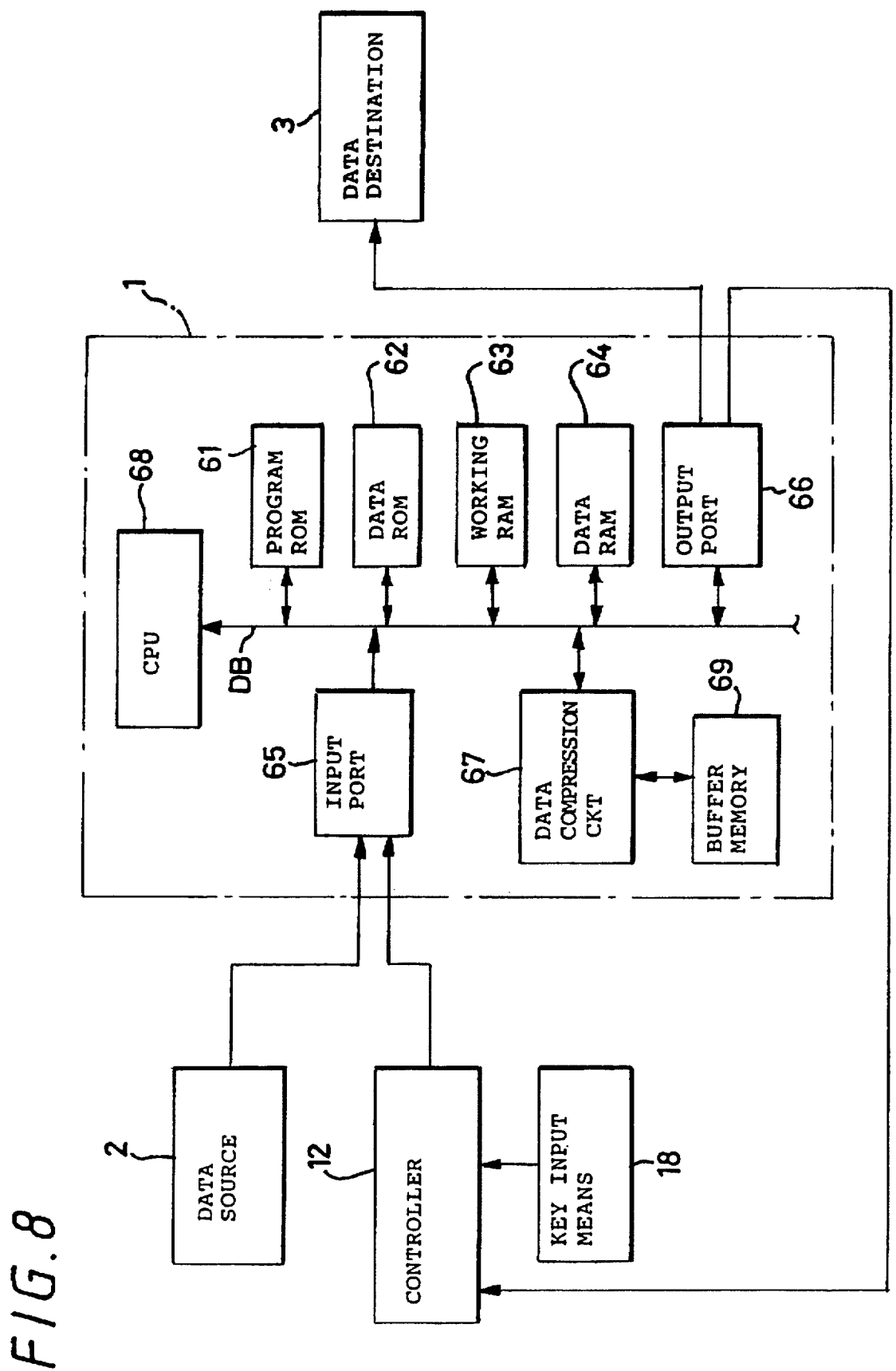
FIG. 8 is a block diagram of a hardware arrangement of the data transmitting apparatus according to the present invention.

As shown in FIG. 8, the data processing apparatus 1 comprises, as its hardware components, a program ROM 61 storing various programs, a data ROM 62 registering various fixed data, a working RAM 63 used to execute a program read from the program ROM 61, a data RAM 64 for storing data from the data source 2, control signals from the controller 12, key input data (data from the key input means 18), and data processed by various programs, an input port 65 and an output port 66 for inputting data from and outputting data to external circuits, such as the data source 2, the data destination 3, and the controller 12, a data compression circuit 67 for compressing data stored in the data RAM 64 and storing the compressed data in a given area in the data RAM 64, and a CPU (control and logic/arithmetic unit) 68 for controlling these circuits.

The data compression circuit 67 is a circuit for compressing supplied data in a loss-less manner, i.e., producing loss-less compressed data using a buffer memory 69, and may comprise a microcomputer or the like. While the loss-less data compression technique itself used by the data compression circuit 67 has no direct bearing on the present invention and hence will not be described in detail, it may be the LZW compressing technique. Briefly, the LZW compressing technique is a process which utilizes a conversion table for converting an entered string of characters (data), e.g., well known "RINTINTIN", into a code.

Specifically, an entered string of characters is read, and converted (encoded) into a code based on 26 alphabetical letters, for example, registered in a dictionary (hereinafter referred to as a "basic conversion table"), and a string of characters not registered in the basic conversion table is registered by generating a new dictionary (hereinafter referred to as a "generated conversion table"). While the generated conversion table is updated and used, an entered string of characters is compressed. For expanding a compressed string of characters, i.e., decoding a compressed string of characters, a generated conversion table is produced from the compressed string of characters and the compressed string of characters is expanded.

The various circuits transfer data through a data bus DB extending from the CPU 68, and are controlled by the CPU 68 through a control bus (not shown) extending from the CPU 68.

Key input data and control signals from the controller 12, and output data from the data source 2 are supplied through the input port 65 to the data bus DB.

Data (compressed data or uncompressed data) stored in the data RAM 64 and destined for the data destination 3 is supplied through the output port 66 to the data destination 3. Request signals or the like stored in the data RAM 64 and destined for the controller 12 are supplied through the output port 66 to the controller 12.

When data transferred from the data source 2 is compressed by the data compression circuit 67, the data transmitting apparatus 1 transfers the compressed data to the data destination 3 if the compression ratio or the difference between the data length of the data prior to being compressed (hereinafter referred to as "pre-compression data" which has the same meaning as the uncompressed data described above) and the data length of the data after being compressed (hereinafter referred to as "compressed data") is equal to or greater than a predetermined value, and transfers the pre-compression data to the data destination 3 if the compression ratio or the data length difference is smaller than the predetermined value.

For example, for storing data in an external memory device which effects random access to an optical disk, a magnetic disk, or the like that stores data in blocks each having a fixed length of 512 bytes, when 1 Kbytes of uncompressed data are supplied to the data transmitting apparatus 1, a space on the disk can be saved if the difference between the data length of the uncompressed data and the data length of the compressed data is 512 bytes or more.

In such a case, therefore, the difference between the data length of the uncompressed data and the data length of the compressed data is determined, and it is determined whether the difference (actual difference) is equal to or greater than a preset value, e.g., 512 bytes. If the actual difference is equal to or greater than 512 bytes, then the compressed data is outputted to the external memory device, and if the actual difference is smaller than 512 bytes, then the uncompressed data is outputted to the external memory device.

For shortening the time required for data transfer between the host computer 51 and the external memory device 52, for example, the ratio (actual compression ratio) of the data length of the uncompressed data to the data length of the compressed data is determined. That is, since the time required for data compression/expansion is not constant, but varies depending on the size of the data, the actual difference between the uncompressed data and the compressed data is not used, but the actual compression ratio is used to determine whether the compressed data or the uncompressed data is to be outputted for shortening the time required for data transfer.

It is determined whether the determined actual compression ratio is at least a theoretically or experimentally determined compression ratio (preset compression ratio) or not. If the actual compression ratio is equal to or greater than the preset compression ratio, then the compressed data is outputted to the external memory device 52, and if the actual compression ratio is smaller than the preset compression ratio, then the uncompressed data is outputted to the external memory device 52.

Specific values of the preset difference and the preset compression ratio used to determine which of the uncompressed data and the compressed data is to be processed, i.e., to be outputted to the external memory device in the above example, differ depending on a system using such data compression. Since the time required for data compression/expansion differs depending on the hardware or the software, specific values of the preset difference and the preset compression ratio also differ depending on the hardware or the software.

In the data transmitting apparatus 1, specific values of the preset difference and the preset compression ratio are predetermined according to its specifications. If the specific values of the preset difference and the preset compression ratio are to be changed subsequently, then the operator (user) can change the values using the key input means 18 connected to the controller 12.

Two examples of processing operation of the data transmitting apparatus 1 will be described below with reference to function block diagrams and flowcharts shown in FIGS. 9 through 18.

[Description of a data transmitting apparatus according to a first embodiment]

First, a data transmitting apparatus for carrying out an example of processing operation (hereinafter referred to as a data transmitting apparatus according to a first embodiment) will be described below with reference to FIGS. 9 through 11.

Figure 10:
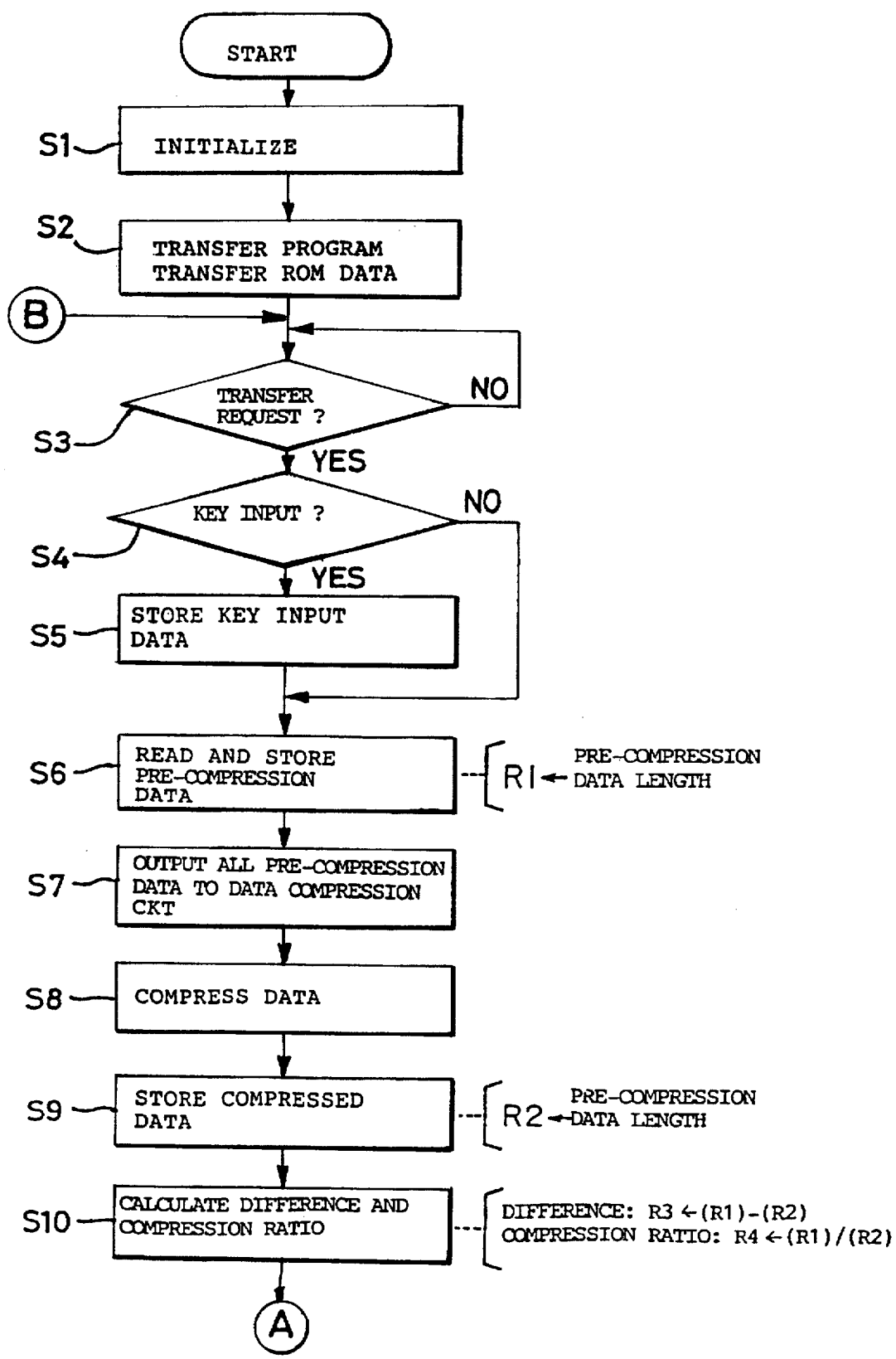
FIG. 10 is a flowchart (1) of a processing operation of the data processing means in the data transmitting apparatus according to the first embodiment.

As shown in FIG. 10, at the same time that the power supply is switched on, the data transmitting apparatus 1 according to the first embodiment is initialized, e.g., its system check, memory check, and set-up process are carried out in a step S1.

Then, in a step S2, a data processing means 71 (data processing program: a means, see FIG. 9, for outputting data, either compressed or uncompressed, from the data source 2 to the data destination 3) is read from the program ROM 61 and written into the working RAM 63. At the same time, a working area for temporarily storing data generated during the execution of the program 71 and for transferring parameters between routines is allotted to the working RAM 63.

To the data RAM 64, there are allotted a pre-compression data storage area for storing pre-compression data from the data source 2, a compressed data storage area for storing compressed data from the data compression circuit 67, and a fixed data storage area for storing various fixed data from the data ROM 62.

The fixed data storage area has a difference storage area for storing the difference (preset difference α) preset according to the specifications and a compression ratio storage area for storing the compression ratio (preset compression ratio β) preset according to the specifications. Values of the preset difference α and the preset compression ratio β which are predetermined according to the specifications may be 512 bytes and 4/3, respectively, for example.

In the step S2, the program is transferred as described above, and also various fixed data are read from the data ROM 62 and stored in the fixed data storage area. At this time, the preset difference a and the preset compression ratio β which are registered in the data ROM 62 are stored respectively into the difference storage area and the compression ratio storage area. Since the preset difference α is of a value (natural number) represented by bytes, it is stored as fixed-point data. Since the preset compression ratio β is of a real number value, it is stored as floating-point data, for example.

Figure 9:
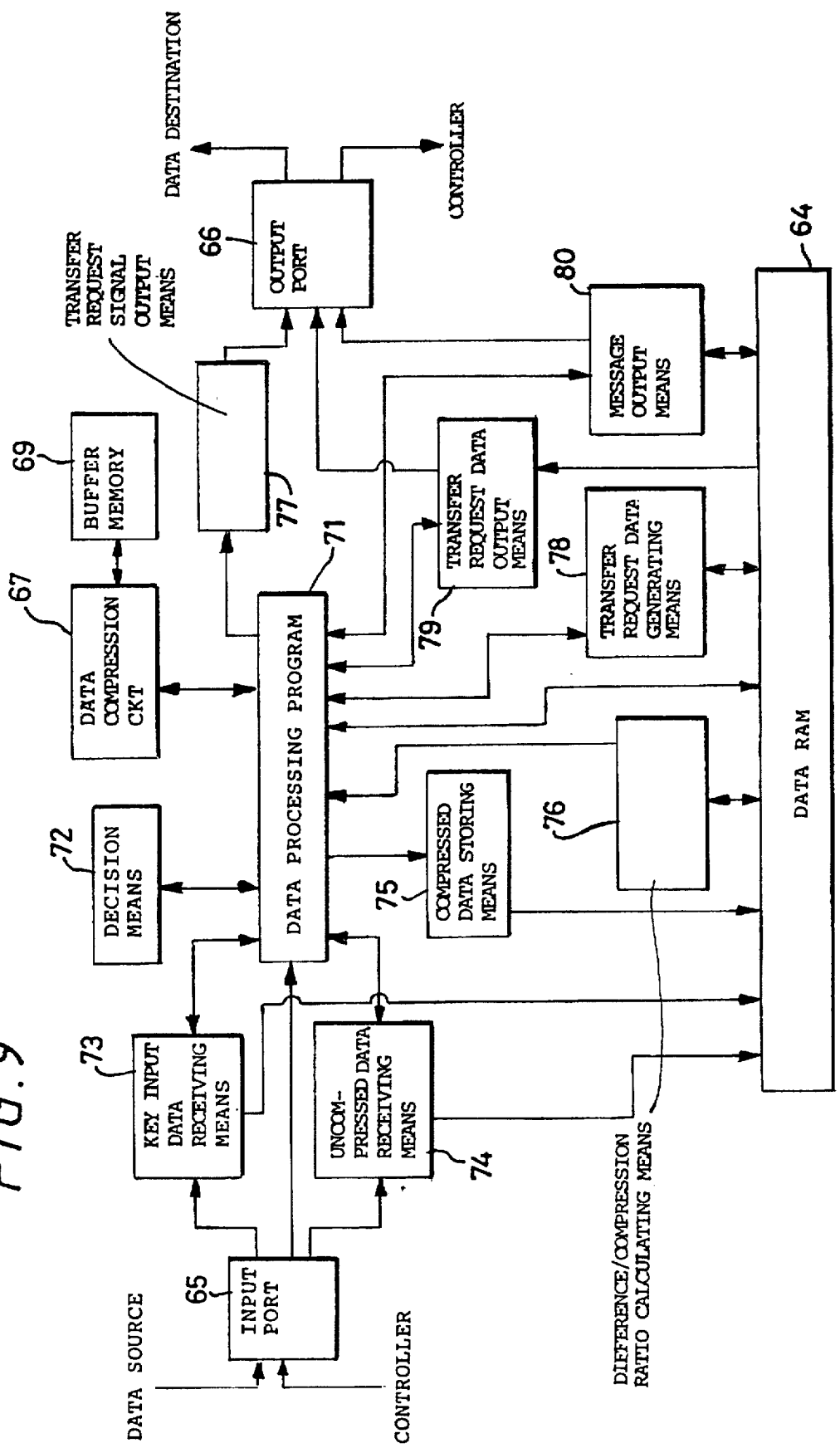
FIG. 9 is a functional block diagram showing a processing operation of a data processing means in a data transmitting apparatus according to an embodiment of the present invention which carries out a first processing operation (hereinafter simply referred to as a "data transmitting apparatus according to a first embodiment")

As shown in FIG. 9, the data processing program 71 that is read into the working RAM 63 comprises a decision means 72 for making various decisions, a key input data receiving means 73 for receiving key input data supplied from the controller 12 through the input port 65 and storing the key input data into a given storage area of the data RAM 64, a pre-compression data receiving means 74 for receiving pre-compression data supplied from the data source 2 through the input port 65 and storing the pre-compression data into a pre-compression data storage area of the data RAM 64, a compressed data storing means 75 for receiving compressed data supplied from the data compression circuit 67 and storing the compressed data into a compressed data storage area of the data RAM 64, a difference/compression ratio calculating means 76 for calculating an actual difference and an actual compression ratio based on the data length of the pre-compression data and the data length of the compressed data, a transfer request signal output means 77 for outputting a transfer request signal to the controller 12 through the output port 66, a transfer request data generating means 78 for generating transfer request data to transfer the pre-compression data or the compressed data to the data destination 3, a transfer request data output means 79 for outputting the generated transfer request data to the data destination 3 through the output port 66, and a message output means 80 for outputting an information code relative to a message to the controller 12.

According to the data processing program 71, the decision means 72 determines whether there is a transfer request from the controller 12 or not in a step S3 shown in FIG. 10, based on whether there is an interrupt input based on a transfer request instruction from the controller 12. The step S3 is repeated until a transfer request instruction from the controller 12 is inputted, and hence waits for a transfer request.

If there is a transfer request, control proceeds to a step S4 in which the decision means 72 determines whether there is a key input or not based on whether there is an information signal indicative of a key interrupt input from the controller 12.

The information signal is outputted from the controller 12 based on a key interrupt input which is produced when the operator operates the key input means 18 such as a keyboard or the like. Specifically, the operator operates the key input means 18 to enter a fine name, a device number, and values of the difference and the compression ratio while viewing a non-illustrated display monitor such as a CRT, a liquid display, or the like which is connected to the controller 12, whereupon the information signal is outputted from the controller 12.

If there is a key input, control goes to a next step S5 in which the key input data receiving means 73 receives key input data sent from the controller 12 through the input port 65, and stores the received key input data into the fixed data storage area of the data RAM 64. Specifically, since the key input data is relative to a difference or a compression ratio entered through the key input means 18 by the operator, if the key input data is relative to a difference, then the key input data is stored in the difference storage area of the fixed data storage area, and if the key input data is relative to a compression ratio, then the key input data is stored in the compression ratio storage area of the fixed data storage area.

Therefore, the preset difference a and the preset compression ratio β which have been read from the data ROM 62 in the step S2 are replaced with the preset difference α and the preset compression ratio β which are entered through the key input means 18.

In a next step S6, the pre-compression data receiving means 74 receives the pre-compression data from the data source 2 through the input port 65, and stores the received pre-compression data into the pre-compression data storage area of the data RAM 64. For transmitting data, it is customary to add a header containing information which represents the type of the data, the data length, etc. to the beginning of the data. In the step S6, the pre-compression data receiving means 74 stores the pre-compression data, and also stores data relative to the data length of the pre-compression data contained in the header into a first register R1, which is a register declared a first working register R1 among various registers used in the data processing program 71.

In a next step S7, the pre-compression data stored in the pre-compression data storage area of the data RAM 64 is outputted to the data compression circuit 67. The data compression circuit 67 effects a loss-less data compression process on the supplied pre-compression data using the buffer memory 69 in a step S8.

In a next step S9, the compressed data storing means 75 reads the compressed data outputted from the data compression circuit 67, and stores the compressed data in the compressed data storage area of the data RAM 64. At this time, the number of bytes, for example, from the start of the compressed data to the end of the compressed data is counted, and the counted number is stored as the data length of the compressed data in a second register R2, which is a register declared a second working register R2 among various registers used in the data processing program 71.

In a next step S10, the difference/compression ratio calculating means 76 calculates an actual difference and an actual compression ratio based on the data length of the pre-compression data and the data length of the compressed data. Specifically, the actual difference is calculated by subtracting the data length of the compressed data stored in the second register R2 from the data length of the pre-compression data stored in the first register R1. The produced difference is stored as the actual difference in a third register R3, which is a register declared a third working register R3 among various registers used in the data processing program 71. The actual compression ratio is calculated by dividing the data length of the compressed data stored in the second register R2 by the data length of the pre-compression data stored in the first register R1. The quotient, e.g., floating-point data, is stored as the actual difference in a fourth register R4, which is a register declared a fourth working register R4 among various registers used in the data processing program 71.

Figure 11:
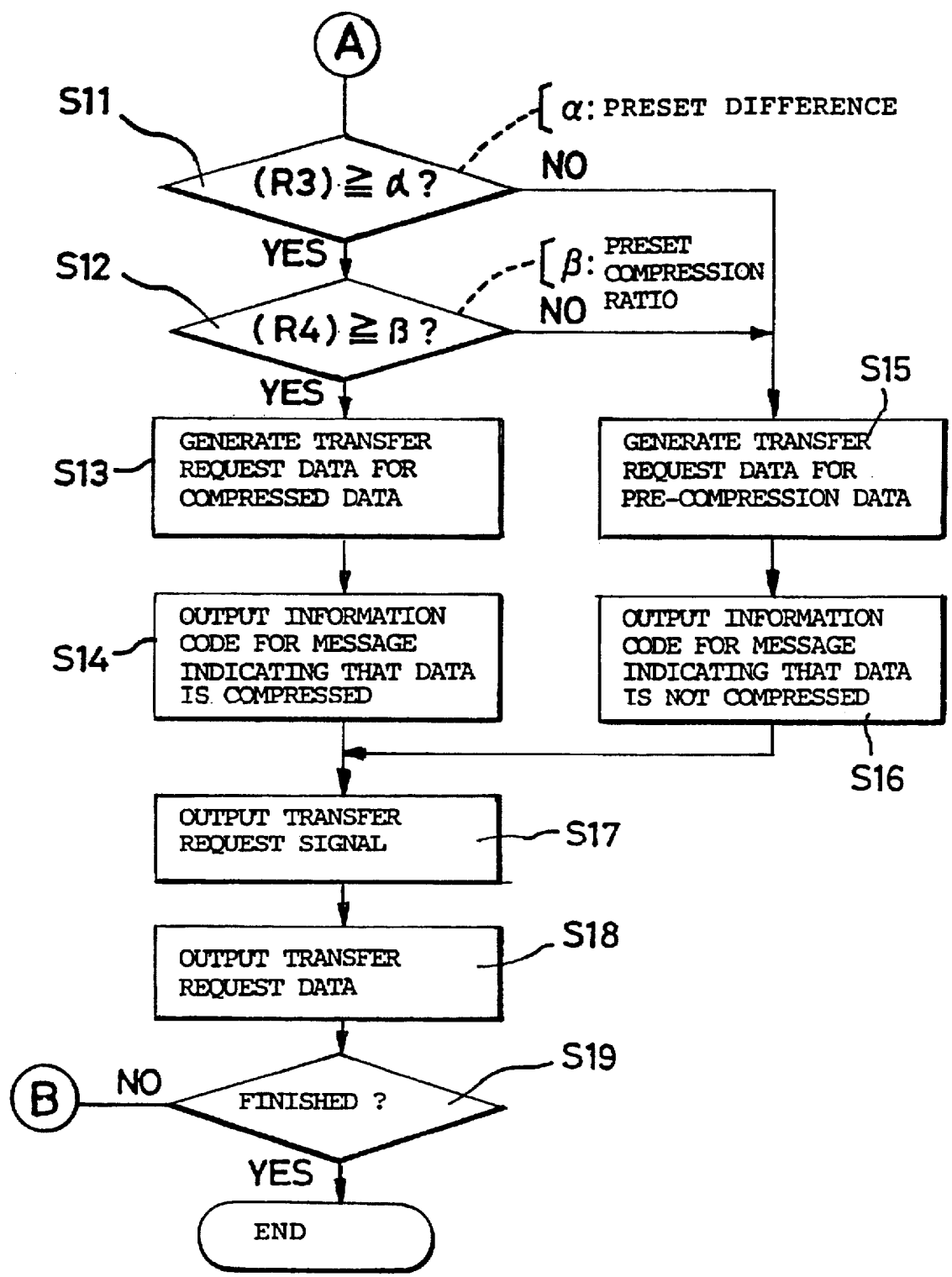
FIG. 11 is a flowchart (2) of the processing operation of the data processing means in the data transmitting apparatus according to the first embodiment.

Then, in a step S11 shown in FIG. 11, the decision means 72 determines whether the actual difference is at least the preset difference $\alpha$ based on the actual difference stored in the third register R3 and the preset difference $\alpha$ stored in the difference storage area.

If the actual difference is at least the preset difference $\alpha$, i.e., is equal to or greater than the preset difference $\alpha$, then control proceeds to a step S12 in which the decision means 72 determines whether the actual compression ratio is at least the preset compression ratio $\beta$ based on the actual compression ratio stored in the fourth register R4 and the preset compression ratio $\beta$ stored in the compression ratio storage area.

If the actual compression ratio is at least the preset compression ratio $\beta$, i.e., is equal to or greater than the preset compression ratio $\beta$, then control goes to a step S13 in which the transfer request data generating means 78 generates transfer request data for the compressed data. Specifically, the transfer request data is generated in a given array variable area (transfer request data area) in a program working area allotted to the data RAM 64, and is composed of a header section and a data section. The transfer request data generating means 78 generates transfer request data for the compressed data by registering an identification code indicative of the compressed data and the data length of the compressed data stored in the second register R2 in the header section, and adding the compressed data as the data section.

Thereafter, the message output means 80 outputs an information code indicating that the data has been compressed, which may be the identification code indicative of the compressed data, through the output port 66 to the controller 12 in a step S14. In response to the information code supplied from the data transmitting apparatus 1, the controller 12 outputs message data indicating that the data has been compressed to the display monitor. The display monitor now displays a message "DATA HAS BEEN COMPRESSED", for example, on its screen.

If the actual difference is smaller than the preset difference $\alpha$ in the step S11 or if the actual compression ratio is smaller than the preset compression ratio $\beta$ in the step S12, then control goes to a step S15 in which the transfer request data generating means 78 generates transfer request data for the pre-compression data. Specifically, the transfer request data is generated in the transfer request data area allotted to the data RAM 64. The transfer request data generating means 78 generates transfer request data for the pre-compression data by registering an identification code indicative of the pre-compression data and the data length of the pre-compression data stored in the first register R1 in the header section, and adding the pre-compression data as the data section.

Thereafter, the message output means 80 outputs an information code indicating that the data has not been compressed, which may be the identification code indicative of the pre-compression data, through the output port 66 to the controller 12 in a step S16. In response to the information code supplied from the data transmitting apparatus 1, the controller 12 outputs message data indicating that the data has not been compressed to the display monitor. The display monitor now displays a message "DATA HAS NOT BEEN COMPRESSED", for example, on its screen.

After the step S14 or S16, control goes to a step S17 in which the transfer request signal output means 77 outputs a transfer request signal through the output port 66 to the controller 12. The controller 12 outputs a control signal such as a write enable signal, a data storage request signal, or the like for receiving data transferred from the data transmitting apparatus 1, to the data destination 3. The data destination 3 is now brought into a mode for waiting for data from the data transmitting apparatus 1.

In a next step S17, the transfer request data output means 79 outputs the transfer request data for the compressed data or the pre-compression data stored in the transfer request data area of the data RAM 64, through the output port 66 to the data destination 3.

If the data is outputted to the data destination 3 through a transmission path such as a data communication path which tends to suffer a transmission error, then the transfer request data output means 79 adds an error-correcting code to the transfer request data, and outputs the transfer request data with the added error-correcting code.

In a next step S19, the decision means 72 determines whether there is a program finishing request or not based on whether there is a finishing request interrupt input such as a power supply turn-off input.

If there is no program finishing request in the step S19, then control returns to the step S3 to wait for a next transfer request from the data source 2. If there is a program finishing request in the step S19, then the data processing program 71 comes to an end.

In the data transmitting apparatus 1 according to the first embodiment, it is determined whether the compressed data or the pre-compression data is to be transferred to the data destination 3 based on the comparison between the actual difference and the preset difference $\alpha$ and the comparison between the actual compression ratio and the preset compression ratio $\beta$. Based on the decision, the compressed data or the pre-compression data is transferred to the data destination 3. Therefore, it is possible to prevent a phenomenon in which the size of compressed data which occupies a storage area in the data destination 3 is substantially the same as the size of uncompressed data which occupies the storage area, and also to avoid wasteful data expansion in the data destination 3.

Since the preset difference $\alpha$ and the preset compression ratio $\beta$ can freely be changed by a key input, it is possible to change the preset difference $\alpha$ and the preset compression ratio $\beta$ which have been set for shipment into a preset difference $\alpha$ and a preset compression ratio $\beta$ that have been logically or experimentally established on a system (hardware and software) created by the operator (user). As a consequence, data can be compressed under data compressing conditions optimum for the system created by the operator (user), making it possible to improve the quality of file management. This leads to an increase in the overall system performance.

Inasmuch as a message indicative of whether the data has been compressed or not is displayed on the display monitor screen in the step S14 or S16, the user can confirm, at a glance, whether the requested data (file) has actually been compressed or not, resulting in improved system usability.

The decision routine by way of ANDing is employed in the steps S11, S12 which allow compressed data to be transmitted only when the actual difference is at least the preset difference α and the actual compression ratio is at least the preset compression ratio β. This decision routine offers advantages over the following practice:

It is assumed that a routine is employed to transfer compressed data to the data destination 3 when the actual difference is at least the preset difference β. With the preset difference α being 512 bytes, for example, if the pre-compression data supplied from the data source 2 has a data length of 2 Kbytes, then compressed data is transferred to the data destination 3 when the data length of the compressed data is 1.5 Kbytes or shorter.

Similarly, if the pre-compression data supplied from the data source 2 has a data length of 1 Mbytes (1000 Kbytes), then compressed data is transferred to the data destination 3 when the data length of the compressed data is 999.5 Kbytes or shorter.

The ratio (actual compression ratio) of the pre-compression data (data length=1000 Kbytes) to the compressed data (data length=999.5 Kbytes) is about 1.0005, and the percentage of the data length (corresponding to the data length difference) removed by the data compression with respect to the data length of the pre-compression data is only 0.05%. With this compression ratio, the data length of the compressed data remains substantially the same as the data length of the pre-compression data.

Consequently, when it is determined whether the compressed data or the pre-compression data is to be transferred to the data destination 3 based on only the comparison between the actual difference and the preset difference α, if the actual difference is equal to or greater than the preset difference α, then the compressed data is transferred to the data destination 3 even though the percentage of the data length (corresponding to the data length difference) removed by the data compression with respect to the data length of the pre-compression data is only 0.05%, for example, and the data length of the compressed data remains substantially the same as the data length of the pre-compression data. As a consequence, the compressed data needs to be expanded in the data destination 3 over a period of time which is not short, resulting in a wasteful expenditure of time in the data destination 3.

In the data transmitting apparatus 1 according to the first embodiment, compressed data is transferred to the data destination 3 only when the actual difference is at least the preset difference α and the actual compression ratio is at least the preset compression ratio β, as described above. Thus, even when the actual difference is at least the preset difference α, no compressed data is transferred, but the pre-compression data is transferred, if the actual compression ratio is smaller than the preset compression ratio β. In this case, no time-consuming data expansion process is carried out in the data destination 3, so that any wasteful expenditure of time occurs in the data destination 3. In this manner, the overall system performance is improved.

[Description of a data transmitting apparatus according to a second embodiment]

First, a data transmitting apparatus for carrying out another example of processing operation (hereinafter referred to as a data transmitting apparatus according to a second embodiment) will be described below with reference to FIGS. 12 through 18.

Figure 13:
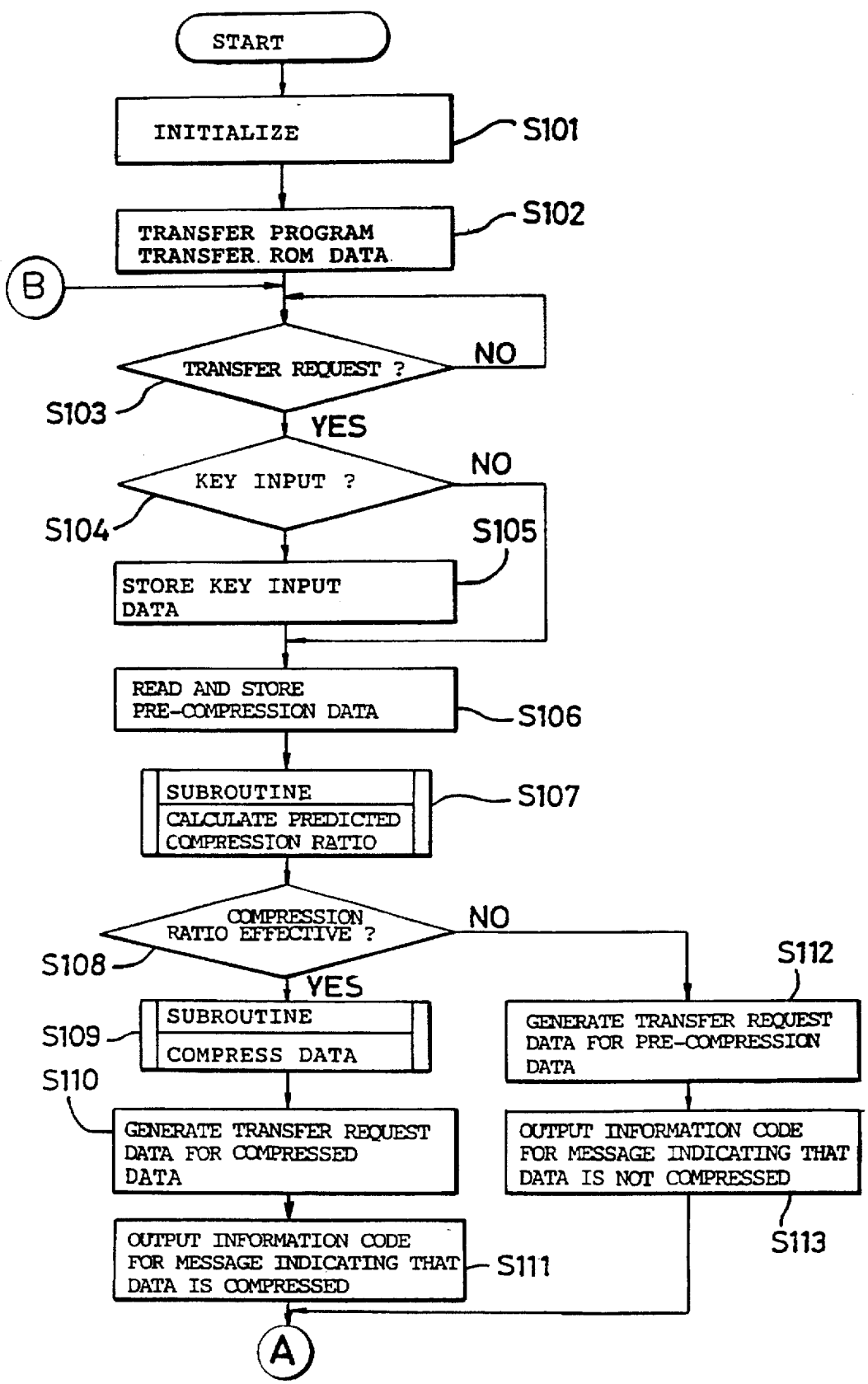
FIG. 13 is a flowchart (1) of a processing operation of the data processing means in the data transmitting apparatus according to the second embodiment.

As shown in FIG. 13, at the same time that the power supply is switched on, the data transmitting apparatus 1 according to the second embodiment is initialized, e.g., its system check, memory check, and set-up process are carried out in a step S101.

Then, in a step S102, a data processing means 91 (data processing program: a means, see FIG. 12, for outputting data, either compressed or uncompressed, from the data source 2 to the data destination 3) is read from the program ROM 61 and written into the working RAM 63. At the same time, a working area for temporarily storing data generated during the execution of the program 91 and for transferring parameters between routines is allotted to the working RAM 63.

To the data RAM 64, there are allotted a pre-compression data storage area for storing pre-compression data from the data source 2, a compressed data storage area for storing compressed data from the data compression circuit 67, and a fixed data storage area for storing various fixed data from the data ROM 62.

The fixed data storage area has a compression ratio storage area for storing the compression ratio (preset compression ratio β) preset according to the specifications, a pre-compression data readout size storage area for storing the data length (a pre-compression data readout size A) of pre-compression data to be compressed in one cycle, and a prescribed loop number storage area for storing the number B of processing loops (hereinafter referred to as "prescribed loop number B") necessary to determine a predicted compression ratio.

The pre-compression data readout size A is predetermined according to specifications, and is allotted, for example, a unit length (2 Kbytes in this example) of write-protect data for the data RAM 64. The write-protect data for the data RAM 64 is set to units of 2 Kbytes, for example, by a data management program of the operating system (OS) at the time data which is inhibited from being over-written, corresponding to pre-compression data in this example, is stored in a certain storage area of the data RAM 64. Any data is inhibited from being written in the storage area in which the write-protect data has been stored.

In response to a data deletion request from the data processing program 91 to the OS, the write-protect data is deleted in units of 2 Kbytes from the storage area, allowing data to be written in the storage area. Therefore, another program or the like may utilize the storage area from which the write-protect data has been deleted as a working area or a data storage area.

In the data transmitting apparatus 1 according to the second embodiment, before all pre-compression data is compressed, 10 Kbytes of pre-compression data, for example, are compressed, and an actual compression ratio (hereinafter referred to as a "predicted compression ratio") obtained by the compression of the 10 Kbytes of pre-compression data is regarded as an actual compression ratio for all pre-compression data. Then, it is determined whether compressed data or pre-compression data is to be transferred or not based on the predicted compression ratio.

Referring back to the main routine shown in FIG. 13, various fixed data are read from the data ROM 62 and stored in the fixed data storage area. At this time, the preset compression ratio β which is registered in the data ROM 62 is stored into the compression ratio storage area. Since the preset compression ratio β is of a real number value, it is stored as floating-point data, for example.

The pre-compression data readout size A and the prescribed loop number B registered in the data ROM 62 are stored respectively into the pre-compression data readout size storage area and the prescribed loop number storage area.

Figure 12:
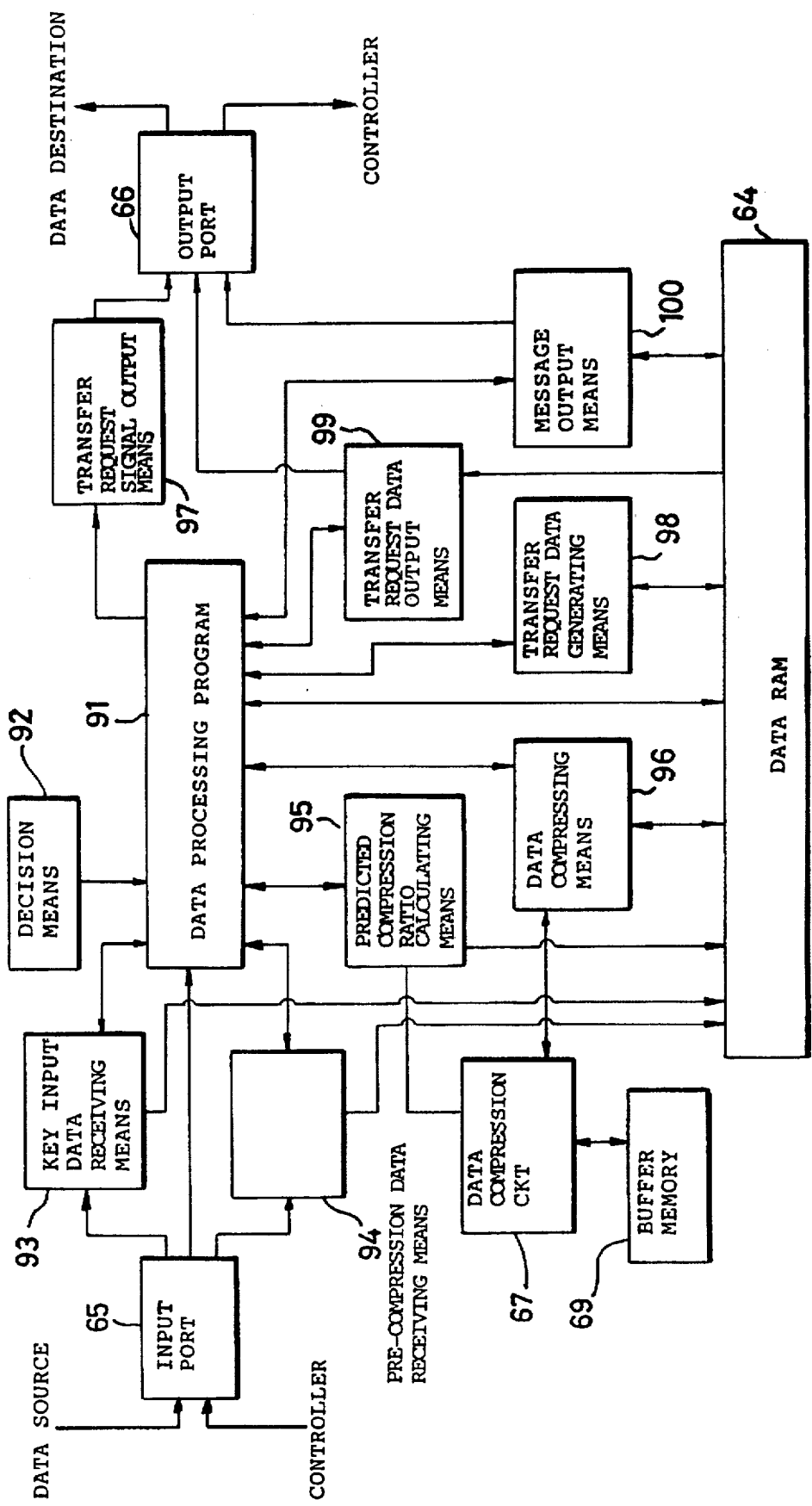
FIG. 12 is a functional block diagram showing a processing operation of a data processing means in a data transmitting apparatus according to an embodiment of the present invention which carries out a second processing operation (hereinafter simply referred to as a "data transmitting apparatus according to a second embodiment")

As shown in FIG. 12, the data processing program 91 that is read into the working RAM 63 comprises a decision means 92 for making various decisions, a key input data receiving means 93 for reading key input data supplied from the controller 12 through the input port 65 and storing the key input data into a given storage area of the data RAM 64, a pre-compression data receiving means 94 for receiving pre-compression data supplied from the data source 2 through the input port 65 and storing the pre-compression data into a pre-compression data storage area of the data RAM 64, a predicted compression ratio calculating means 95 for compressing a portion of the pre-compression data, e.g., 10 Kbytes of the pre-compression data, to determine a predicted compression ratio, data compressing means 96 for compressing all the pre-compression data if the predicted compression ratio satisfies a given condition, and deleting the pre-compression data, a transfer request signal output means 97 for outputting a transfer request signal to the controller 12 through the output port 66, a transfer request data generating means 98 for generating transfer request data to controller 12, whereupon the information signal is outputted from the controller 12.

If there is a key input, control goes to a next step S105 in which the key input data receiving means 93 reads key input data sent from the controller 12 through the input port 65, and stores the received key input data into the fixed data storage area of the data RAM 64. Specifically, since the key input data is relative to a compression ratio entered through the key input means 18 by the operator, the key input data is stored into the compression ratio storage area of the fixed data storage area.

Therefore, the preset compression ratio β which has been read from the data ROM 62 in the step S102 is replaced with the preset compression ratio β which is entered through the key input means 18.

In a next step S106, the pre-compression data receiving means 94 reads the pre-compression data from the data source 2 through the input port 65, and stores the received pre-compression data into the pre-compression data storage area of the data RAM 64. For transmitting data, it is customary to add a header containing information which represents the type of the data, the data length, etc. to the beginning of the data. In the step S106, the pre-compression data receiving means 94 stores the pre-compression data, and also stores data relative to the data length of the pre-compression data contained in the header into a first register R1. Inasmuch as the read pre-transfer the pre-compression data or the compressed data to the data destination 3, a transfer request data output means 99 for outputting the generated transfer request data to the data destination 3 through the output port 66, and a message output means 100 for outputting an information code relative to a message to the controller 12.

According to the data processing program 91, the decision means 92 determines whether there is a transfer request from the controller 12 or not in a step S103 shown in FIG. 13, based on whether there is an interrupt input based on a transfer request instruction from the controller 12. The step S103 is repeated until a transfer request instruction from the controller 12 is inputted, and hence waits for a transfer request.

If there is a transfer request, control proceeds to a step S104 in which the decision means 92 determines whether there is a key input or not based on whether there is an information signal indicative of a key interrupt input from the controller 12.

The information signal is outputted from the controller 12 based on a key interrupt input which is produced when the operator operates the key input means 18 such as a keyboard or the like. Specifically, the operator operates the key input means 18 to enter a fine name, a device number, and values of the difference and the compression ratio while viewing a non-illustrated display monitor such as a CRT, a liquid display, or the like which is connected to the compression data is data inhibited from being overwritten, the data management program of the OS sets write-protect data in the pre-compression data storage area for inhibiting data from being written in the pre-compression data storage area.

In a next step S107, the predicted compression ratio calculating means 95 operates to calculate a predicted compression ratio, i.e., a subroutine for calculating a predicted compression ratio is initiated.

Figure 15:
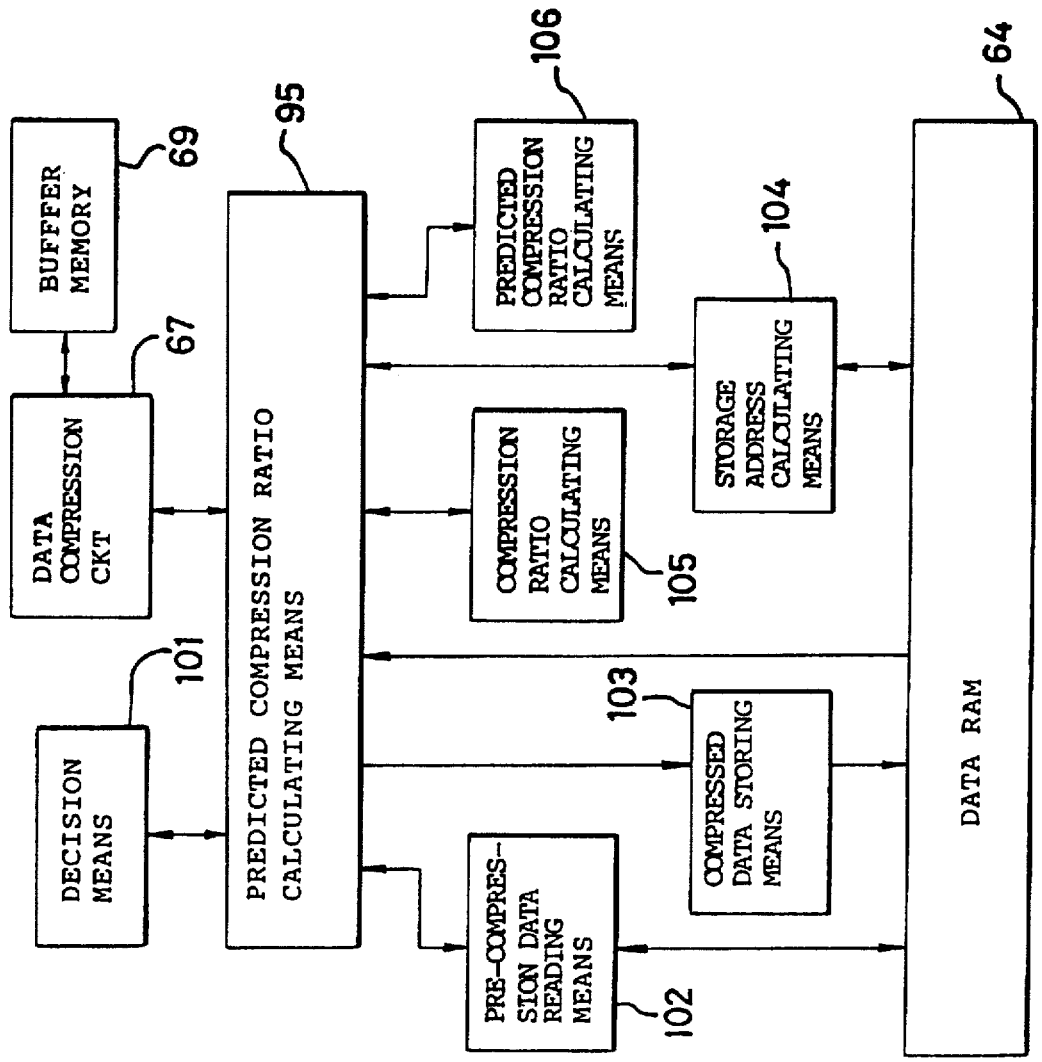
FIG. 15 is a functional block diagram showing a processing operation of an expected compression ratio calculating means of the data processing means in the data transmitting apparatus according to the second embodiment.

As shown in FIG. 15, the predicted compression ratio calculating means 95 comprises a decision means 101 for determining the number of processing routines, a pre-compression data reading means 102 for reading the pre-compression data from the pre-compression data storage area by a data length indicated by the pre-compression data readout size A, a compressed data storing means 103 for reading compressed data outputted from the data compression circuit 67 and storing the compressed data into the compressed data storage area of the data RAM 64, a storage address calculating means 104 for calculating a storage address at which to store the compressed data in the compressed data storage area, a compression ratio calculating means 105 for calculating an actual compression ratio with respect to pre-compression data having a data length (hereinafter referred to as "A bytes") indicated by the pre-compression data readout size A, and a predicted compression ratio calculating means 106 for calculating a predicted compression ratio with respect to all the pre-compression data based on the actual compression ratio calculated by the compression ratio calculating means 105.

Figure 16:
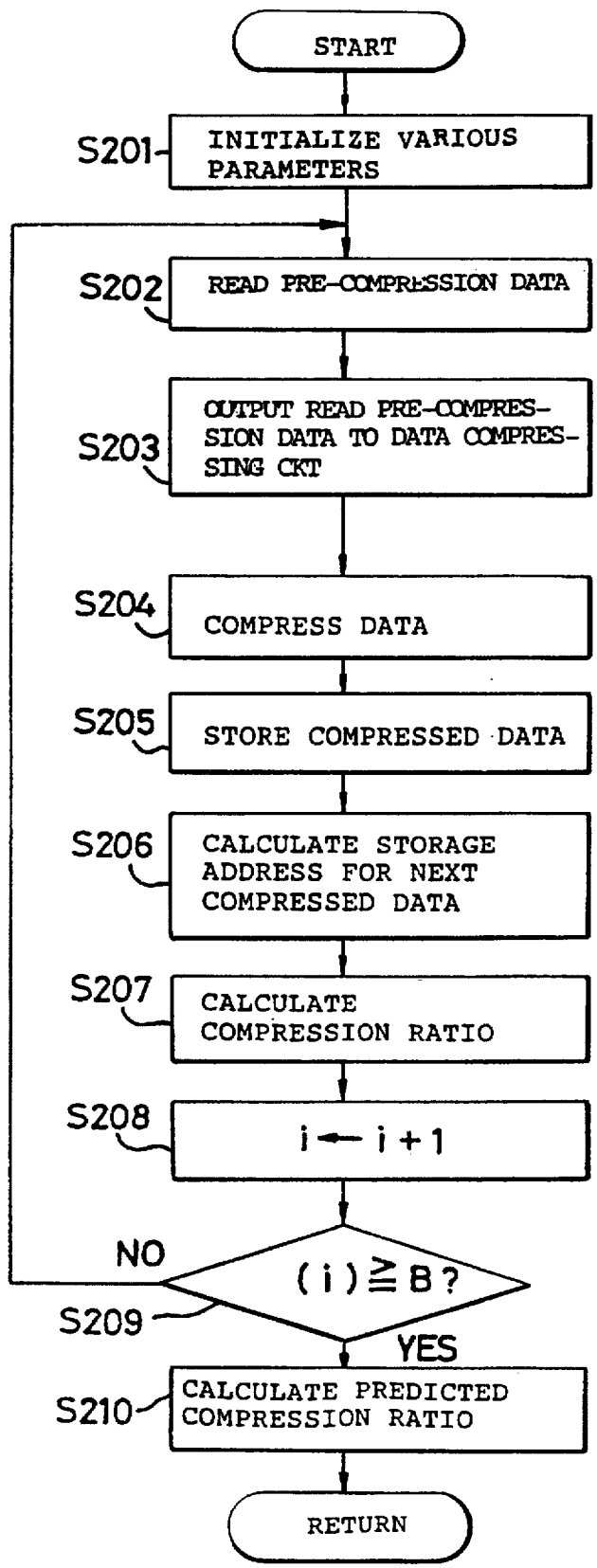
FIG. 16 is a flowchart of a processing operation of the expected compression ratio calculating means of the data processing means in the data transmitting apparatus according to the second embodiment.

As shown in FIG. 16, the predicted compression ratio calculating means 95 initializes various parameters in a step S201. Specifically, the predicted compression ratio calculating means 95 stores initial values "0" respectively into a register (hereinafter referred to as an "index register i") declared an index register i, a second register R2, a third register R3, and a fourth register R4, among various registers used in the data processing program 71.

In a next step S202, the pre-compression data reading means 102 reads A bytes of pre-compression data at the (i×A)th byte, which is determined by multiplying the value of the index register i by the A bytes, from the start of the pre-compression data storage area. In a first loop, A bytes, e.g., 2 Kbytes, of pre-compression data from the 0th byte of the pre-compression data storage area are read.

In a next step S203, the read A bytes of pre-compression data are outputted to the data compression circuit 67. The data compression circuit 67 compresses the A bytes of pre-compression data according to the loss-less data compression process using the buffer memory 69 in a step S204. Unlike the data transmitting apparatus 1 according to the first embodiment, it is not necessary to compress all the pre-compression data, but it is only necessary to compress the A bytes, e.g., 2 Kbytes, of pre-compression data. Therefore, the size of the buffer memory 69 may be reduced.

In a next step S205, the compressed data storing means 103 reads the compressed data outputted from the data compression circuit 67 and stores the compressed data into the compressed data storage area of the data RAM 64 at the Nth byte (address), where N is an integer, corresponding to the value of the third register R3. Since the value of the third register R3 is "0" in the first routine, the compressed data is stored into the compressed data storage area from the 0th byte (starting address). At this time, the number of bytes, for example, from the start of the compressed data to the end of the compressed data is counted, and the counted number is stored as the data length of the compressed data in the second register R2.

In a next step S206, the storage address calculating means 104 calculates an address at which to store next compressed data in the compressed data storage area. Specifically, the storage address calculating means 104 calculates this address by adding the value (the present storage address) of the third register R3 and the value (the present data length of the compressed data) of the second register R2, and stores the sum into the third register R3.

In a next step S207, the compression ratio calculating means 105 determines an actual compression ratio with respect to the present 2 Kbytes of pre-compression data, and determines an accumulation of the determined actual compression ratio and the previous compression ratio. This calculation is carried out by dividing the A bytes by the value of the second register R2, adding the quotient (floating-point data) and the value (the previous compression ratio) of the fourth register R4, and storing the sum again into the fourth register R4.

In a next step S208, the value of the index register i is incremented by +1.

In a next step S209, the decision means 101 determines whether the number of processing loops has reached the prescribed loop number B necessary to determine a predicted compression ratio by determining whether the value of the index register i reached the prescribed loop number B that is stored in the prescribed loop number storage area.

If the number of processing loops has not reached the prescribed loop number B, then control returns to the step S202 and the step S202 and following steps are executed. If the A bytes are 2 Kbytes and the data length of pre-compression data necessary to determine a predicted compression ratio is 10 Kbytes, then the prescribed loop number B is 5. The prescribed loop number B is determined according to specifications.

If the number of processing loops (the value of the index register i) has reached the prescribed loop number B, then control proceeds to a step S210 in which the predicted compression ratio calculating means 106 determines a present predicted compression ratio by dividing the accumulated value of as many actual compression ratios as the number of processing loops stored in the fourth register R4 by the prescribed loop number B, and storing the quotient into the fourth register R4.

The pre-compression data transferred from the data source 2 may comprise data having different attributes including text data, bit map data, and an execution file. If all the pre-compression data is text data, for example, then a predicted compression ratio obtained by dividing the accumulated value of actual compression ratios by the prescribed loop number B suffers only a small error with respect to an actual compression ratio obtained by actually compressing all the pre-compression data.

If, however, the pre-compression data transferred from the data source 2 comprises data having different attributes including bit map data and an execution file in addition to text data, then an expected final compression ratio would tend to suffer a large error if the same calculations as described above were carried out for these data.

According to the second embodiment, as many weighting coefficients C as the number of types of data are employed by being registered in the data ROM 62. The type of data contained in the header of pre-compression data transferred from the data source 2 is referred to, and the quotient is multiplied by the weighting coefficient C corresponding to the type of data to produce a predicted compression ratio.

In this manner, irrespective of the type of data transferred from the data source 2, any error of the predicted compression ratio with respect to the expected final compression ratio is minimized, thus improving the overall system performance.

After the predicted compression ratio is calculated in the step S210, the operation of the predicted compression ratio calculating means 95 (the predicted compression ratio calculating subroutine) is finished.

Referring back to FIG. 13, the decision means 92 determines whether the predicted compression ratio is effective or not by determining whether the value (predicted compression ratio) of the fourth register R4 is at least the preset compression ratio β stored in the preset compression ratio storage area in a step S108.

If the predicted compression ratio is at least the preset compression ratio β, i.e., is equal to or greater than the preset compression ratio β, then control goes to a next step S109 in which the data compressing means 96 is operated, i.e., a data compressing subroutine is executed.

Figure 17:
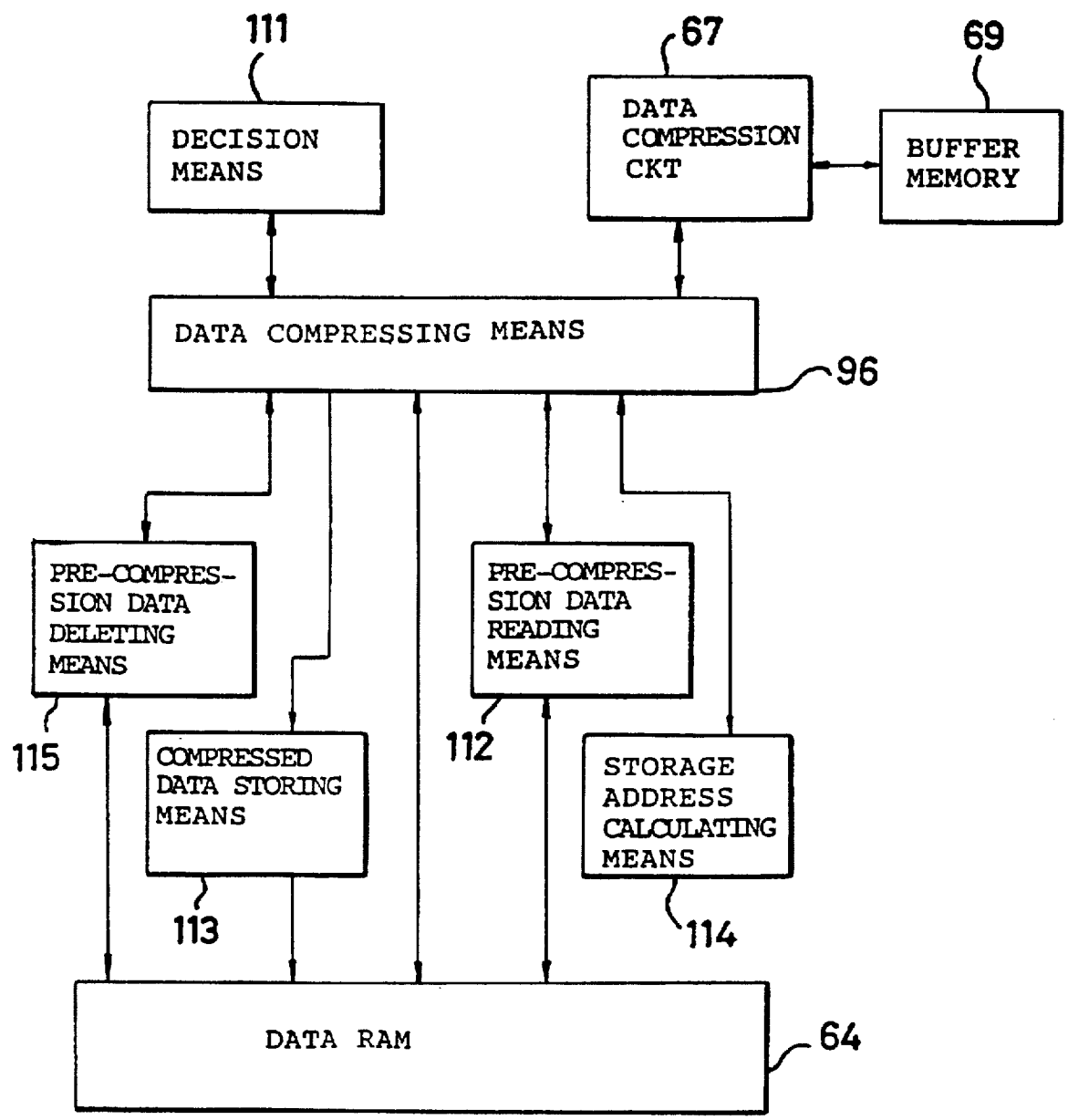
FIG. 17 is a functional block diagram showing a processing operation of a data compressing means of the data processing means in the data transmitting apparatus according to the second embodiment.

As shown in FIG. 17, the data compressing means 96 comprises a decision means 111 for determining whether all pre-compression data has been compressed, a pre-compression data reading means 112 for reading the pre-compression data from the pre-compression data storage area by A bytes, a compressed data storing means 113 for reading compressed data outputted from the data compression circuit 67 and storing the compressed data into the compressed data storage area of the data RAM 64, a storage address calculating means 114 for calculating a storage address at which to store the compressed data in the compressed data storage area, and a compression ratio deleting means 115 for deleting a requested size of the pre-compression data stored in the pre-compression data storage area from a corresponding address.

Figure 18:
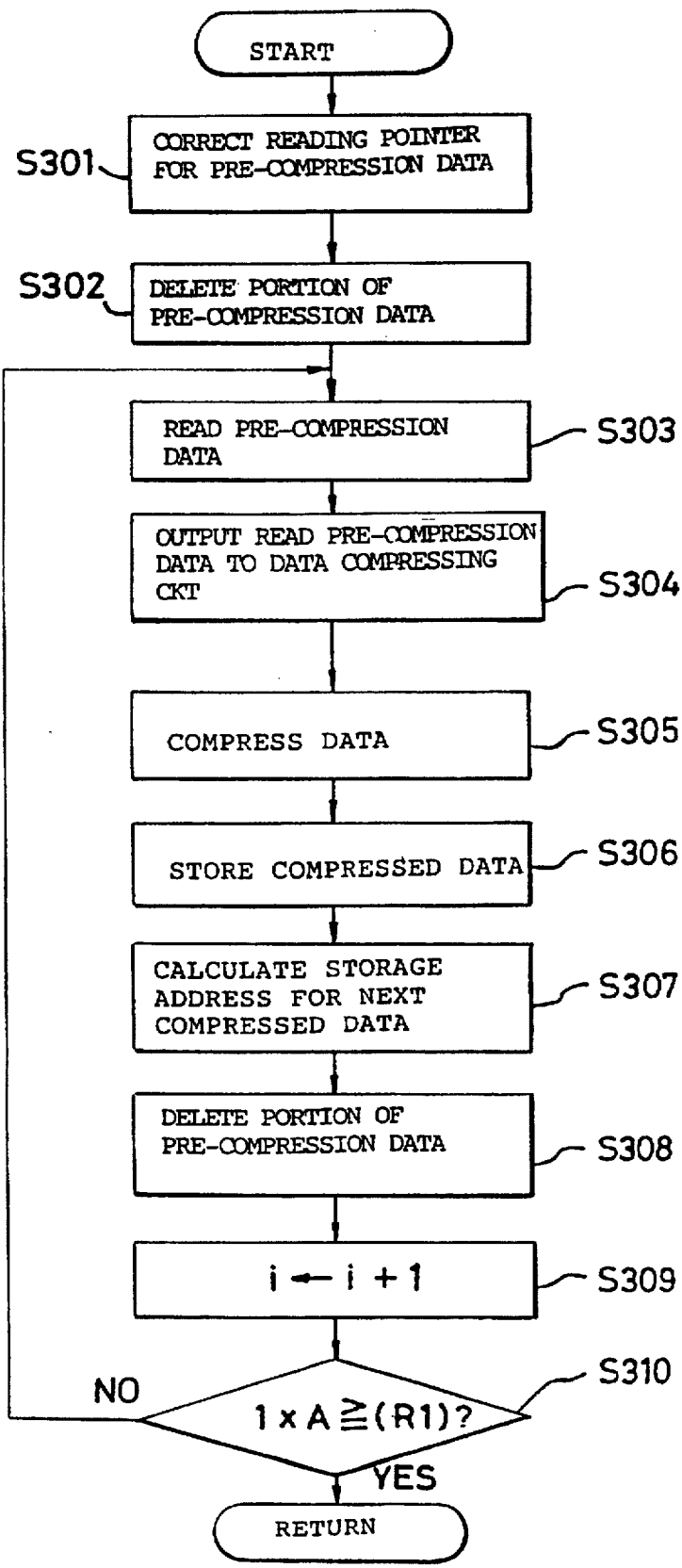
FIG. 18 is a flowchart of a processing operation of the data compressing means of the data processing means in the data transmitting apparatus according to the second embodiment.

As shown in FIG. 18, the data compressing means 96 (data compressing subroutine) first corrects a reading pointer for pre-compression data in a step S301. Specifically, the reading pointer is corrected by storing the prescribed loop number B into the index register i.

In a next step S302, the compression ratio deleting means 115 deletes pre-compression data which has already been compressed by the predicted compression ratio calculating means 95 from the pre-compression data stored in the pre-compression data storage area. The pre-compression data is deleted by outputting, to the OS, a deletion instruction having parameters composed of a starting address of an area where the pre-compression data to be deleted is stored and the size of the data to be deleted. In this case, the starting address is a starting address of the pre-compression data storage area in the data RAM 94, and the deletion instruction has a value produced by multiplying the value of the index register i by the A bytes.

In response to the deletion instruction, the data management program of the OS is executed to delete the write-protect data from an area determined by the starting address and the size of the data to be deleted, in the pre-compression data storage area. If 10 Kbytes of pre-compression data are used to determine the predicted compression ratio, then the write-protect data is deleted from an area where the used 10 Kbytes of pre-compression data are stored. As a result, another program or the like may utilize the storage area of 10 Kbytes from which the write-protect data has been deleted as a working area or a data storage area.

In a next step S303, the pre-compression data reading means 112 reads A bytes of pre-compression data at the (i×A)th byte, which is determined by multiplying the value of the index register i by the A bytes, from the start of the pre-compression data storage area.

If 10 Kbytes of pre-compression data are used to determine a predicted compression ratio, then since the value of the index register I is 5 and the pre-compression data readout size A is 2 Kbytes, A bytes, e.g., 2 Kbytes, of pre-compression data are read from the 10th byte of the pre-compression data storage area are read.

In a next step S304, the read A bytes of pre-compression data are outputted to the data compression circuit 67. The data compression circuit 67 compresses the A bytes of pre-compression data according to the loss-less data compression process using the buffer memory 69 in a step S305.

In a next step S306, the compressed data storing means 113 reads the compressed data outputted from the data compression circuit 67 and stores the compressed data into the compressed data storage area of the data RAM 64 at the Nth byte (address), where N is an integer, corresponding to the value of the third register R3. Since the value of the third register R3 is of a value corresponding to the size of the compressed data used to determine the predicted compression ratio in the first loop, the compressed data is stored into the compressed data storage area from a byte (starting address) next to the area occupied by the compressed data stored when the predicted compression ratio was determined. At this time, the number of bytes, for example, from the start of the compressed data to the end of the compressed data is counted, and the counted number is stored as the data length of the compressed data in the second register R2.

In a next step S307, the storage address calculating means 114 calculates an address at which to store next compressed data in the compressed data storage area. Specifically, the storage address calculating means 114 calculates this address by adding the value (the present storage address) of the third register R3 and the value (the present data length of the compressed data) of the second register R2, and stores the sum into the third register R3.

In a next step S308, the compression ratio deleting means 115 deletes the pre-compression data which has been read in the step S303 and compressed in the step S305 from the pre-compression data stored in the pre-compression data storage area. Specifically, the compression ratio deleting means 115 deletes the A bytes of pre-compression data at the (i×A)th byte, which is determined by multiplying the value of the index register i by the A bytes.

As with the step S302, the pre-compression data is deleted by outputting, to the OS, a deletion instruction having parameters composed of a starting address (the (i×A)th byte of the pre-compression data storage area) of an area where the pre-compression data to be deleted is stored and the size of the data (A bytes) to be deleted.

In response to the deletion instruction, the data management program of the OS is executed to delete the write-protect data from an area determined by the starting address (the (i×A)th byte) and the size of the data (A bytes) to be deleted, in the pre-compression data storage area.

As a consequence, another program or the like may utilize the storage area of A bytes from which the write-protect data has been deleted as a working area or a data storage area.

In a next step S309, the value of the index register i is incremented by +1.

In a next step S310, the decision means 111 determines whether all the pre-compression data has been compressed by determining whether the value (the data length of the pre-compression data which has been compressed) produced by multiplying the value of the index register i by the A bytes is at least the data length of the all the pre-compression data stored in the first register R1.

If all the pre-compression data has not been compressed, then control returns to the step S303 and the step S303 and following steps are executed. If all the pre-compression data has been compressed, then the operation of the data compressing means 96 is finished, i.e., the data compressing subroutine is finished.

Referring back to the main routine shown in FIG. 13, the transfer request data generating means 98 shown in FIG. 12 generates transfer request data for the compressed data. Specifically, the transfer request data is generated in a given array variable area (transfer request data area) in a program working area allotted to the data RAM 64, and is composed of a header section and a data section. The transfer request data generating means 98 generates transfer request data for the compressed data by registering an identification code indicative of the compressed data and the data length of the compressed data stored in the second register R2 in the header section, and adding the compressed data as the data section.

Thereafter, the message output means 100 outputs an information code indicating that the data has been compressed, which may be the identification code indicative of the compressed data, through the output port 66 to the controller 12 in a step S111. In response to the information code supplied from the data transmitting apparatus 1, the controller 12 outputs message data indicating that the data has been compressed to the display monitor. The display monitor now displays a message "DATA HAS BEEN COMPRESSED", for example, on its screen.

If the predicted compression ratio is smaller than the preset compression ratio β in the step S108, then control goes to a step S112 in which the transfer request data generating means 98 generates transfer request data for the pre-compression data. Specifically, the transfer request data is generated in the transfer request data area allotted to the data RAM 64. The transfer request data generating means 98 generates transfer request data for the pre-compression data by registering an identification code indicative of the pre-compression data and the data length of the pre-compression data stored in the first register R1 in the header section, and adding the pre-compression data as the data section.

Thereafter, the message output means 100 outputs an information code indicating that the data has not been compressed, which may be the identification code indicative of the pre-compression data, through the output port 66 to the controller 12 in a step S113. In response to the information code supplied from the data transmitting apparatus 1, the controller 12 outputs message data indicating that the data has not been compressed to the display monitor. The display monitor now displays a message "DATA HAS NOT BEEN COMPRESSED", for example, on its screen.

Figure 14:
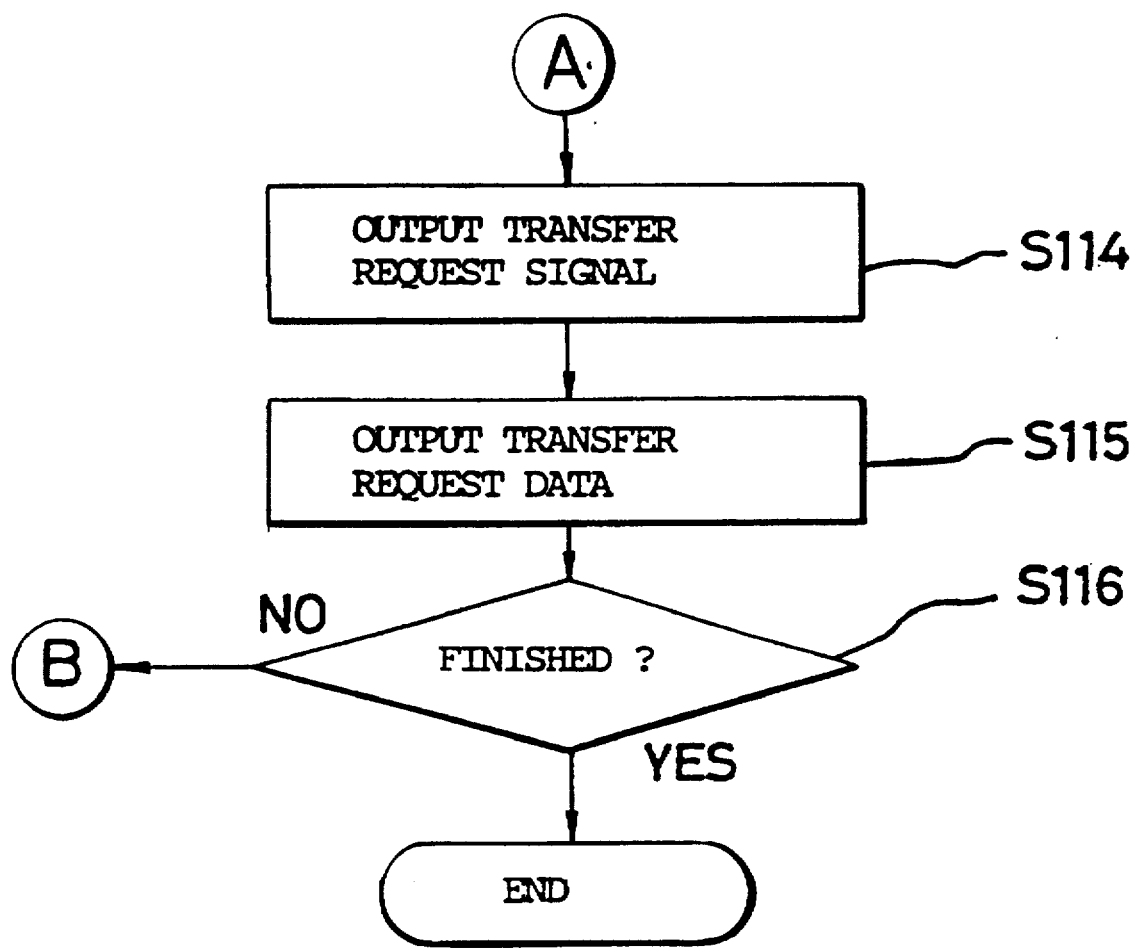
FIG. 14 is a flowchart (2) of the processing operation of the data processing means in the data transmitting apparatus according to the second embodiment.

After the step S111 or S113, control goes to a step S114 shown in FIG. 14 in which the transfer request signal output means 97 outputs a transfer request signal through the output port 66 to the controller 12. The controller 12 outputs a control signal such as a write enable signal, a data storage request signal, or the like for receiving data transferred from the data transmitting apparatus 1, to the data destination 3. The data destination 3 is now brought into a mode for waiting for data from the data transmitting apparatus 1.

In a next step S115, the transfer request data output means 99 outputs the transfer request data for the compressed data or the pre-compression data stored in the transfer request data area of the data RAM 64, through the output port 66 to the data destination 3.

If the data is outputted to the data destination 3 through a transmission path such as a data communication path which tends to suffer a transmission error, then the transfer request data output means 99 adds an error-correcting code to the transfer request data, and outputs the transfer request data with the added error-correcting code.

In a next step S116, the decision means 92 determines whether there is a program finishing request or not based on whether there is a finishing request interrupt input such as a power supply turn-off input.

If there is no program finishing request in the step S116, then control returns to the step S103 to wait for a next transfer request from the data source 2. If there is a program finishing request in the step S116, then the data processing program 91 comes to an end.

In the data transmitting apparatus 1 according to the second embodiment, as with the data transmitting apparatus 1 according to the first embodiment, it is determined whether the compressed data or the pre-compression data is to be transferred to the data destination 3 based on the comparison between the actual compression ratio and the preset compression ratio β. Based on the decision, the compressed data or the pre-compression data is transferred to the data destination 3. Therefore, it is possible to prevent a phenomenon in which the size of compressed data which occupies a storage area in the data destination 3 is substantially the same as the size of uncompressed data which occupies the storage area, and also to avoid wasteful data expansion in the data destination 3.

Particularly, it is determined whether the compressed data or the pre-compression data is to be transferred to the data destination 3 based on a predicted compression ratio that is determined not by compressing all pre-compression data, but by compressing pre-compression data having a size, e.g., 10 Kbytes of pre-compression data, which is determined by the A bytes×the prescribed loop number B, and if it is found that pre-compression data is to be transferred to the data destination 3, any subsequent pre-compression data following the compressed size of pre-compression data will not be compressed. Consequently, it is possible to shorten the entire processing time, i.e., the period of time from the stage of reading pre-compression data from the data source 2 to the transfer of the data to the data destination 3.

Since the pre-compression data which has been compressed is successively deleted to delete write-protect data in the steps S302, S308 carried out by the data compressing means 96, the data RAM 64 can be used highly efficiently and a system shutdown due to a storage capacity shortage can be avoided.

Not all pre-compression data is transmitted to the data compression circuit 67, but pre-compression data is transmitted in units of A bytes to the data compression circuit 67 for data compression. Therefore, the buffer memory 69 used by the data compression circuit 67 for data compression may have a reduced storage capacity, with the result that the overall system circuit arrangement can reduced in size.

In the step S210 carried out by the predicted compression ratio calculating means 95, weighting is effected depending on the type of data transferred from the data source 2 for determining a predicted compression ratio. Accordingly, irrespective of the type of data transferred from the data source 2, any error of the predicted compression ratio with respect to the expected final compression ratio is minimized, thus improving the overall system performance.

The data transmitting apparatus 1 according to the first and second embodiments are applicable to all systems for compressing data based on the loss-less data compression technique.

Some systems compress data by files or blocks of fixed length divided from files. The data transmitting apparatus 1 according to the first and second embodiments are also applicable to these systems.

[Description of a data transmitting apparatus (data processing apparatus) according to a third embodiment]

A data transmitting apparatus according to a third embodiment, which is applied to the mode of use shown in FIG. 7, will be described below with reference to FIGS. 19 through 42.

The data transmitting apparatus 1 according to the third embodiment is incorporated in the external memory device 52 connected to the host computer 51, and functions as a data processing apparatus 1 in the external memory device 52. In the description which follows, the data transmitting apparatus 1 according to the third embodiment will be referred to as the data processing apparatus 1.

[Arrangement of the external memory device]

Figure 19:
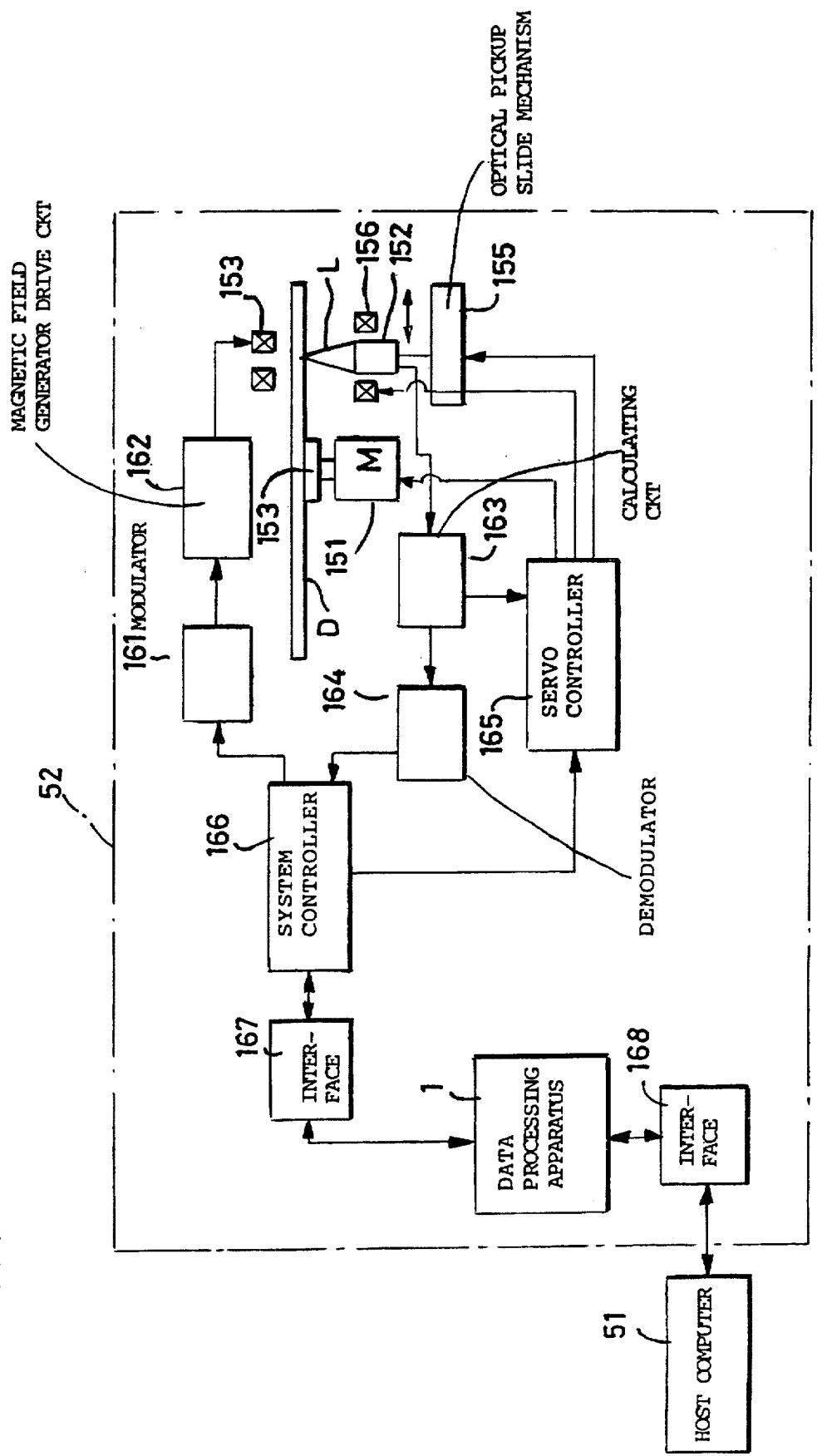
FIG. 19 is a block diagram of an external memory device (hereinafter referred to as an "external memory device according to an embodiment") which incorporates a data transmitting apparatus according to an embodiment of the present invention which carries out a third processing operation (hereinafter simply referred to as a "data transmitting apparatus according to a third embodiment")

The external memory device 52 which incorporates the data processing apparatus 1 according to the third embodiment comprises a disk recording and reproducing device using a magnetooptical disk, for example, as a recording medium. As shown in FIG. 19, the external memory device 52 comprises a cartridge holder (not shown) for inserting therein a disk cartridge (not shown) in which a magnetooptical disk D of the magnetic field-modulated type is rotatably housed, a spindle motor 151 for rotating the magnetooptical disk D in the disk cartridge inserted in the cartridge holder, an optical pickup 152 for reproducing an information signal from the magnetooptical disk D, and a recording magnetic field generator 153 for applying a recording magnetic field to the magnetooptical disk D that is being rotated by the spindle motor 151 to magnetize, according to a recording signal, a spot (heated to a temperature in excess of the Curie point) in a perpendicularly magnetized film (recording layer) of the magnetooptical disk D which is irradiated by a laser beam L emitted from the optical pickup 152. In FIG. 19, the disk cartridge is omitted from illustration for the sake of brevity.

The cartridge holder has a known shutter opening/closing mechanism (not shown) for selectively opening and closing a shutter (not shown) of the disk cartridge.

When the disk cartridge is inserted into the cartridge holder, the shutter thereof is opened by the shutter opening/closing mechanism. When the shutter is fully opened by the shutter opening/closing mechanism, i.e., when the disk cartridge is fully inserted into the cartridge holder, the loading of the disk cartridge into the external memory device 52 is finished.

The spindle motor 151 is positioned below a central region of the loaded disk cartridge, and can vertically be moved toward and away from the disk cartridge by a known spindle motor lifting/lowering mechanism (not shown) which is mainly composed of a stepping motor and a mechanism for converting rotary motion into linear motion.

The spindle motor 151 has a motor shaft connected at its upper end a turntable 154 having a magnet.

In response to the loading of the disk cartridge, the spindle motor 151 is moved upwardly by the spindle motor lifting/lowering mechanism to cause the turntable 154 to enter the disk cartridge through an opening in a lower panel of the disk cartridge. At this time, the upper surface of the turntable 154 and the center hub of the magnetooptical disk D in the disk cartridge are attracted to and held against each other by the magnet, and the magnetooptical disk D in the disk cartridge is mounted on the spindle motor 151.

The optical pickup 152 is positioned below the opening in the lower panel of the disk cartridge which is exposed in the external memory device 52. The optical pickup 152 is movable radially across the magnetooptical disk D in the disk cartridge by a known optical pickup slide mechanism 155 which primarily comprises a linear motor and a guide shaft.

The optical pickup 152 has an objective lens (not shown) for converging a laser beam L from a laser beam source onto the recording layer of the magnetooptical disk D. The objective lens is slightly movable in directions toward and away from the magnetooptical disk D and also in directions radially across the magnetooptical disk D by a two-dimensional actuator 156. The two-dimensional actuator 156 comprises a magnetic circuit composed of a focusing coil, a tracking coil, and a magnet, for example.

The recording magnetic field generator 153 is positioned above an opening defined in an upper panel of the disk cartridge which is exposed in the external memory device 52. The recording magnetic field generator 153 is vertically movable toward and away from the opening in the upper panel of the disk cartridge by a known lifting/lowering mechanism (not shown) which is mainly composed of a stepping motor and a mechanism for converting rotary motion into linear motion. The recording magnetic field generator 153 is also movable radially across the magnetooptical disk D in ganged relation to the optical pickup 152 by an interlink mechanism (not shown).

As shown in FIG. 19, the external memory device 52 has a circuit arrangement comprising a modulator 161, a magnetic field generator drive circuit 162, a calculating circuit 163, a demodulator 164, a servo controller 165, and a system controller 166 for controlling these circuits. The data processing apparatus 1 according to the third embodiment is connected to the system controller 166 through an interface 167.

The data processing apparatus 1 is connected to the host computer 51 disposed outside of the external memory device 52, through an interface bus such as a SCSI bus and an interface 168 for data transfer therebetween.

The modulator 161 encodes recording data sent from the system controller 166 with an error-correcting code or the like, converts the encoded data into binary data, and outputs the binary data as an on/off signal.

Based on the on/off signal from the modulator 161, the magnetic field generator drive circuit 162 changes the direction of a current supplied to an exciting coil in the magnetic field generator 153 between positive and negative directions.

Specifically, when a current is supplied in a positive direction to the exciting coil, the spot in the recording layer of the magnetooptical disk D whose temperature is in excess of the Curie point by being irradiated with the laser beam from the optical pickup 152 is magnetized in a positive direction, for example. When a current is supplied in a negative direction to the exciting coil, the spot is magnetized in a negative direction, for example.

Subsequently, a reproducing laser beam L is applied from the optical pickup 152 to the positively or negatively magnetized spot. The Kerr angle in a reflected beam which is modulated by the positively or negatively magnetized spot is detected by a light detector composed of a pn-junction photodiode, for thereby obtaining a reproduced signal representative of magnetized information recorded on the magnetooptical disk D.

The servo controller 165 has therein a focusing servo control circuit, a tracking servo control circuit, a spindle servo control circuit, and a motor servo control circuit for controlling a motor serving as a drive source for the various moving mechanisms. These servo control circuits are supplied with servo control data (servo gains, etc.) and servo drive control signals such as drive signals from the system controller 166, and also with calculated servo control signals from the calculating circuit 163.

The spindle servo control circuit is a circuit responsive to a servo drive control signal from the system controller 166 for energizing the spindle motor 151 to rotate the magnetooptical disk D mounted on the turntable 154 at CLV (Constant Angular Velocity) or CAV (Constant Linear Velocity). If the magnetooptical disk D is a sample servo disk, for example, then the servo drive control signal is generated based on a clock signal that is produced by frequency-dividing, with a PLL, a pulse signal generated upon detection of clock pits which are formed together with servo pits in a servo area of the magnetooptical disk D.

The focusing servo control circuit is a circuit for driving and controlling the two-dimensional actuator 156 for the optical pickup 152 to move the objective lens toward and away from the magnetooptical disk D, based on a signal produced by effecting given calculations, with the calculating circuit 163, on a detected signal depending on the intensity of light reflected from a mirror on the magnetooptical disk D upon application of the laser beam to the mirror.

The tracking servo control circuit is a circuit for driving and controlling the two-dimensional actuator 156 for the optical pickup 152 to move the objective lens radially across the magnetooptical disk D, based on a tracking error signal from the calculating circuit 163, specifically a signal produced by effecting given calculations, with the calculating circuit 163, on a detected signal produced upon detection of servo pits in the servo area of the magnetooptical disk D.

The demodulator 164 is a circuit for converting a reproduced signal from the calculating circuit 163, specifically a signal produced by effecting given calculations on P- and S-polarized components of reflected light modulated according to magnetized information recorded in the recording layer of the magnetooptical disk D, into digital data, decoding a code such as an error-correcting code or the like added to the digital data, and outputting the digital data as reproduced data. The reproduced data from the demodulator 154 is supplied to the system controller 166.

The reproduced data supplied to the system controller 166 is supplied to the data processing apparatus 1 through the interface 167 and the interface bus (e.g., a SCSI bus). Address data contained in the reproduced data supplied to the system controller 166 is used to control the rotation of the spindle motor 151 and the scanning position of the optical pickup 152 in a seek mode.

[Arrangement of the data processing apparatus according to the third embodiment]

Figure 20:
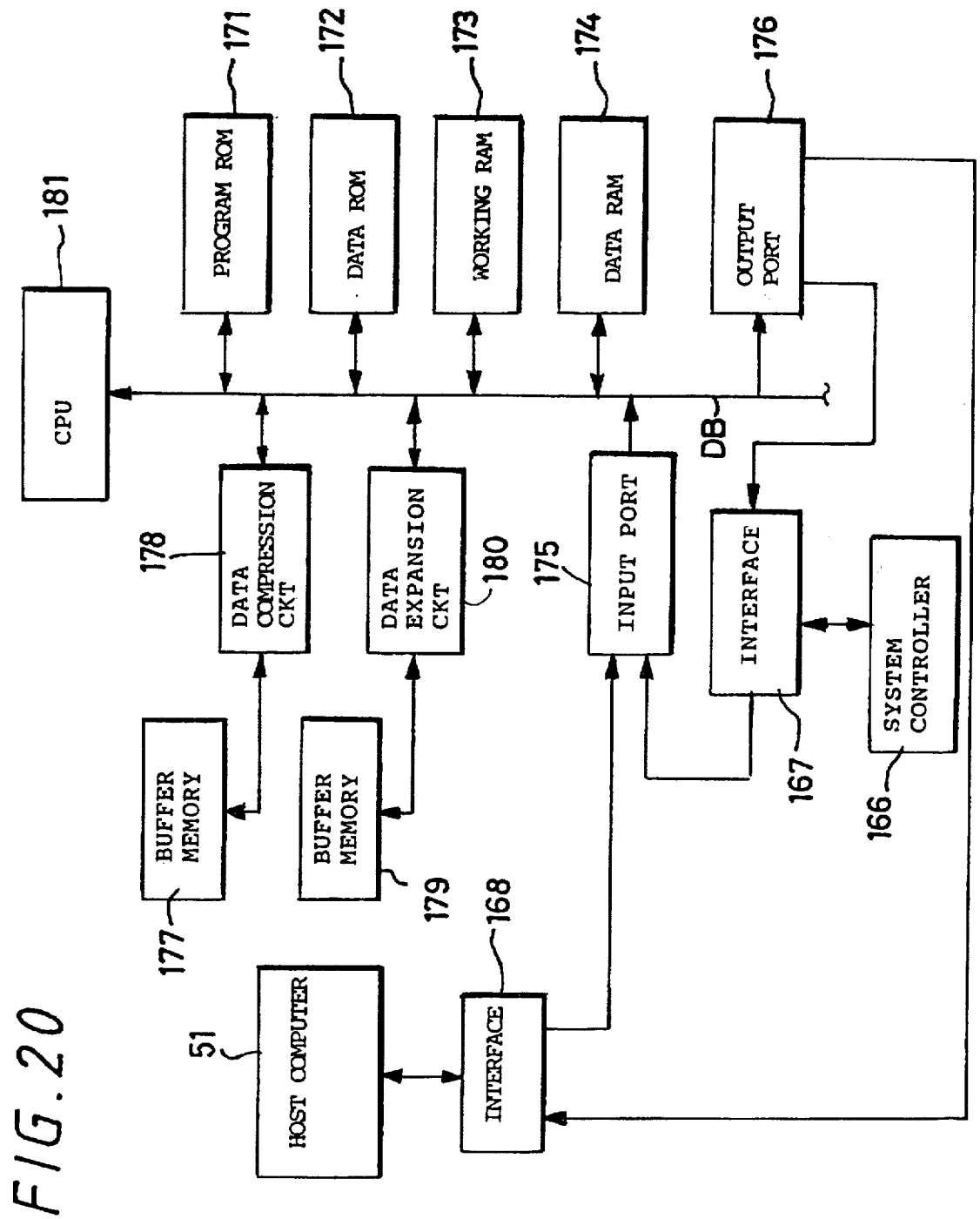
FIG. 20 is a block diagram of a hardware arrangement of the data transmitting apparatus according to the third embodiment.

The data processing apparatus 1 according to the third embodiment will be described below with reference to FIGS. 20 through 42. As shown in FIG. 20, the data processing apparatus 1 comprises, as its hardware components, a program ROM 171 storing various programs, a data ROM 172 registering various fixed data, a working RAM 173 used to execute a program read from the program ROM 171, a data RAM 174 for storing reproduced data from the system controller 166, recording data from the host computer 51, and data processed by various programs, an input port 175 and an output port 176 for inputting data from and outputting data to external circuits, a data compression circuit 178 for compressing data stored in the data RAM 174 using a dedicated buffer memory 177, a data expansion circuit 180 for expanding data stored in the data RAM 174 using a dedicated buffer memory 179, and a CPU (control and logic/arithmetic unit) 181 for controlling these circuits.

The data compression circuit 178 and the data expansion circuit 180 are circuits for compressing and expanding data in a loss-less manner, i.e., producing loss-less compressed and expanded data, and may each comprise a microcomputer or the like. While the loss-less data compression technique itself used by the data compression circuit 178 and the data expansion circuit 180 has no direct bearing on the present invention and hence will not be described in detail, it may be the LZW compressing technique, for example, used in the data transmitting apparatus 1 according to the first and second embodiments.

The various circuits transfer data through a data bus DB extending from the CPU 181, and are controlled by the CPU 181 through a control bus (not shown) extending from the CPU 181.

Recording data inputted from the host computer 51 through the interface bus and the interface 168 and response data inputted from the system controller 166 through the interface bus and the interface 168 are supplied through the input port 175 to the data bus DB.

Reproduced data or the like stored in the data RAM 174 and destined for the host computer 51 is supplied to the host computer 51 through the interface bus and the interface 168. Various drive request signals and recording data (compressed data or uncompressed data) stored in the data RAM 174 and destined for the system controller 166 are supplied to the system controller 166 through the output port 176, the interface bus, and the interface 167.

[Arrangement of the recording format of the magnetooptical disk]

Prior to describing operation of the external memory device 52 primarily based on operation of the data processing apparatus 1 according to the third embodiment, the format of the magnetooptical disk D loaded in the external memory device 52 will be described below with reference to FIG. 21. The magnetooptical disk D has ten thousands tracks having track numbers (track addresses) "0"~"9999" that are successively arranged radially from a radially outer side (circumferentially outermost side) toward a radially inner side (circumferentially innermost side). Thus, the magnetooptical disk D have tracks 0~9999.

The tracks 0~2 and the tracks 9948~9999 are tracks supervised by the data processing apparatus 1 and the system controller 166 of the external memory device 52. Of these tracks, the tracks 9948~9996 belong to an alternate area AE as described later on, and the tracks 0~2, 9997~9999 belong to a drive area DE supervised by the data processing apparatus 1 and the system controller 166 of the external memory device 52. The remaining tracks 3~9947 belong to a user area UE.

The drive area DE will record preferably uncompressed data for speeding up access for data reading and writing. The user area UE and the alternate area AE will selectively record data compressed by the data compression circuit 178 and uncompressed data depending on certain conditions, as described later on.

Each of the tracks has sectors having physical sectors numbers "0"~"24" (these sectors may be referred to as physical sectors 0~24 or simply sectors 0~24 if their meaning is apparent in the context, or may be referred to as sector addresses). One sector has a memory capacity (data recording capacity) of 2048 bytes.

The host computer 51 to which the external memory device 52 is connected records or reads data in units of 100 sectors, for example. If one unit of data handled by the host computer 51 in one access cycle is called one block, then the data length of one block is 100 sectors in a sector representation, and 100×2 Kbytes=200 Kbytes in a byte representation.

The host computer 51 supervises or handles data in 200-Kbyte blocks each composed of 100 sectors. Specifically, the host computer 51 supervises the sector 0 of the track 3 in the user area UE as a starting address 0 of data of one block, and also supervises starting addresses of respective subsequent blocks or every 100 sectors as sector addresses 100, 200, . . .

However, since data recorded in the user area UE may actually be compressed data, the sector addresses of data of one block supervised by the host computer 51 may not correspond uniquely to the sector addresses on the magnetooptical disk D. In this sense, the sector addresses supervised by the host computer 51 may be the to be logic sector addresses not governed by the recording format of the recording medium such as the magnetooptical disk D, and the sector addresses supervised by the data processing apparatus 1 of the external memory device 52 may be the to be physical sector addresses governed by the actual recording format of the magnetooptical disk D.

Therefore, the sector addresses supervised by the host computer 51 will hereinafter be referred to as logic sector addresses, and the sector addresses supervised by the data processing apparatus 1 will hereinafter be referred to as physical sector addresses.

Data of one block that can be supervised by the host computer 51 will hereinafter be referred to as data of one logic block, and data of one block that can be supervised by the data processing apparatus 1 will hereinafter be referred to as data of one physical block. For example, when the expected compression ratio β in the data compression circuit 178 is 2, if the data length of one logic block is 100 sectors, then the data length of one physical block is 50 sectors.

To facilitate the supervision of the correspondence between the logic sector addresses of data of one block before it is compressed and the physical sector addresses of data of one block after it is compressed, there is employed a file allocation table FAT in this embodiment. The file allocation table FAT will be described later on.

Both the logic sector addresses and the physical sector addresses are relative sector addresses with the starting address of the user area UE being 0. While the physical sector addresses may be defined as absolute sector addresses with the starting address of the track 0 being 0, since address calculations would be complex, the physical sector addresses should be relative sector addresses as with the logic sector addresses for better calculations.

In this embodiment, the number of sectors of one physical block is 50 as described above. However, this value may freely be changed according to specifications. For example, the number of sectors of one physical block may be 1. In this case, when the expected compression ratio β is 2, the number of sectors of one logic block is 2.

Figure 21:
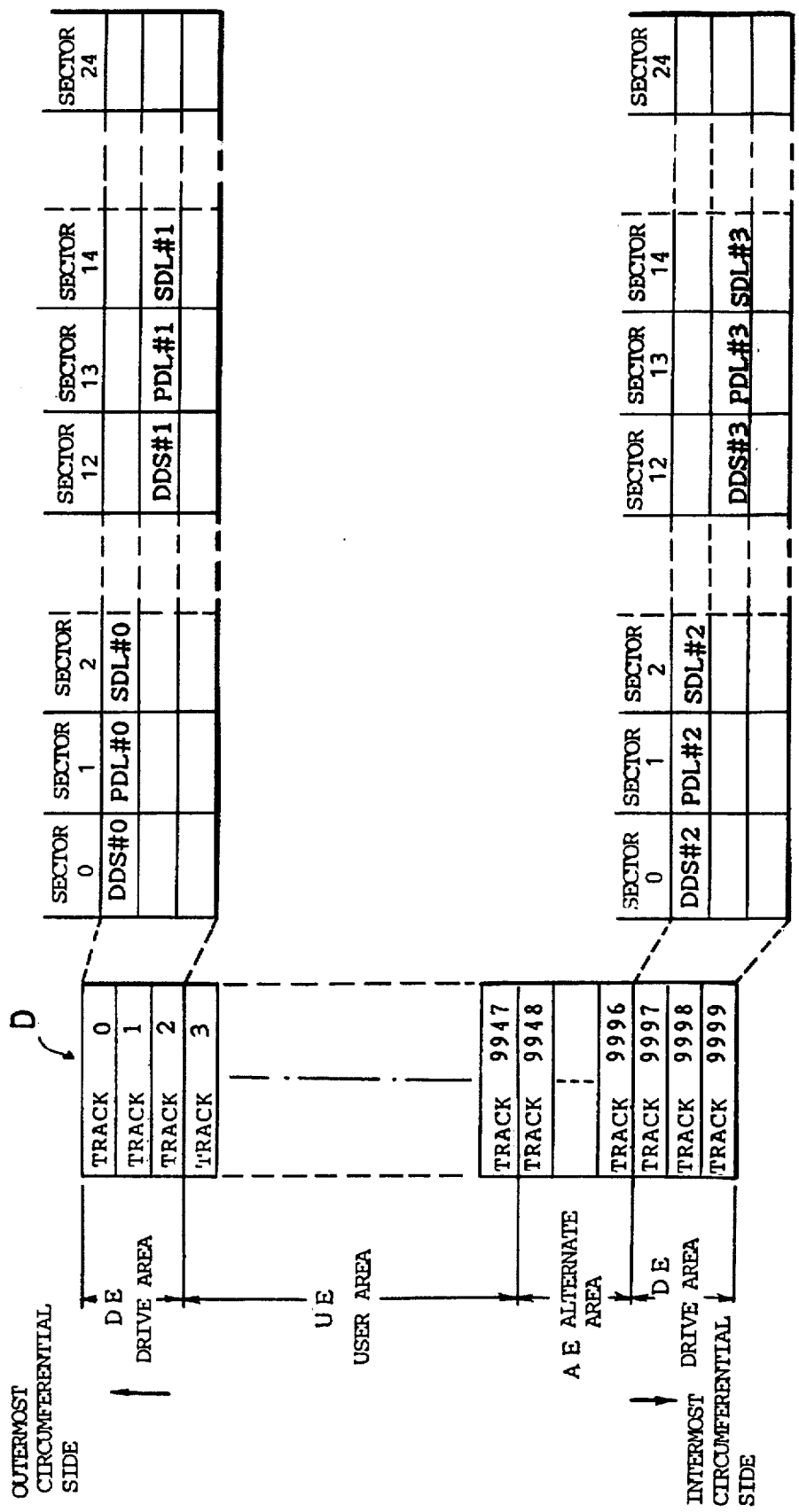
FIG. 21 is a diagram showing, by way of example, a recording format of a magnetooptical disk loaded in the external memory device according to the embodiment.

In FIG. 21, the sector 0 of the track 0 is a DDS (Disk Definition Structure) sector #0 for recording attributes, such as information indicating ID, an initialized status, or the like, and a file allocation table FAT, and the sector 1 of the track 0 is a PDL (Primary Defect List) sector #0 for recording information of a defect sector when the disk is certified.

The sector 2 of the track 0 is an SDL (Secondary Defect List) sector #0 for recording information of a defect sector when data is written and verified after the disk is certified. Data recorded in the DDS sector #0, the PDL sector #0, and the SDL sector #0 are collectively referred to as attribute data, and areas (the DDS sector #0, the PDL sector #0, and the SDL sector #0) for recording these attribute data are collectively referred to as attribute data recording areas.

The DDS sector #1, the PDL sector #1, and the SDL sector #1 as the sectors 12, 13, 14 of the track 1, the DDS sector #2, the PDL sector #2, and the SDL sector #2 as the sectors 0, 1, 2 of the track 9997, and the DDS sector #3, the PDL sector #3, and the SDL sector #3 as the sectors 12, 13, 14 of the track 9998 record therein the same data as the attribute data recorded in the DDS sector #0, the PDL sector #0, and the SDL sector #0 as the sectors 0, 1, 2 of the track 0, and function as so-called backup sectors.

The contents of the DDS sector #0 of the track 0 will be described below with reference to FIG. 22. Two bytes at byte numbers 0, 1 represent an ID (identification) of the DDS sector, and record therein "0A: BCD hexadecimal notation". Byte numbers 2, 2047 are reserved (undefined), and record therein "00". A byte at a byte number 3 records therein information as to whether the disk has been certified or not. If the disk has been certified, then "01" is recorded at the byte number 3, and if the disk has not been certified, then "02" is recorded at the byte number 3. Therefore, when a disk certifying process (initializing process) described later on is finished, the data recorded at the byte number 3 in the DDS sector #0 is changed from "02" to "01".

Areas indicated by byte numbers P, P+1, ..., P+Q contain file allocation tables FAT indicative of the correspondence between the logic sector addresses of data of one logic block, before it is compressed, received from the host computer 51 and the physical sector addresses of data of one physical block, after it is compressed, recorded in the user area UE and the alternate area AE of the magnetooptical disk D. As described above, data are recorded in the file allocation tables FAT in an uncompressed form.

[Arrangement of the file allocation table FAT]

As shown in FIG. 23, one record length in the file allocation table FAT is 15 bytes, and the file allocation table FAT is composed of a plurality of records each having a data storage capacity of 15 bytes. Each of the records is composed of former 6 bytes and latter 9 bytes. The former 6 bytes represent data management information in the host computer 51. Of the former 6 bytes, the first 3 bytes serve as an area (starting logic sector address storage area) "a" for storing a starting logic sector address of data of one logic block, and the next 3 bytes as an area (final logic sector address storage area) "b" for storing a final logic sector address of data of the same logic block.

The latter 9 bytes represent data management information on the magnetooptical disk D. Of the latter 9 bytes, the first 3 bytes serve as an area (starting physical sector address storage area) "c" for storing a starting physical sector address of data of one physical block, the next 3 bytes as an area (final physical sector address storage area) "d" for storing a final physical sector address of data of the same physical block, and the next 3 bytes as an area (link address storage area) "e" for storing a link address. The content of each of the records is 0 in the initial state.

One record of the file allocation table FAT stores a physical sector address of data of one physical block corresponding to a logic sector address of data of one logic block. Specifically, if data of one logic block can be compressed at the expected compression ratio β as prescribed, the sector size of the data of one logic block is compressed at the sector size of the data of one physical block. If the expected compression ratio is 2, for example, then data of one logic block having 100 sectors becomes data of one physical block having 50 sectors.

According to the loss-less data compression technique, however, data of one logic block may not necessarily be compressed at the above expected compression ratio. The compression ratio may be lower than the expected compression ratio β depending on the contents of the data of one logic block. In such a case, the data length of data of one physical block exceeds 50 sectors. According to the present embodiment, a starting physical sector address which has recorded data in excess of 50 sectors is stored as a link address in the link address storage area "e" in order to keep correspondence between the data of a physical block and the data of a logic block.

Concurrent with the storage of the link address, the link address is stored into the starting physical sector address storage area "c" of a record next to the above record, and the final physical sector address of a physical block where the data in excess of 50 sectors is stored into the final physical sector address storage area "d". At this time, "0" is stored into the starting logic sector address storage area "a" and the final logic sector address storage area "b" of the record.

"FFFF00" or "FFFF01" is stored into the link address storage area "e" of a record corresponding to a final block of a plurality of physical blocks corresponding to one logic block.

[Description of operation of the data processing apparatus according to the third embodiment]

The principles of operation of the data processing apparatus 1 according to the third embodiment will be described below on the assumption that the expected compression ratio β in the data compression circuit 178 is 2, the data length of one logic block is 100 sectors, and the data length of one physical block is 50 sectors.

When data of one logic block supplied from the host computer 51 to the data processing apparatus 1 is compressed by the data compression circuit 178, if the data length of the compressed data is 50 sectors or less, then the actual compression ratio ε thereof is 2 or greater, allowing the data of one logic block to be accommodated in one physical block.

At this time, in the corresponding record of the file allocation table FAT, the starting physical sector address of the above one physical block is stored into the starting physical sector address storage area "c" in a manner to correspond to the starting logic sector address, the final physical sector address of the same physical block is stored into the final physical sector address storage area "d", and information indicating that no next link address exists and that compressed data is recorded in this physical block, i.e., "FFFF01", is stored into the link address storage area "e" (see the contents of the record 2 shown in FIG. 23).

If the data length of the compressed data is greater than 50 sectors, then the actual compression ratio ε thereof is smaller than the expected compression ratio β=2, preventing the data of one logic block from being accommodated in one physical block. As a result, the data of one logic block has the same data length as two physical blocks, i.e., one logic block.

In this case, the data (uncompressed data) supplied from the host computer 51, rather than compressed data, is directly recorded on the magnetooptical disk D at the corresponding physical address.

At this time, in the corresponding record of the file allocation table FAT, the starting physical sector address of first one physical block is stored into the starting physical sector address storage area "c" in a manner to correspond to the starting logic sector address, the final physical sector address of the same physical block is stored into the final physical sector address storage area "d", and the starting physical sector address of next one physical block is stored into the link address storage area "e".

In a next record, "0" is stored into the starting logic sector address storage area "a" and the final logic sector address storage area "b", the starting physical sector address (the same as the link address) of next one physical block is stored into the starting physical sector address storage area "c", the final physical sector address of the next physical block is stored into the final physical sector address storage area "d", and information indicating that no next link address exists and that uncompressed data is recorded in this series of physical blocks, i.e., "FFFF00", is stored into the link address storage area "e" (see the contents of the records 0, 1 shown in FIG. 23).

In this manner, it is not necessary to perform an extra process such as a data expansion process subsequently by recording uncompressed data, rather than compressed data having the same data length as one logic block, when data is viewed in units of physical blocks, on the magnetooptical disk D. Therefore, the speed of access (transfer speed) from the magnetooptical disk D to the data processing apparatus 1 to the host computer 51 is increased.

This holds true for an expected compression ratio $\beta$ set to more than 2. If the expected compression ratio $\beta$ is 3, then when the actual compression ratio is 3/2 or greater, compressed data is recorded at the corresponding physical address, and when the actual compression ratio is smaller than 3/2, uncompressed data is recorded at the corresponding physical address.

More specifically, when the actual compression ratio is 3 or greater, data of one logic block is compressed to a size that can be accommodated in one physical block. When the actual compression ratio $\epsilon$ is in the range of $3/2 \leq \epsilon < 3$, data of one logic block is compressed to a size that can be accommodated in two physical blocks. In these cases, the compressed data is recorded. When the actual compression ratio $\epsilon$ is $\epsilon < 3/2$, data of one logic block, even though it is compressed, occupies three physical blocks having the same data length as one logic block. In this case, the uncompressed data is recorded. [Specific examples of the processing operation of the data processing apparatus according to the third embodiment]

Specific examples of the processing operation of the data processing apparatus 1 will be described below with reference to functional blocks and flowcharts shown in FIGS. 24 through 42.

Figure 25:
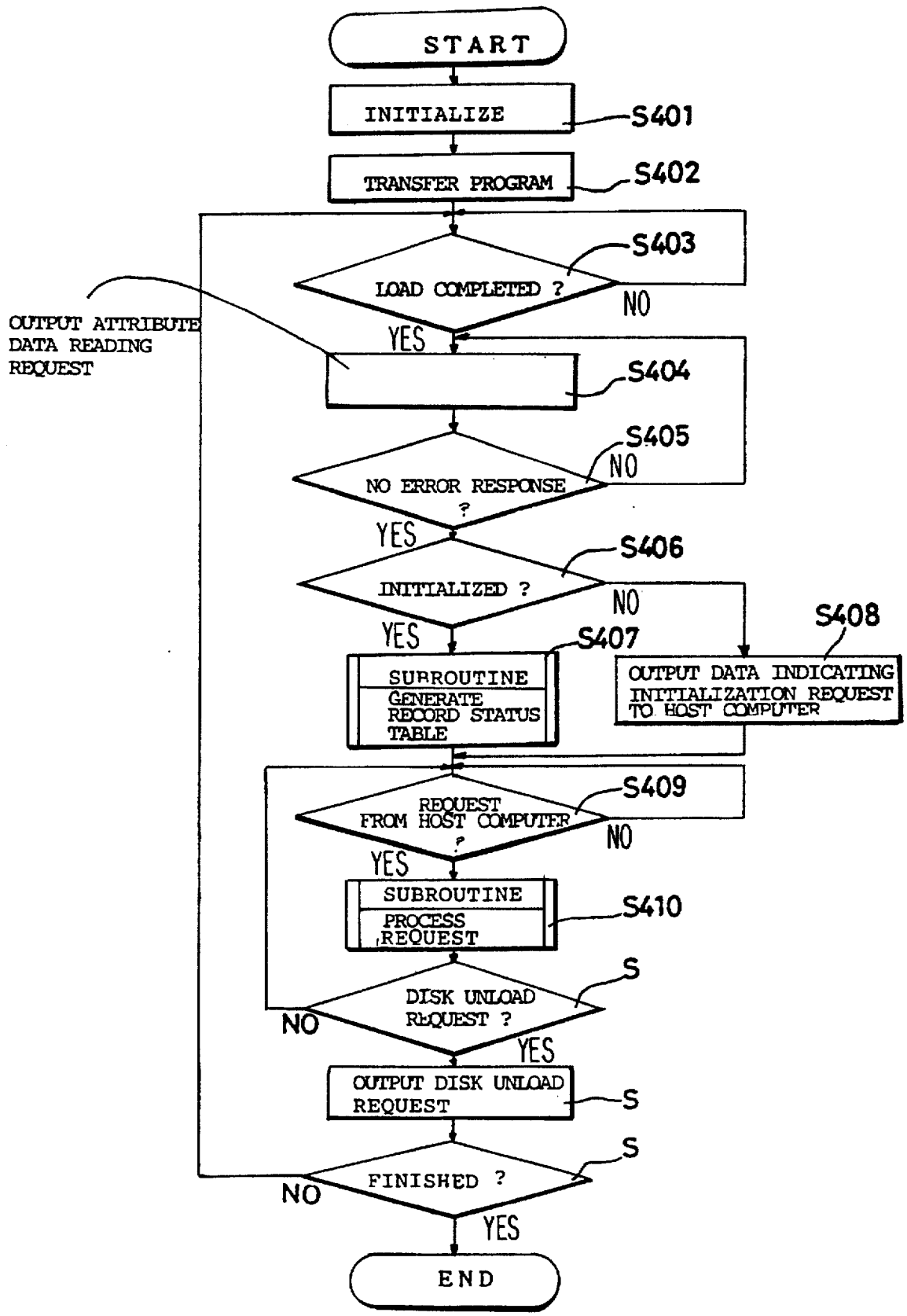
FIG. 25 is a flowchart of a processing operation of the data processing means in the data transmitting apparatus according to the third embodiment.

As shown in FIG. 25, at the same time that the power supply is switched on, the data processing apparatus 1 is initialized, e.g., its system check, memory check, and set-up process are carried out in a step S401.

Then, in a step S402, a data processing means (data processing program: a means 201, see FIG. 24, for compressing data from the host computer 51 and supplying the compressed data to the system controller 166, and for expanding reproduced data from the system controller 166 and transferring the expanded data to the host computer 51) is read from the program ROM 171 and written into the working RAM 173. At the same time, a working area for temporarily storing data generated during the execution of the program 201 and for transferring parameters between routines is allotted to the working RAM 173.

To the data RAM 174, there are allotted an initializing data storage area for storing initializing data of one physical block, an attribute data storage area for storing attribute data of the magnetooptical disk D, a logic block data storage area for storing uncompressed data of one logic block (e.g., 100 sectors) from the host computer 51, a compressed data storage area for storing compressed data produced by compressing uncompressed data of one logic block, a data storage area for storing data form the system controller 166, particularly data from the user area UE (or the alternate area AE), an expanded data storage area for storing expanded data, and an area occupied by a record status table which represents record statuses of physical blocks on the magnetooptical disk D in a simple string of bits (the occupied area will hereinafter be referred to as a "record status table").

Figure 24:
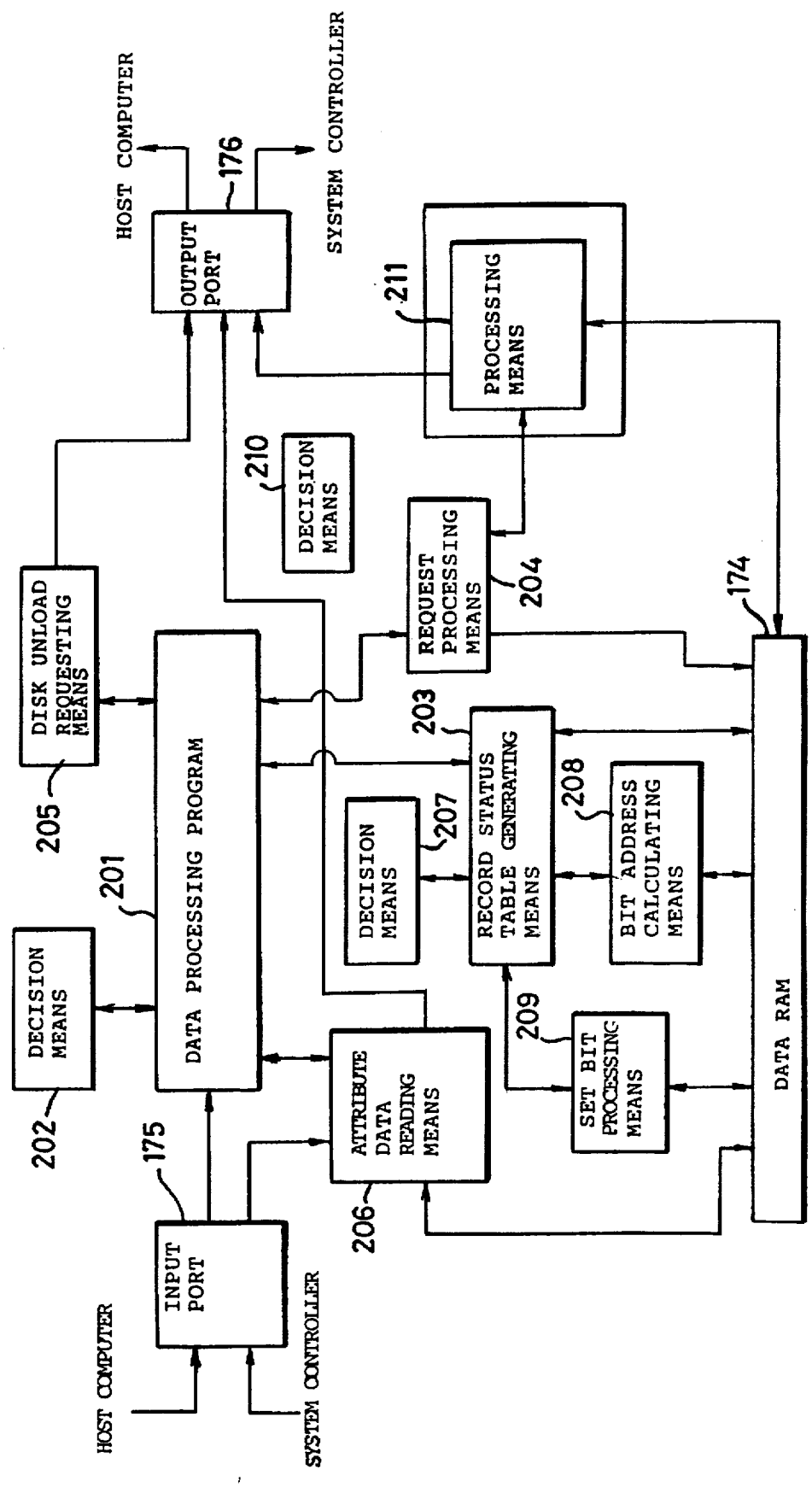
FIG. 24 is a functional block diagram showing a processing operation of a data processing means in the data transmitting apparatus according to the third embodiment.

As shown in FIG. 24, the data processing program 201 read into the working RAM 173 comprises a decision means 202 for making various decisions, a record status table generating means 203 for generating a record status table representing record statuses of the user area UE, a request processing means 204 for effecting processing based on a request from the host computer 51, a disk unload requesting means 205 for making a request to unload the magnetooptical disk D from the external memory device 52 according to a disk unload request from the host computer 51, and an attribute data reading means 206 for receiving attribute data supplied from the system controller 166 through the interface 167 to the input port 175.

The record status table generating means 203 has a decision means 207 for making various decisions, a bit address calculating means 208 for calculating a bit (bit address) corresponding to a physical sector address read from the file allocation table FAT, in the string of bits making up the record status table, and a set bit processing means 209 for setting "1" in the bit corresponding to the bit address produced by the bit address calculating means 208, in the record status table.

The request processing means 204 comprises a decision means 210 for making various decisions, and various processing means 211 for effecting processing according to various requests from the host computer 51. The various processing means 211 include an initializing means 301 (see FIG. 29) for certifying (initializing) the magnetooptical disk D, a writing means 401 (see FIG. 32) for transferring compressed data stored in the compressed data storage area in the data RAM 174 or uncompressed data stored in the logic block data storage area in the data RAM 174 to the system controller 166, a reading means 501 (see FIG. 38) for reading physical blocks of data recorded in the user area UE (or the alternate area AE) of the magnetooptical disk D, and a data deleting means 601 (see FIG. 40) for deleting logic blocks of data recorded in the user area UE of the magnetooptical disk D.

According to the data processing program 201, the decision means 202 determines whether the disk cartridge is loaded or not based on a detected signal from a sensor which optically detects when the disk cartridge is inserted in the cartridge holder, in a step S403 shown in FIG. 25.

After the disk cartridge has been loaded and the magnetooptical disk D housed therein has been rotated at a CAV or CLV by the spindle motor 151, control proceeds to a step S404 in which the attribute data reading means 206 outputs an attribute data readout request to the system controller 166. The attribute data readout request includes parameters representing a starting physical sector address of attribute data recording areas and a readout sector size of the magnetooptical disk D.

Based on the attribute data readout request from the attribute data reading means 206 in the data processing apparatus 1, the system controller 166 actuates the optical pickup slide mechanism 155 to feed the optical pickup 152 to a position corresponding to the track 0 of the magnetooptical disk D. Then, the optical pickup 152 applies a laser beam L having a reproducing output power to the recording layer at the track 0, and optically reproduces attribute data recorded in the attribute data recording areas and outputs a reproduced signal representing the attribute data. The reproduced signal from the optical pickup 152 is converted by the demodulator 164 into reproduced data, which is supplied to the system controller 166. The reproduced data supplied to the system controller 166 is supplied through the interface 167 to the data processing apparatus 1.

The reproduced data supplied to the data processing apparatus 1 is stored into the attribute data storage area of the data RAM 174 through the input port 175 and the attribute data reading means 206. The process of reading the attribute data is completed with the above series of operation.

In a next step S405, the decision means 202 determines whether an error has occurred in the above process of reading the attribute data. If an error has occurred, then control goes back to the step S404 in which an attribute data readout request is outputted for reading attribute data recorded in the attribute data recording area at the track 9997 (the DDS sector #2, the PDL sector #2, and the SDL sector #2).

If an error has also occurred in this reading process, then an attribute data readout request is outputted for reading attribute data recorded in the attribute data recording area at the track 9998 (the DDS sector #3, the PDL sector #3, and the SDL sector #3).

If an error has occurred in the reading process for reading attribute data from all the attribute data recording areas, the magnetooptical disk D is regarded as being unusable, and message data representing that the magnetooptical disk D cannot be used is transferred to the host computer 51. The host computer 51 displays a message "DISK CANNOT BE USED" on a display unit such as a CRT, a liquid crystal display unit, or the like which is connected to the host computer 51, indicating to the operator that the magnetooptical disk D which is presently loaded cannot be used.

It is very rare for the reading process for reading attribute data from all the attribute data recording areas to suffer an error. Usually, the attribute data is read from the attribute data recording area at the track 0.

In a next step S406, the decision means 202 determines whether the presently loaded magnetooptical disk D has been initialized or not based on whether the data of the third byte in the attribute data stored in the attribute data storage area is "01" or "02". If the data of the third byte is "01" indicating that the presently loaded magnetooptical disk D has been initialized, control goes to a next step S407 in which control enters a record status table generating subroutine which is the record status table generating means 203.

Figure 26:
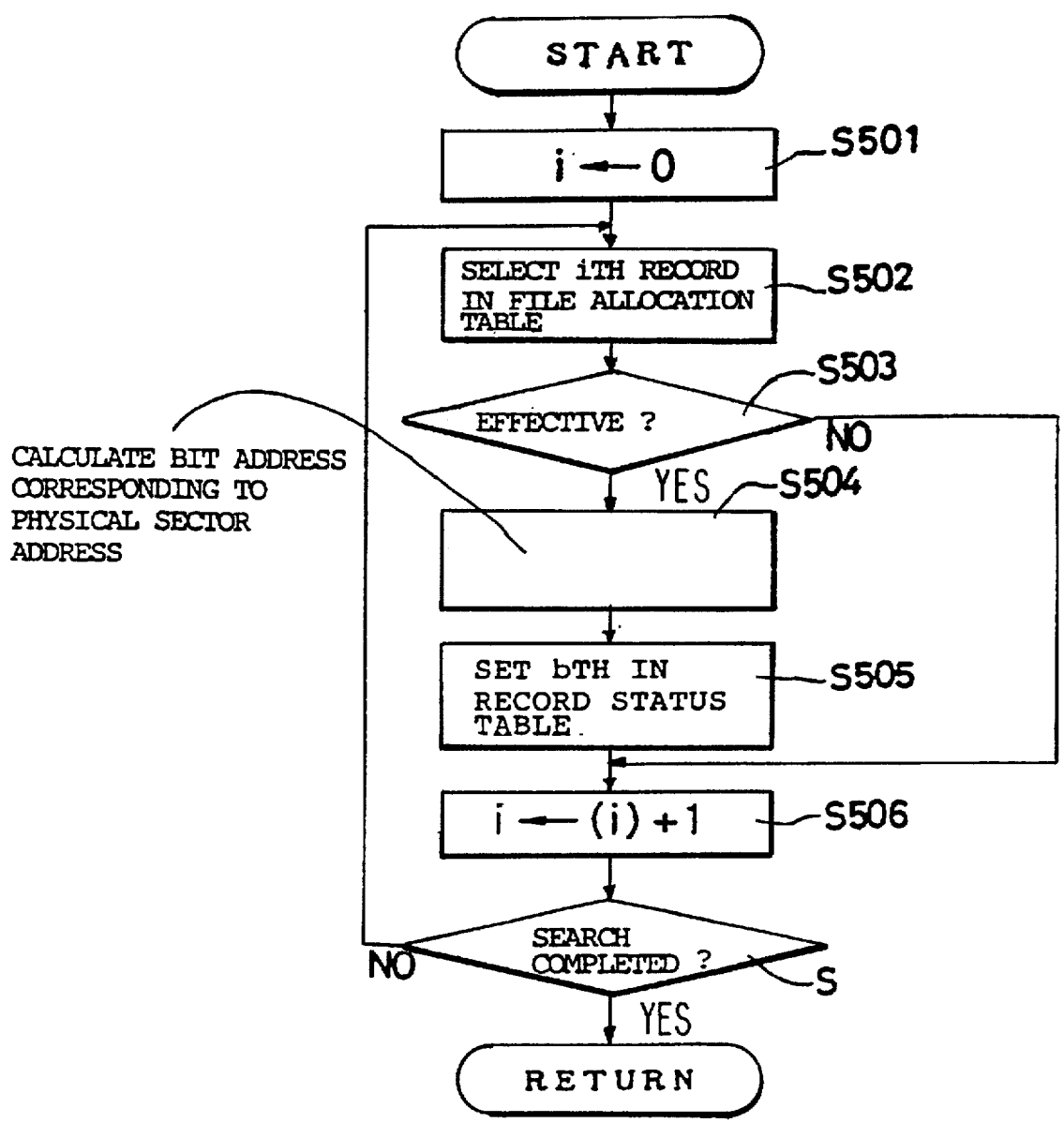
FIG. 26 is a flowchart of a processing operation of a record status table generating means of the data processing means in the data transmitting apparatus according to the third embodiment.

In this record status table generating subroutine, as shown in FIG. 26, the index register i is initialized, i.e., an initial value "0" is stored in the index register i, in a step S501.

In a next step S502, a record corresponding to the value of the index register i of the file allocation table FAT is selected among the attribute data stored in the attribute data storage area.

In a next step S503, the decision means 207 determines whether the selected record is effective or ineffective based on whether a starting physical sector address and a final physical sector address are stored respectively in the starting physical sector address storage area "c" and the final physical sector address storage area "d" of the selected record. If starting and final physical sector addresses are stored respectively in the starting and final physical sector address storage areas "c", "d", indicating that the record is effective, control proceeds to a next step S504 in which the bit address calculating means 208 calculates a bit (bit address) "b" corresponding to the physical sector address in the string of bits making up the record status table. The bit address "b" is calculated according to b=S/m where S is the physical sector address and m is the number of sectors of one physical block.

In a next step S505, the set bit processing means 209 sets a bit corresponding to the bit address "b" calculated by the bit address calculating means 208 in the string of bits making up the record status table, to "1". That is, bit setting processing is carried out.

In a next step S506, the content of the index register i is incremented by +1. If starting and final physical sector addresses are not present respectively in the starting and final physical sector address storage areas "c", "d", e.g., if "0" is stored in both the starting and final physical sector address storage areas "c", "d", indicating that the selected record is ineffective, in the step S503, then control goes from the step S503 directly to the step S506 in which the content of the index register i is incremented by +1.

In a next step S507, the decision means 207 determines whether the search process is finished or not based on whether the value of the index register i is the same as the final record number N of the file allocation table FAT or not. If the value of the index register i is smaller than the final record number N, then control returns to the step S502 in which a next record is selected in the file allocation table FAT.

When the value of the index register i becomes equal to the final record number N or greater, the record status table generating subroutine is finished. When the record status table generating subroutine is finished, all the bits corresponding to the physical sector addresses of the physical tracks registered in the file allocation table FAT have been set to "1". Neither compressed data nor uncompressed data are recorded in the physical sector addresses which corresponding to bits "0" in the string of bits making up the record status table.

The processing operation of the record status table generating subroutine will be described with reference to the specific contents of the file allocation table FAT shown in FIG. 23, for example. The physical sector addresses of the 0th, 1st, and 2nd records of the file allocation table FAT are 2000, 2050, 5000, respectively. In this example, since the number of sectors of one physical block is 50, the bit addresses corresponding to the respective physical sector addresses are 40th, 41st, and 100th bits, respectively. As a result, as shown in FIG. 27, "1" is set in the 40th, 41st, and 50th bits in the string of bits making up the record status table.

Referring back to the main routine shown in FIG. 25, if the presently loaded magnetooptical disk D has not been initialized, then control goes to a step S408 in which message data representing an initialization prompt is transferred to the host computer 51. The host computer 51 then displays a message "INITIALIZE DISK" on the display unit connected thereto, indicating to the operator that the presently loaded magnetooptical disk D has not been initialized. In this case, no record status table is generated.

A next step S409 waits for a request from the host computer 51. If there is a request from the host computer 51, then control proceeds to a step S410, entering a request processing subroutine which is the request processing means 204.

Figure 28:
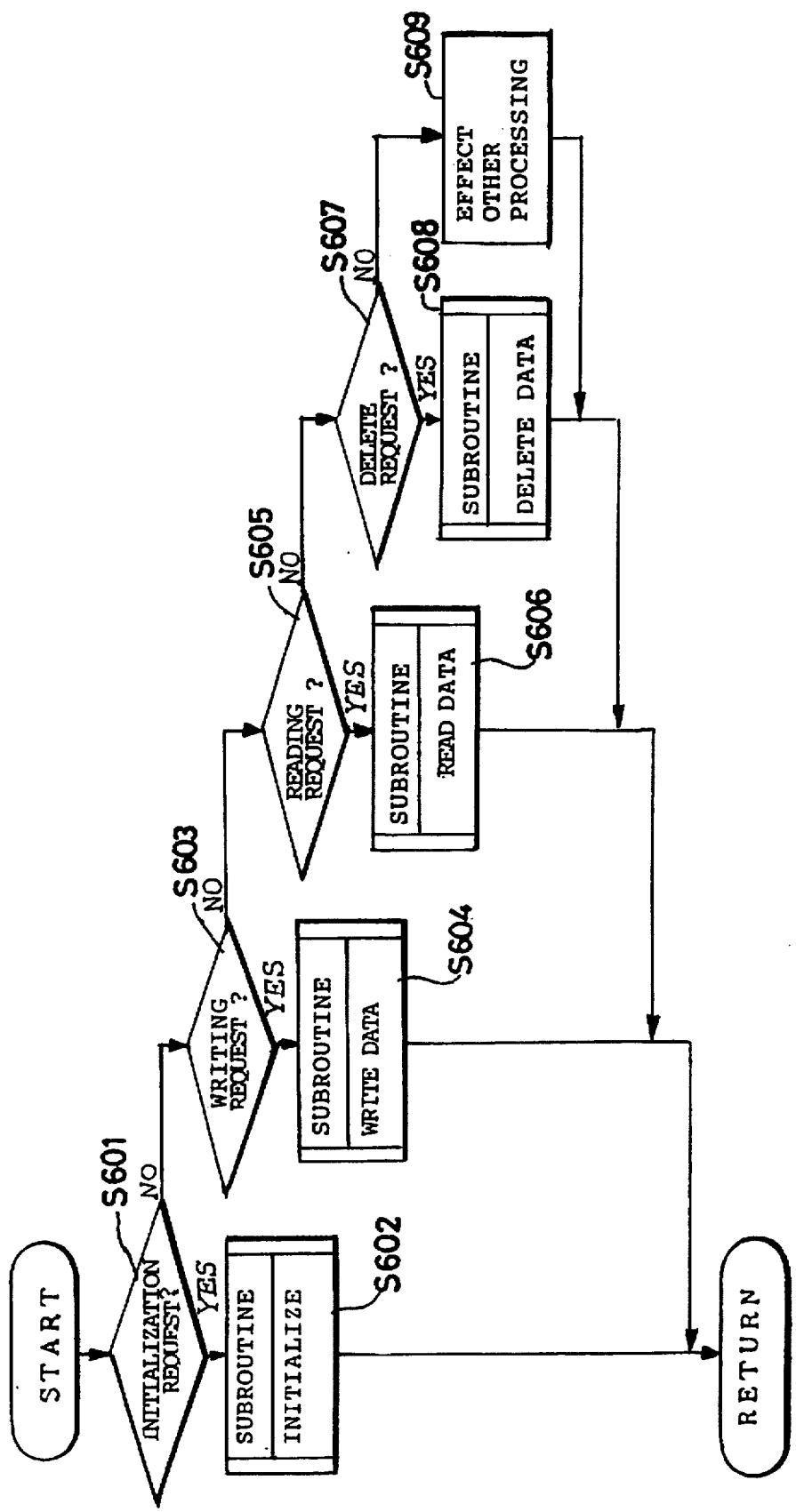
FIG. 28 is a flowchart of a processing operation of a request processing means of the data processing means in the data transmitting apparatus according to the third embodiment.

In the request processing subroutine which is shown in FIG. 28, the decision means 210 determines whether the request from the host computer 51 is an initialization request or not in a step S601. If the request from the host computer 51 is an initialization request, then control goes to a next step S602, operating the initializing means 301 (initializing subroutine) shown in FIG. 29.

Figure 29:
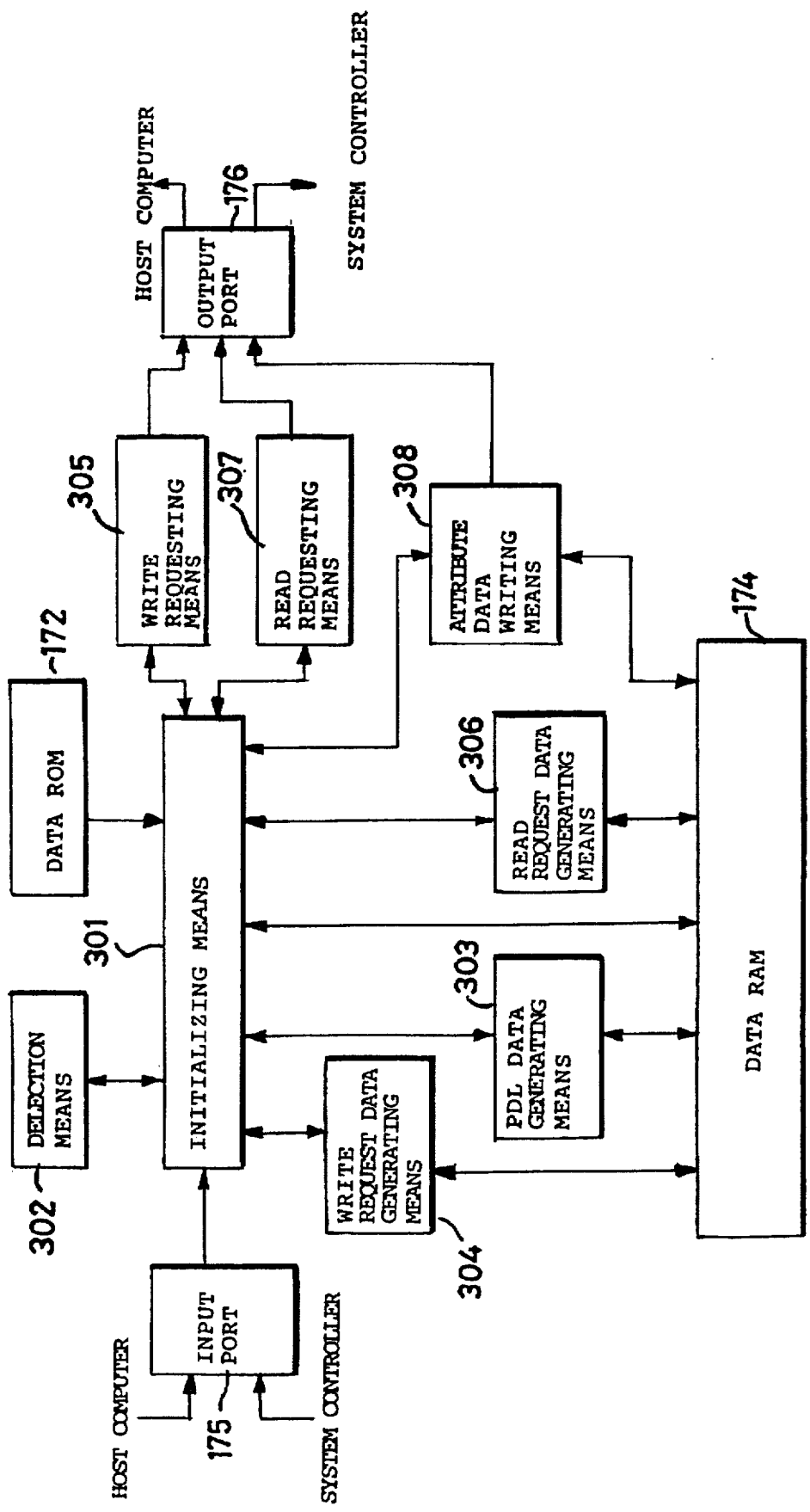
FIG. 29 is a functional block diagram showing a processing operation of an initializing means of the request processing means in the data transmitting apparatus according to the third embodiment.

As shown in FIG. 29, the initializing means 301 has a decision means 302 for making various decisions, a PDL data generating means 303 for generating a sector address reference table in the PDL sector #0 of the attribute data in order to use a sector in the alternate area AE instead of a sector suffering a readout error in the user area UE, a write request data generating means 304 for generating request data to record physical blocks of initializing data read from the data ROM 172 on the magnetooptical disk D, a write requesting means 305 for outputting write request data generated by the write request data generating means 304 to the system controller 166, a read request data generating means 306 for generating request data to read physical blocks of initializing data recorded on the magnetooptical disk D, a read requesting means 307 for outputting read request data generated by the read request data generating means 306 to the system controller 166, and an attribute data writing means 308 for outputting a request to record generated and updated attribute data in the attribute data recording areas in the tracks 0, 1, 9997, 9998 to the system controller 166. As described later on, the attribute data writing means 308 is associated with the writing means 401 and the data deleting means 601 as well as the initializing means 301.

Figure 30:
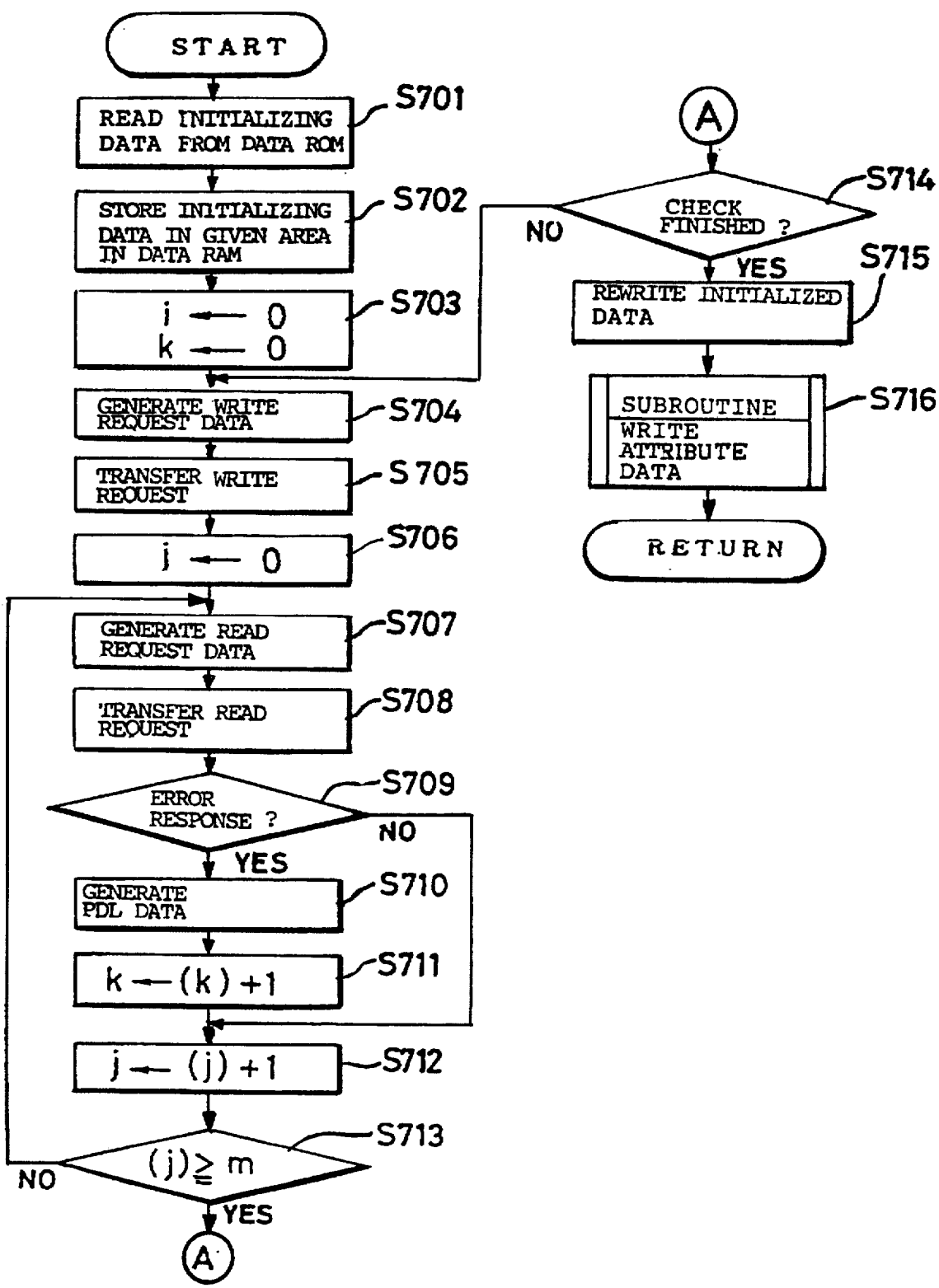
FIG. 30 is a flowchart of a processing operation of the initializing means of the request processing means in the data transmitting apparatus according to the third embodiment.

According to the initializing means 301, i.e., the initializing subroutine, as shown FIG. 30, initializing data (uncompressed data) of one physical block is read from the data ROM 172 in a step S701, and the read initializing data is stored into the initializing data storage area of the data RAM 174 in a step S702.

In a next step S703, the index register i and an index register k are initialized, i.e., an initial value "0" is stored in the index registers i, k.

In a next step S704, the write request data generating means 304 generates write request data to record initializing data on the magnetooptical disk D. Specifically, write request data is generated by adding write data (initializing data) to a header in which there are recorded an identification code indicative of a write request, a write starting sector address, and a write data length.

An absolute sector address is registered as the write starting sector address. Specifically, an absolute sector address which is produced by adding the number of starting sectors (3 tracks×the number (25) of sectors in a track=75 sectors) of the user area UE to a value which is the product of the value of the index register i and the number m of sectors of one physical block, is registered as the write starting sector address in the header. The number m of sectors of one physical block is also registered as the write data length in the header.

In a next step S705, the write request means 305 transfers the write request data through the interface 167 to the system controller 166.

Based on the write request data from the data processing apparatus 1, the system controller 166 removes the write starting sector address from the header of the write request data, and then actuates the optical pickup slide mechanism 155 to move the optical pickup 152 to a track position corresponding to the absolute sector address.

Thereafter, the system controller 166 outputs the supplied write data (initializing data) to the modulator 161. The system controller 166 adds an error-correcting code to the supplied write data, and converts the write data into a binary signal which is supplied to the magnetic field generator drive circuit 162. Depending on the supplied binary signal, the magnetic field generator drive circuit 162 changes the direction of an exciting current to a positive or negative direction, enabling the recording magnetic field generator 153 to generate a positive or negative external magnetic field depending on the binary signal. Upon detection of the corresponding starting address, the optical pickup 152 emits a laser beam L having a recording output power to a spot on the magnetooptical disk D thereby to magnetize the spot in a direction along the external magnetic field, thus recording the initializing data as magnetizing information over sectors corresponding to one physical block from the corresponding starting address.

In a next step S706, an index register j is initialized, i.e., an initial value "0" is stored in the index register j.

In a next step S707, the read request data generating means 306 generates read request data to read sectors of the initializing data which has been recorded on the magnetooptical disk D in the step S705. Specifically, read request data is generated in which there are recorded an identification code indicative of a read request, a read starting sector address, and a read data length. An absolute sector address is registered as the read starting sector address. Specifically, an absolute sector address which is produced by adding the number of starting sectors (3 tracks×the number (25) of sectors in a track=75 sectors) of the user area UE to the value of the index register j, is registered as the read starting sector address, and one physical sector is registered as the read data length.

In a next step S708, the read request means 307 transfers the read request data through the interface 167 to the system controller 166.

Based on the read request data from the data processing apparatus 1, the system controller 166 removes the read starting sector address from the read request data, and then actuates the optical pickup slide mechanism 155 to move the optical pickup 152 to a track position corresponding to the absolute sector address.

Thereafter, upon detection of the corresponding starting address, the optical pickup 152 emits a laser beam L having a reproducing output power to optically reproduce the initializing data recorded in the corresponding sector, and outputs a reproduced initializing data as a reproduced signal. The reproduced signal from the optical pickup 152 is converted by the demodulator 164 into reproduced data which is supplied to the system controller 166. The reproduced data supplied to the system controller 166 is supplied directly to the data processing apparatus 1 through the interface 167.

In the event of a readout failure of the optical pickup 152 for some reason, the system controller 166 outputs a readout error signal, instead of reproduced data, to the data processing apparatus 1.

In a next step S709, the decision means 302 determines whether a readout error signal has been inputted or not. If a readout error signal has been inputted, then control goes to a next step S710 in which PDL data is generated by the PDL data generating means 303.

The PDL data is data to be stored in the PDL sector #0, among the attribute data stored in the attribute data storage area. Specifically, the PDL sector #0 is an area for storing information of an error sector (defective sector) of the user area UE. In this example, the PDL sector #0 stores a reference table which stores a physical sector address suffering the readout error in the user area UE and the physical sector address of an alternate area into which data to be recorded in the physical sector address is retreated (recorded).

More specifically, the reference table is composed of an array of records each having a data storage capacity of 6 bytes. Each of the records has first 3 bytes storing a physical sector address suffering a readout error in the user area UE and next 3 bytes storing the physical sector address of an alternate area.

In the step S710, a physical address (=the value of the index register j×the number m of sectors of one physical block) suffering a readout error in the user area UE, and the physical sector address (=the value of the index register k) of an alternate area are stored in a record corresponding to the value of the index register k in the reference table.

In a next step S711, the index register k is incremented by +1. In a next step S712, the index register j is incremented by +1.

If it is determined in the step S709 that the initializing data is normally read, then no PDL data is generated, but control jumps to the step S712 in which the index register j is incremented by +1.

In a next step S713, the decision means 302 determines whether the reading of sectors of the initializing data of one physical block that has presently been recorded is completed or not based on whether the value of the index register j is at least the number m of sectors of one physical block. If the value of the index register j is smaller than the number m of sectors, then control goes back to the step S707 in which initializing data of a next sector is read.

If the reading of sectors of the initializing data of one physical block that has presently been recorded is completed, then control goes to a next step S714 in which the decision means 302 determines whether initializing data has been recorded in all the sectors of the user area UE or not based on whether the value of the index register i is at least the number M of physical blocks of the user area UE. If value of the index register i is smaller than the number M of physical blocks, then control returns to the step S704 in which initializing data is recorded in a next physical block, and sectors of the initializing data are read.

If value of the index register i is equal to or greater than the number M of physical blocks, then control proceeds to a step S715 in which data ("02") of the 3rd byte of the DDS sector #0 is replaced with 1-byte data indicating that the disk has been certified, i.e., "01", among the attribute data stored in the attribute data storage area.

Figure 31:
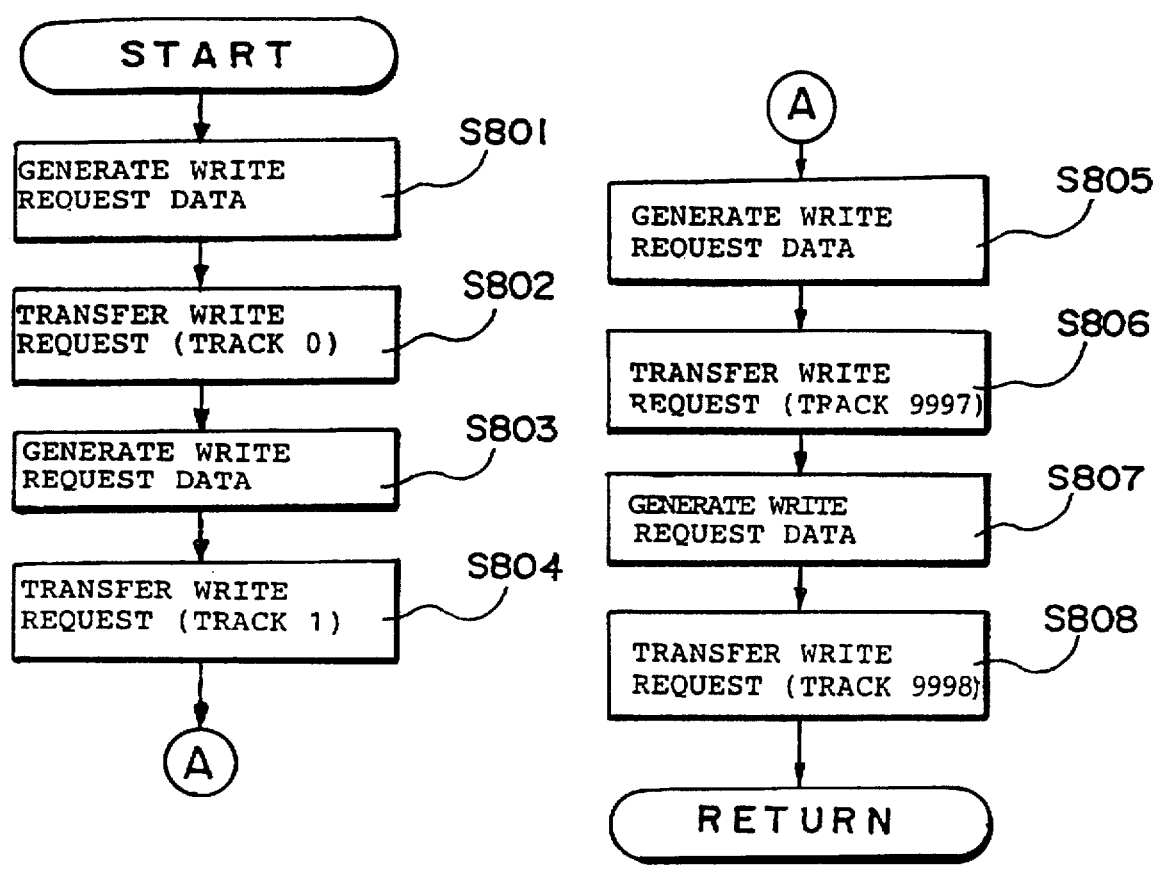
FIG. 31 is a flowchart of a processing operation of an attribute data writing means of the initializing means in the data transmitting apparatus according to the third embodiment.

In a next step S716, control enters an attribute data writing subroutine which is the attribute data writing means 308. According to the attribute data writing subroutine, as shown in FIG. 31, write request data for writing the attribute data stored in the attribute data storage area into the sectors 0~2 on the track 0 on the magnetooptical disk D is generated in a step S801. Specifically, the write request data is generated by adding 3 sectors of attribute data to a header in which there are registered an identification code indicative of a write request, a write starting sector address, and a write data length. In this case, 0 is registered as the write starting sector address in the header, and the number of sectors=3 is registered as the write data length in the header.

In a step S802, the write request data is transferred to the system controller 166 through the interface 167.

Based on the write request data from the data processing apparatus 1, the system controller 166 controls the servo controller 165 and various mechanisms, and enables the recording magnetic field generator 153 to record attribute data in the sectors 0~2 on the track 0 on the magnetooptical disk D.

In a next step S803, write request data for writing the attribute data stored in the attribute data storage area into the sectors 12~14 on the track 1 on the magnetooptical disk D is generated. Specifically, the write request data is generated by registering 12 as a write starting sector address and the number of sectors=3 as a write data length in a header, and further adding 3 sectors of attribute data.

In a step S804, the write request data is transferred to the system controller 166 through the interface 167.

Based on the write request data from the data processing apparatus 1, the system controller 166 controls the servo controller 165 and various mechanisms, and enables the recording magnetic field generator 153 to record attribute data in the sectors 12~14 on the track 1 on the magnetooptical disk D.

Then, in a step S805, write request data for writing the attribute data stored in the attribute data storage area into the sectors 0~2 on the track 9997 on the magnetooptical disk D is generated. Specifically, the write request data is generated by registering 9997×25=249925 as a write starting sector address and the number of sectors =3 as a write data length in a header, and further adding 3 sectors of attribute data.

In a step S806, the write request data is transferred to the system controller 166 through the interface 167.

Based on the write request data from the data processing apparatus 1, the system controller 166 controls the servo controller 165 and various mechanisms, and enables the recording magnetic field generator 153 to record attribute data in the sectors 0~2 on the track 9997 on the magnetooptical disk D.

Then, in a step S807, write request data for writing the attribute data stored in the attribute data storage area into the sectors 12~14 on the track 9998 on the magnetooptical disk D is generated. Specifically, the write request data is generated by registering 9998×25=249962 as a write starting sector address and the number of sectors=3 as a write data length in a header, and further adding 3 sectors of attribute data.

In a step S808, the write request data is transferred to the system controller 166 through the interface 167.

Based on the write request data from the data processing apparatus 1, the system controller 166 controls the servo controller 165 and various mechanisms, and enables the recording magnetic field generator 153 to record attribute data in the sectors 12~14 on the track 9998 on the magnetooptical disk D.

The attribute data writing subroutine is now finished, whereupon the main routine thereof, i.e., the initializing subroutine, is also finished.

If the request from the host computer 51 is not an initialization request in the step S610 of the request processing subroutine shown in FIG. 28, then control goes to a next step S603 in which the decision means 210 determines whether the request from the host computer 51 is a writing request or not.

Figure 32:
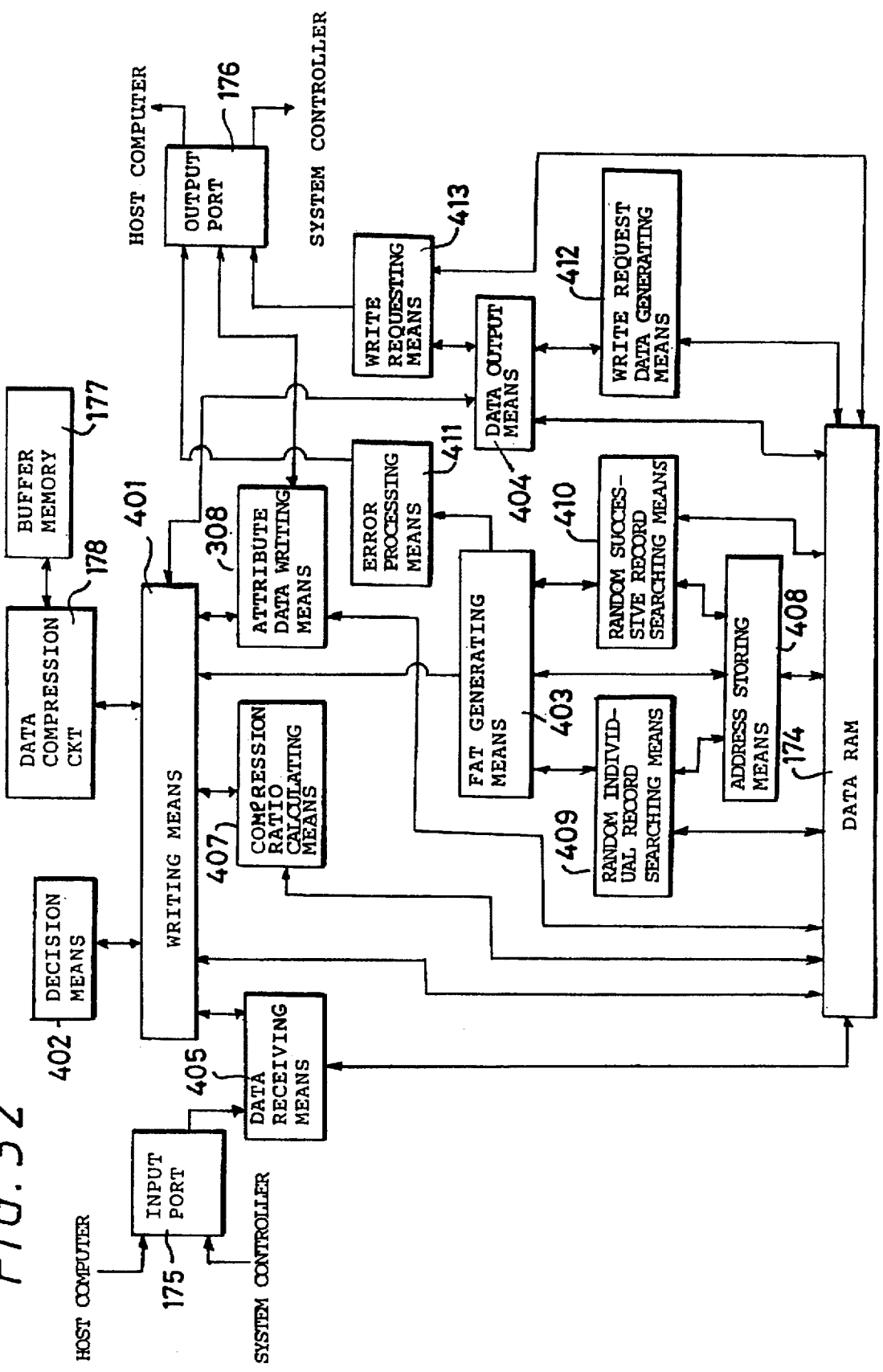
FIG. 32 is a functional block diagram showing a processing operation of a writing means of the request processing means in the data transmitting apparatus according to the third embodiment.

If the request from the host computer 51 is a writing request, then control goes to a step S604, operating the initializing writing means 401 or executing a writing subroutine shown in FIG. 32.

As shown in FIG. 32, the initializing writing 401 has, in addition to the attribute data writing means 308, a decision means 402 for making various decisions, an FAT generating means 403 for generating and updating a file allocation table FAT, a data output means 404 for outputting a request to record compressed data or uncompressed data into a corresponding physical block in the user area UE on the magnetooptical disk D to the system controller 166, a data receiving means 405 for receiving write request data supplied from the host computer 51 through the interface 168 to the input port 175, and storing the write request data into a predetermined storage area of the data RAM 174, a compressed data storing means 406 for reading compressed data outputted from the data compression circuit 178, and storing the compressed data into the compressed data storage area of the data RAM 174, and a compression ratio calculating means 407 for calculating an actual compression ratio based on the data length of the pre-compression data and the data length of the compressed data.

The FAT generating means 403 has an address storing means 408 for storing address information such as a physical sector address corresponding to a logic sector address into the corresponding record of the file allocation table FAT stored in the attribute data storage area, a random individual record searching means 409 for searching for bit information on the record status table for randomly recording compressed data or uncompressed data in units of one physical block, a random successive record searching means error in the event that there is no area available for recording compressed data or uncompressed data.

The data output means 404 has a write request data generating means 412 for generating write request data to record physical blocks of compressed data or uncompressed data on the magnetooptical disk D, and a write requesting means 413 for outputting write request data generated by the write request data generating means 412 to the system controller 166.

Figure 33:
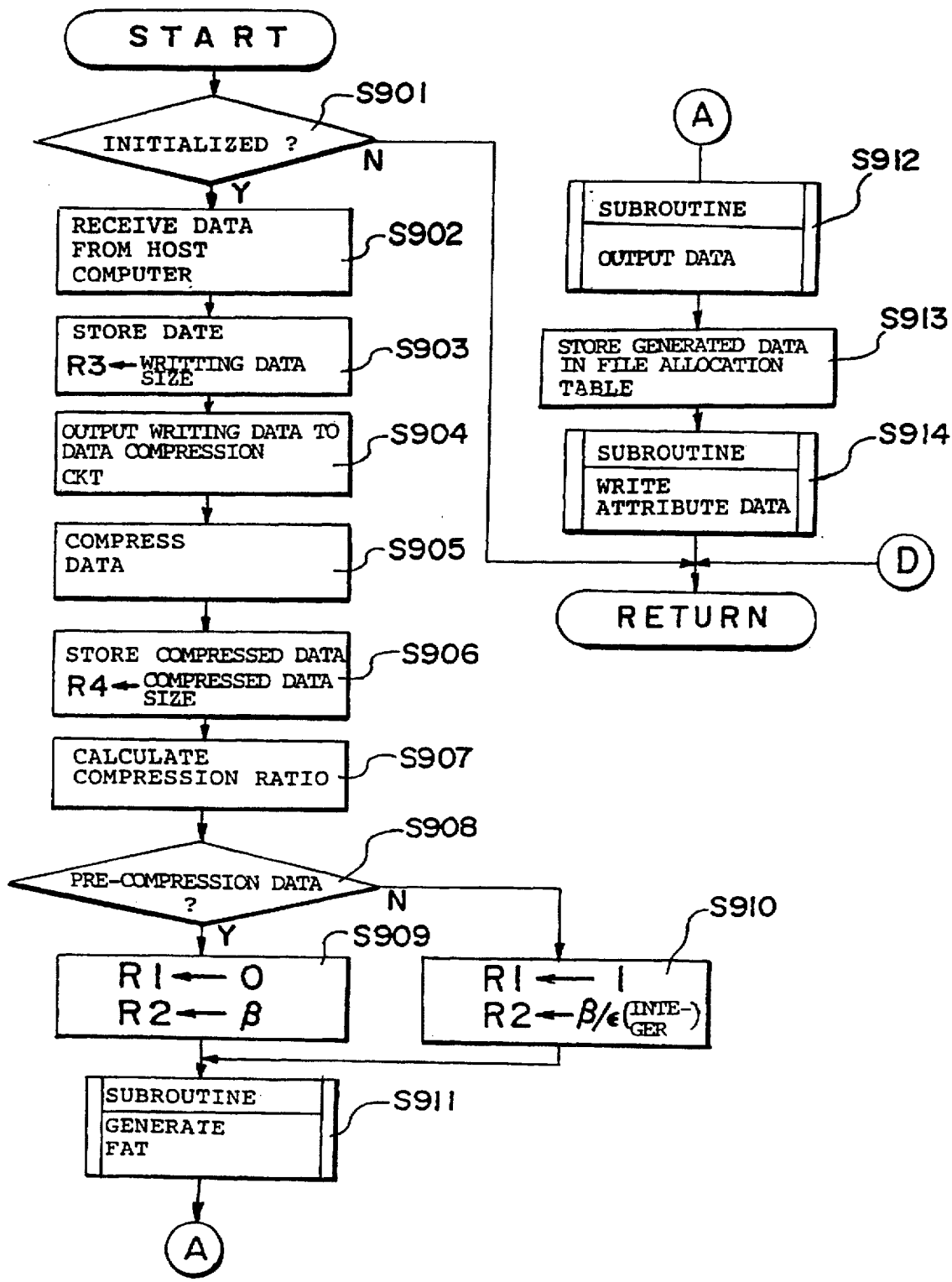
FIG. 33 is a flowchart of a processing operation of the writing means of the request processing means in the data transmitting apparatus according to the third embodiment.

According to the writing means 401, i.e., the writing subroutine, as shown in FIG. 33, the decision means 402 determines, in a step S901, whether the magnetooptical disk D loaded in the external memory device 52 has been initialized or not based on whether the 1-byte data of the third byte in the attribute data stored in the attribute data storage area is "01" or not.

If the 1-byte data is "01" indicating that the magnetooptical disk D has been initialized, control goes to a next step S902 in which the data receiving means 405 receives write request data supplied from the host computer 51 through the input port 51. The write request data is composed of a header including an identification code indicative of a write request, a write starting sector address (starting logic sector address), and a write data length (100 sectors in this example), and one logic block (100 sectors) of write data.

In a next step S903, the received write request data is then stored into the logic block data storage area allotted to the data RAM 174, and data relative to the data length of the write data contained in the header is stored into the third register R3.

In a next step S904, one logic block (100 sectors) of write data among the write request data stored in the logic block data storage area is outputted to the data compression circuit 178. The data compression circuit 178 compresses the supplied write data in a loss-less manner, i.e., produces loss-less compressed data using the buffer memory 177, in a step S905.

In a next step S906, the compressed data storage means 406 reads the compressed data outputted from the data compression circuit 178, and stores the compressed data into the compressed data storage area of the data RAM 174. At this time, the number of bytes, for example, from the start of the compressed data to the end of the compressed data is counted, and the counted number is stored as the data length of the compressed data in the fourth register R4.

In a next step S907, the compression ratio calculating means 407 calculates an actual compression ratio $\epsilon$ based on the data length of the write data and the data length of the compressed data. Specifically, the actual compression ratio $\epsilon$ is calculated by dividing the data length of the write data stored in the third register R3 by the data length of the compressed data stored in the fourth register R4. The quotient is stored as the actual compression ratio $\epsilon$ in a fifth register R5.

In a next step S908, the decision means 402 determines whether the data transferred from the host computer 51 is used as it is or the compressed data is used, based on whether the actual compression ratio $\epsilon$ stored in the fifth register R5 is in the range of $0<\epsilon<\beta(\beta-1)$ or not where $\beta$ is the expected compression ratio. This is because if the actual compression ratio $\epsilon$ is in the range of $0<\epsilon<\beta(\beta-1)$, then the data length of the compressed data, particularly the data length determined by the number of physical blocks, is substantially the same as or greater than the data length determined by one logic block. In this case, the write data (uncompressed data) from the host computer 51, rather than the compressed data, is recorded on the magnetooptical disk D.

If the actual compression ratio C is in the range of $0<\epsilon<\beta(\beta-1)$ in the step S908, then control proceeds to a next step S909 in which parameters for the uncompressing process. Specifically, "0" indicating the uncompressing process is stored into the first register R1, and the expected compression ratio $\beta$ is stored into the second register R2.

If the actual compression ratio $\epsilon$ is equal to or greater than $\beta/(\beta-1)$ in the step S908, then control goes to a step S910 in which parameters for the compressing process. Specifically, "1" indicating the compressing process is stored into the first register R1, and the value ($\beta/\epsilon$) produced by dividing the expected compression ratio $\beta$ by the actual compression ratio $\epsilon$ is stored into the second register R2.

Control then proceeds to a step S911, entering a FAT generating subroutine which is the FAT generating means 403. According to the FAT generating subroutine shown in FIG. 34, a table data storage area for generating a present file allocation table is kept in the data RAM 174 in a step SA01.

In a next step SA02, the index register j and an index register p are initialized, i.e., an initial value "0" is stored in the index registers j, p.

In a next step SA03, control enters a random successive searching routine which is the random successive record searching means 410. In this random successive searching routine, data of a string of bits (hereinafter referred to as "bit string data") having a starting bit as the value of the index register j in the record status table and indicated by the value in the second register R2 is read in the step SA03.

A next step SA04 determines whether the content of the bit string data is 0 or not. If the content of the bit string data is not 0, i.e., if there is no area available for recording data which is a compressed logic block of data from the host computer 51 or write data which is not compressed, then control goes to a step SA05 in which control enters a random individual record searching routine which is the random individual record searching means 409. In this random individual record searching routine, the step SA05 determines the 0th bit of the bit string data is 0 or not.

If the 0th bit of the bit string data is "0", then it is equivalent to a condition in which data of one physical block can be recorded in a physical sector address corresponding to the 0th bit of the bit string data. Therefore, the presently searched bit address, i.e., the value of the index register j, is stored into a record corresponding to the value of the index register p in the bit address storage area kept in the data RAM 174 in a step SA06.

In a next step SA07, the value of the index register p is incremented by +1, and in a next step SA08, the value of the index register j is incremented by +1.

If the 0th bit of the bit string data is "1" in the step SA05, no searched bit address is stored into the bit address storage area, but control goes directly to the step SA08 in which the value of the index register j is incremented by +1.

In a next step SA09, the decision means 402 determines whether the searching process is finished or not based on whether the value of the index register j is at least the number B of final bits to be searched, i.e., a value produced by subtracting the value, less 1, of the second register R2 from the number of final bits in the record status table.

If the value of the index register j is at least the number B of final bits to be searched, then control returns to the step SA03, and the decision process with respect to next bit string data is carried out in the step SA03 and following steps.

The decision process is continued with respect to the bit string data while it is updated 1 bit each time. If any bit string data whose content is 0 is not found, then control goes to a step SA10 shown in FIG. 35.

In the step SA10, it is determined whether the bit address stored in the bit address storage area is stored for as many physical blocks as necessary to record present compressed data or uncompressed data, based on whether the value of the index register p is at least the value of the second register R2.

If value of the index register p is equal to or greater than the value of the second register R2, then the bit address stored in the bit address storage area is determined as being stored for as many physical blocks as necessary to record present compressed data or uncompressed data. Control then goes to a step SA11 in which the index register k is initialized, i.e., an initial value "0" is stored into the index register k.

In a next step SA12, the bit address stored in a record corresponding to the value of index register k of the bit address storage area is stored into the index register j.

In a next step SA13, control enters an address storing subroutine which is the address storing means 408. According to the address storing subroutine shown in FIG. 36, a bit corresponding to the value (bit address) of the index register j in the bit string of the record status table is set to "1". That is, bit setting processing is carried out.

In a step SB02, a physical sector address is calculated on the basis of the value (bit address) of the index register j. The physical sector address can be determined by multiplying the bit address j by the number m of sectors of one physical block.

A next step SB03 determines whether the present value of the index register k is 0 or not, i.e., whether various data to be recorded in the table data storage area are to be stored into the area of its 0th record. If the value of the index register k is 0, then control proceeds to a step SB04 in which data of the 0th record to be stored in the table data storage area is generated.

Specifically, the starting logic sector address contained in the write request data from the host computer 51 is read and stored into a starting 3-byte area, i.e., the starting logic sector address storage area "a", of the 0th record, and the sum of the starting logic sector address and the number, e.g., 100, of sectors of one logic block is stored as the final logic sector address into a next 3-byte area, i.e., the final logic sector address storage area "b".

The physical sector address determined in the step SB02 is stored into a next 3-byte area, i.e., the starting physical sector address storage area "c", and the sum of the physical sector address and the number m, e.g., 50, of sectors of one physical block is stored as the final physical sector address into a next 3-byte area, i.e., the final physical sector address storage area "d". Then, the address storing subroutine is finished.

If the value of the index register k is not 0 in the step SB03, then control proceeds to a step SB05 in which data of the 1st record and following records to be stored in the table data storage area is generated. Specifically, "0" is stored into a starting 3-byte area, i.e., the starting logic sector address storage area "a", of the 0th record in the table data storage area, and "0" is stored as into a next 3-byte area, i.e., the final logic sector address storage area "b".

The physical sector address determined in the step SB02 is stored into a next 3-byte area, i.e., the starting physical sector address storage area "c", and the sum of the physical sector address and the number m, e.g., 50, of sectors of one physical block is stored as the final physical sector address into a next 3-byte area, i.e., the final physical sector address storage area "d". Furthermore, the physical sector address is stored into the link address storage area "e" of the record preceding this record, i.e., of the (k−1)th record. Then, the address storing subroutine is finished.

Figure 35:
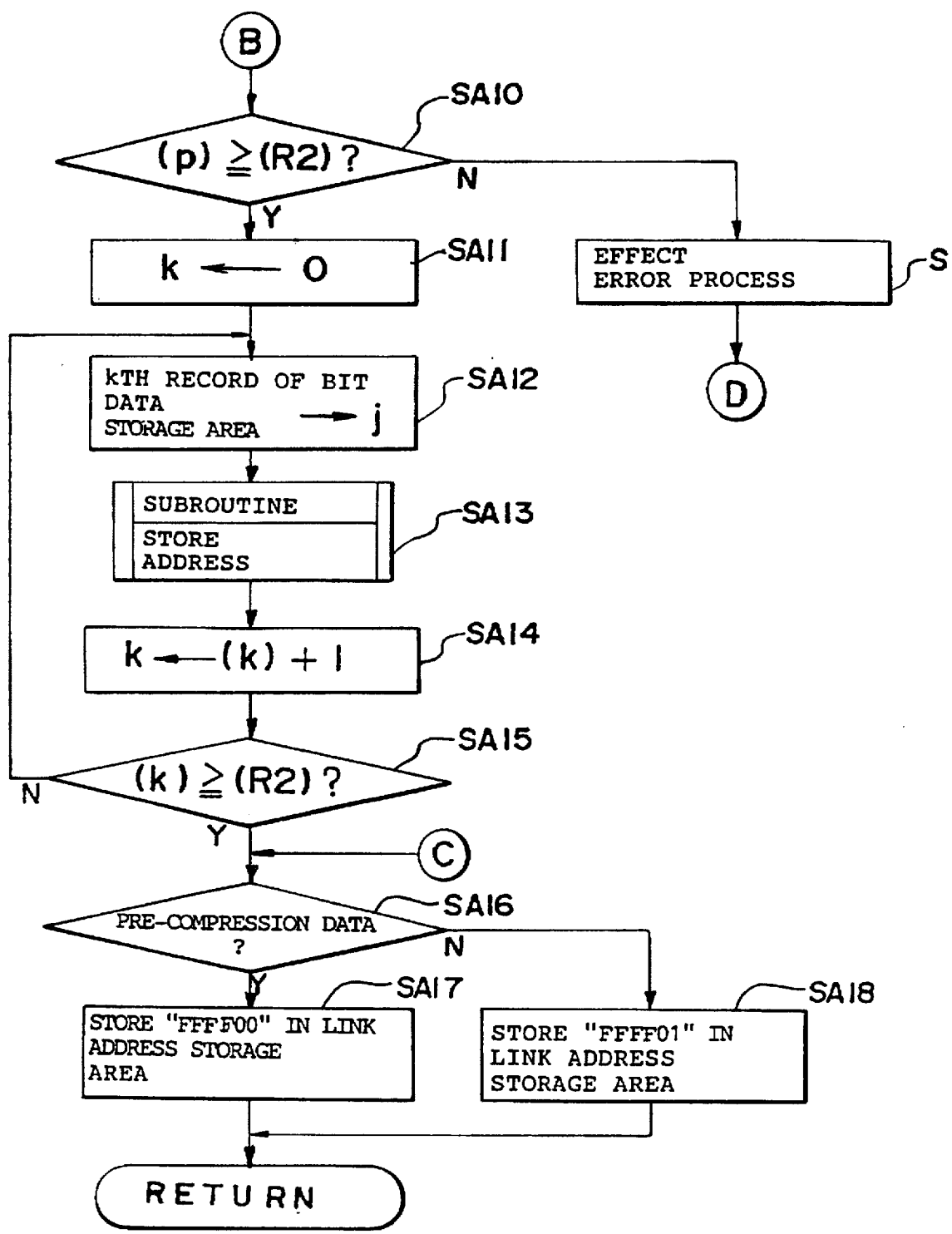
FIG. 35 is a flowchart (2) of the processing operation of the FAT generating means of the writing means in the data transmitting apparatus according to the third embodiment.
Figure 36:
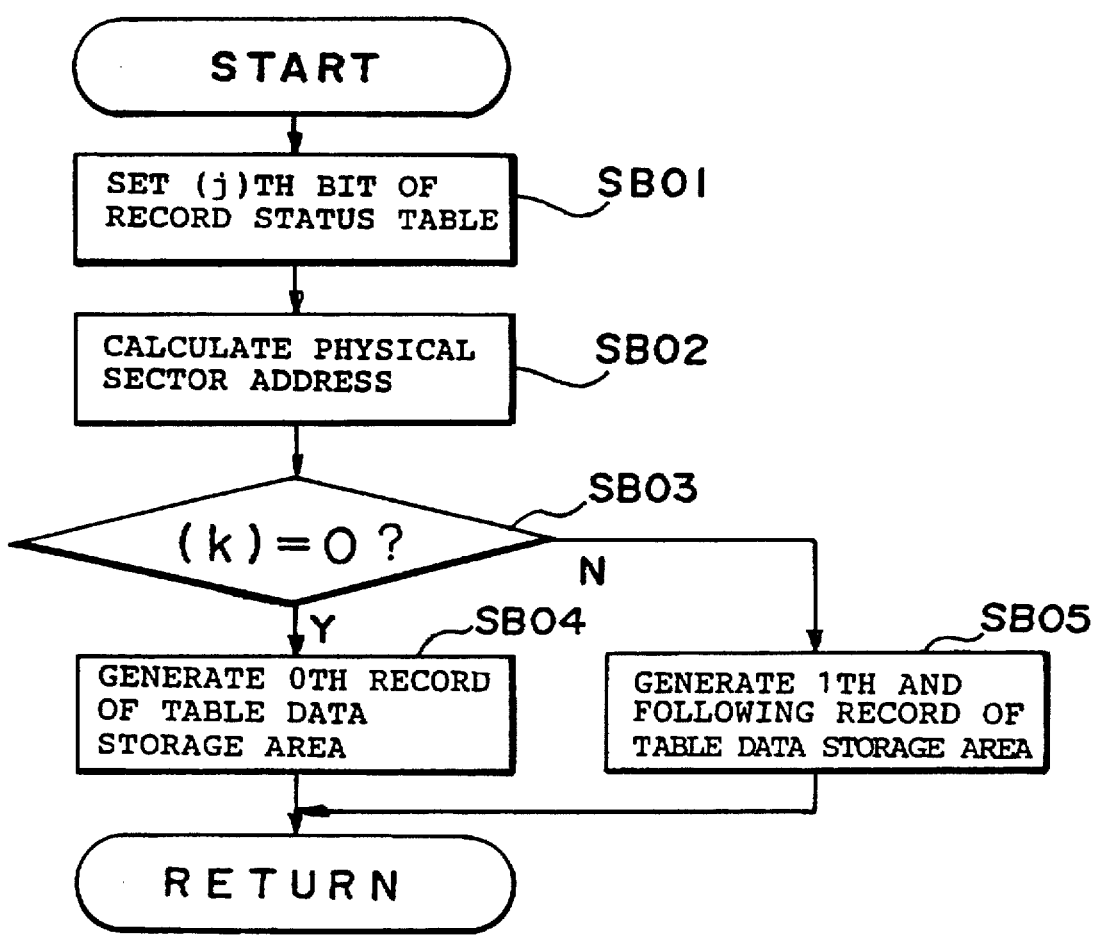
FIG. 36 is a flowchart of a processing operation of an address storing means of the FAT generating means in the data transmitting apparatus according to the third embodiment.
Figure 37:
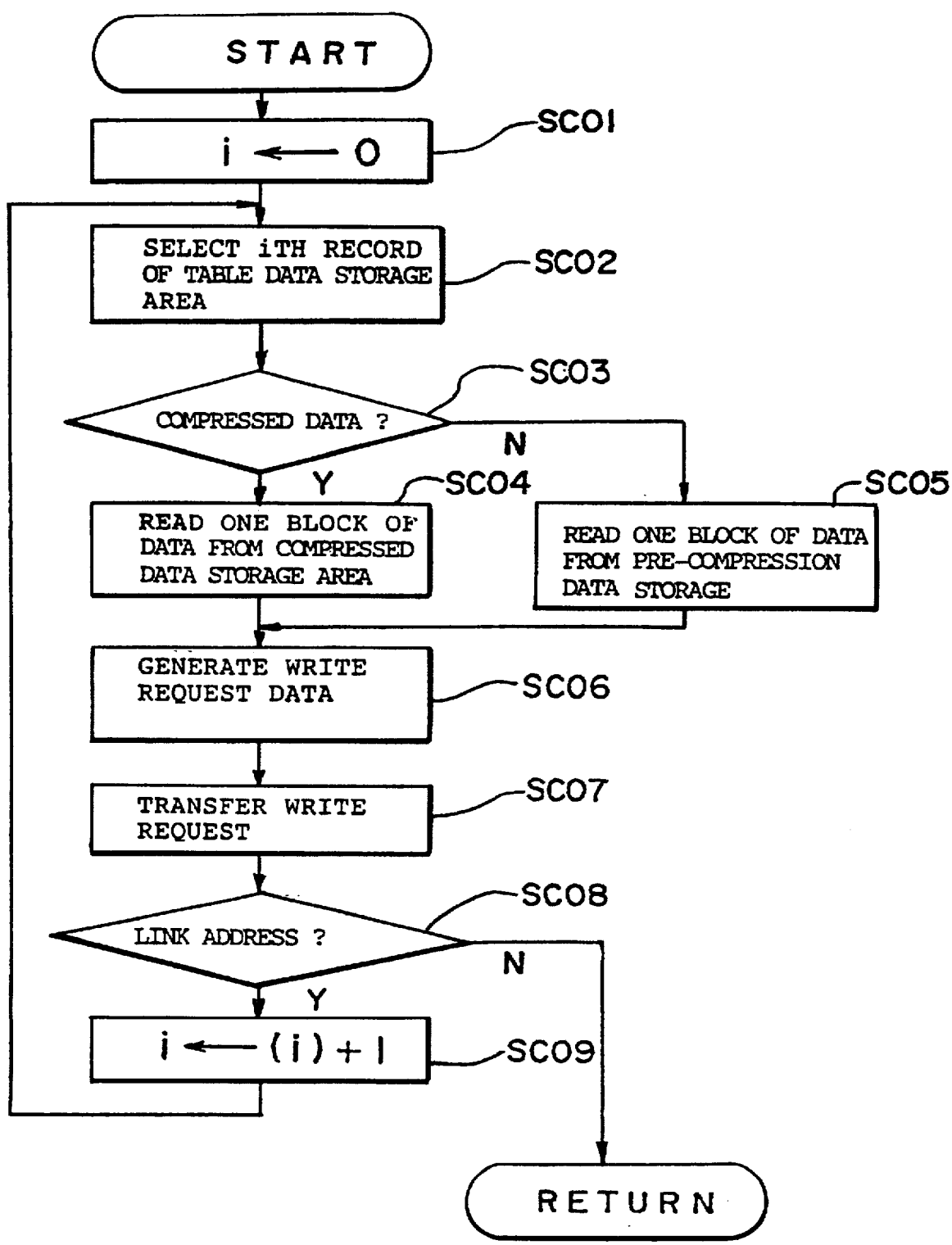
FIG. 37 is a flowchart of a processing operation of a data output means of the writing means in the data transmitting apparatus according to the third embodiment.

Control now goes back to the FAT generating subroutine (2) shown in FIG. 35. The value of the index register k is incremented by +1 in a step SA14.

In a next step SA15, it is determined whether the value of the index register k is at least the value of the second register R2. If the value of the index register k is smaller than the value of the second register R2, then control goes back to the step SA12 in which given data is stored into the table data storage area based on the bit address stored in the next record in the bit address storage area.

At the time the value of the index register k becomes equal to or greater than the value of the second register R2 in the step SA15, the random individual record searching routine executed by the random individual record searching means 409 is finished. Thereafter, control proceeds to a step SA16. In the step SA16, the decision means 401 determines whether the data to be recorded on the magnetooptical disk D is uncompressed data or not based on whether the value of the first register R1 is "0" or not.

If the value of the first register R1 is "0", then control goes to a step SA17 in which 3-byte data "FFFF00" is stored into the link address storage area "e" of the final record in the table data storage area generated in the above address storing routine. If the value of the first register R1 is "1" and the data to be recorded on the magnetooptical disk D is compressed data, then control goes to a step SA18 in which 3-byte data "FFFF01" is stored into the link address storage area "e" of the final record in the table data storage area generated in the above address storing routine. Now, the FAT generating subroutine is finished.

Figure 34:
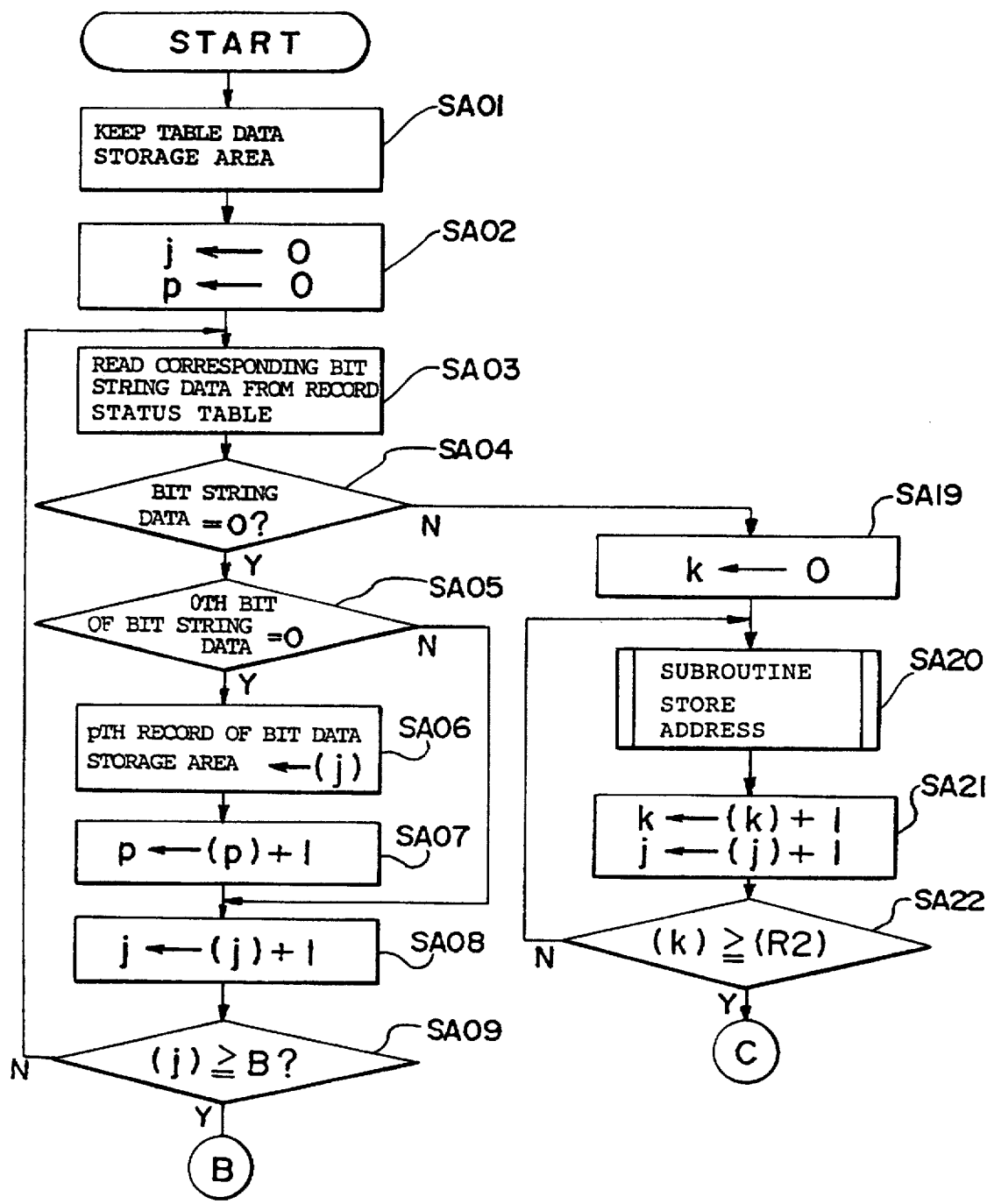
FIG. 34 is a flowchart (1) of a processing operation of an FAT (file allocation table) generating means of the writing means in the data transmitting apparatus according to the third embodiment.

If the content of the bit string data is 0, i.e., if there is one area or successive areas available for recording data which is a compressed logic block of data from the host computer 51 or write data which is not compressed, in the step SA04 shown in FIG. 34, then control goes to a step SA19 in which the index register k is initialized, i.e., an initial value "0" is stored into the index register k, while maintaining the random successive record searching routine which is executed by the random successive record searching means 410.

Then, in a next step SA20, control enters an address storing subroutine. Since this address storing subroutine is the same as the address storing subroutine shown in FIG. 36, details of the address storing subroutine will not be described below except that a given address such as a physical sector address or the like which corresponds to the value (bit address) of the index register j is stored into a record corresponding to the value of the index register k in the table data storage area.

In a next step SA21, the values of the index registers j, k are incremented by +1.

In a next step SA22, it is determined whether the value of the index register k is at least the value of the second register R2. If the value of the index register k is smaller than the value of the second register R2, then control returns to the step SA20, and the step SA20 and following steps are executed to store a given address such as a physical sector address or the like relative to a next bit into a record corresponding to the value of the index register k in the table data storage area.

If the value of the index register k is equal to or greater than the value of the second register R2 in the step SA22, then the random successive record searching routine which is executed by the random successive record searching means 410 is finished, and control goes to the step SA16 shown in FIG. 35. The step SA16 and following steps are executed until the subroutine shown in FIG. 35 is finished.

If the value of the index register p is smaller than the value of the second register R2 in the step SA10, then it is determined that the bit address stored in the bit address storage area is not stored for as many physical blocks as necessary to record present compressed data or uncompressed data, i.e., the magnetooptical disk D has no area available for recording write data sent from the host computer 51. Control then goes to a step SA23 in which the error processing means 411 effects an error process, and forcibly ends the writing subroutine shown in FIG. 33.

The error process may specifically be carried out by transferring message data for indicating that no data can be recorded to the operator to the host computer 51, and displaying a message "CANNOT BE RECORDED" to the display unit connected to the host computer 51, thereby indicating to the operator that new data cannot be recorded on the presently loaded magnetooptical disk D.

Referring back to the writing subroutine shown in FIG. 33, control enters a data output subroutine which is the data output means 404 in a step S912. According to the data output subroutine shown in FIG. 37, the index register i is initialized, i.e., an initial value "0" is stored in the index register i, in a step SC02.

Then, in a next step SC02, an ith record is selected in the table data storage area. In a next step SC03, the decision means 402 determines whether the data to be recorded on the magnetooptical disk D is compressed data or not based on whether the value of the first register R1 is "1" or not.

If the value of the first register R1 is "1", then control goes to a step SC04 in which compressed data of one physical block (m sectors) is read from the compressed data storage area. If the value of the first register R1 is "0", then control goes to a step SC05 in which write data (uncompressed data) of one physical block (m sectors) is read from the logic block data storage area.

In a next step SC06, the write request data generating means 412 generates write request data to record compressed data or uncompressed data on the magnetooptical disk D. Specifically, write request data is generated by adding compressed data or uncompressed data of one physical block to a header in which there are registered an identification code indicative of a write request, a write starting sector address, and a write data length.

An absolute sector address is registered as the write starting sector address. Specifically, an absolute sector address which is produced by adding the number of starting sectors (3 tracks×the number (25) of sectors in a track=75 sectors) of the user area UE to a physical sector address which is stored in the starting physical sector address storage area "c", of the ith record selected in the step SC02, is registered as the write starting sector address in the header. The number m of sectors of one physical block is also registered as the write data length in the header.

In a next step SC07, the write request means 413 transfers the write request data through the interface 167 to the system controller 166.

Based on the write request data from the data processing apparatus 1, the system controller 166 controls the servo controller 165 and various mechanisms, and enables the recording magnetic field generator 153 to record compressed data or uncompressed data of one physical block (m sectors) from an address indicated by the write starting sector address contained in the write request data on the magnetooptical disk D.

In a next step SC08, the decision means 402 determines whether a link address exists or not based on whether there is a link address in the link address storage area "e" of the ith record selected in the step SC02. If there is a link address, then control proceeds to a step SC09 in which the value of the index register i is incremented by +1. Thereafter, control returns to the step SC02 in which a next record in the table data storage area is selected. Then, compressed data or uncompressed data of one physical block from the absolute sector address (write starting sector address) of the physical sector address stored in the starting physical sector address storage area "c" of the selected record is recorded on the magnetooptical disk D.

The above process is repeatedly carried out until it is determined in the step SC08 that there is no link address in the link address storage area "e" of the selected record. When it is determined that there is no link address, the data output subroutine is brought to an end.

Referring back to the writing subroutine shown in FIG. 33, various data stored in the table data storage area are stored into empty records in the file allocation table FAT among the attribute data stored in the attribute data storage area of the data RAM 174.

In a next step S914, control enters an attribute data writing subroutine which is the attribute data writing means 308. Since this attribute data writing subroutine is the same as the attribute data writing subroutine shown in FIG. 31, details of the attribute data writing subroutine will not be described below except that updated attribute data of 3 sectors stored in the attribute data storage area of the data RAM 174 is recorded in the sectors 0~2 of the track 0, the sectors 12~14 of the track 1, the sectors 0~2 of the track 9997, and the sectors 12~14 of the track 9998 on the magnetooptical disk D.

When the attribute data writing subroutine is finished, the writing subroutine is also finished.

If the presently loaded magnetooptical disk D has not been initialized in the step S901, then message data representing an initialization prompt is transferred to the host computer 51. The host computer 51 then displays a message "INITIALIZE DISK" on the display unit connected thereto, indicating to the operator that the presently loaded magnetooptical disk D has not been initialized.

If the request from the host computer 51 is not a writing request in the step S603 shown in FIG. 28, then control goes to a step S605 in which the decision means 210 determines whether the request from the host computer 51 is a reading request or not.

If the request from the host computer 51 is a reading request, then control goes to a step S606, entering a reading subroutine which is the reading means 501.

Figure 38:
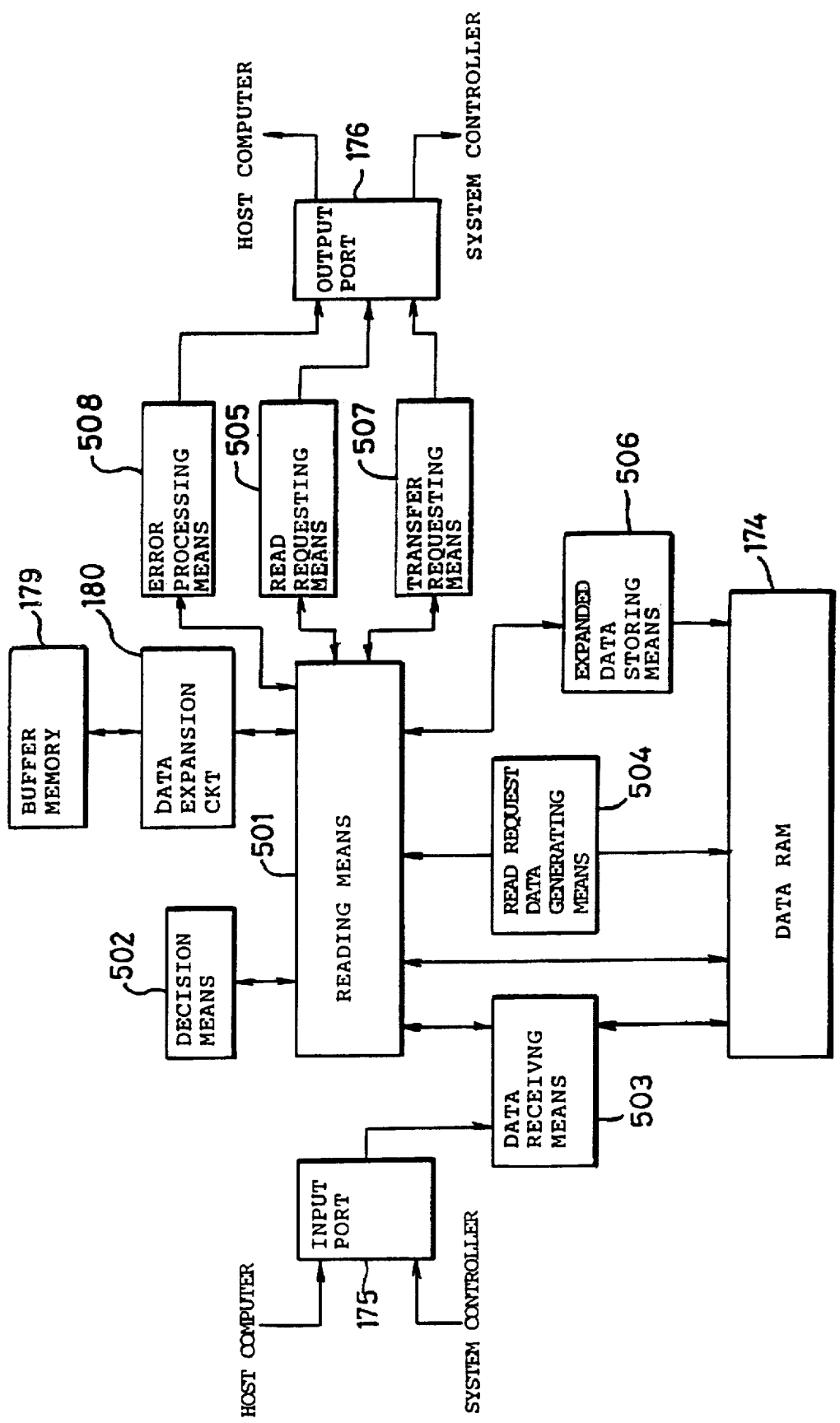
FIG. 38 is a functional block diagram showing a processing operation of a reading means of the request processing means in the data transmitting apparatus according to the third embodiment.

As shown in FIG. 38, the reading means 501 has a decision means 502 for making various decisions, a data receiving means 503 for receiving read request data supplied from the host computer 51 through the interface 168 to the input port 175, a read request data generating means 504 for generating request data to read physical blocks of compressed or uncompressed data from a physical sector address corresponding to a logic sector address from the host computer 51, on the magnetooptical disk D, a read requesting means 505 for outputting read request data generated by the read request data generating means 504 to the system controller 166, an expanded data storing means 506 for storing expanded data outputted from the data expansion circuit into a given storage area of the data RAM, a transfer requesting means 507 for transferring data, either expanded or unexpanded, read from the magnetooptical disk D, and an error processing means 508 for processing an error if there is no physical sector address corresponding to a logic sector address from the host computer 51.

Figure 39:
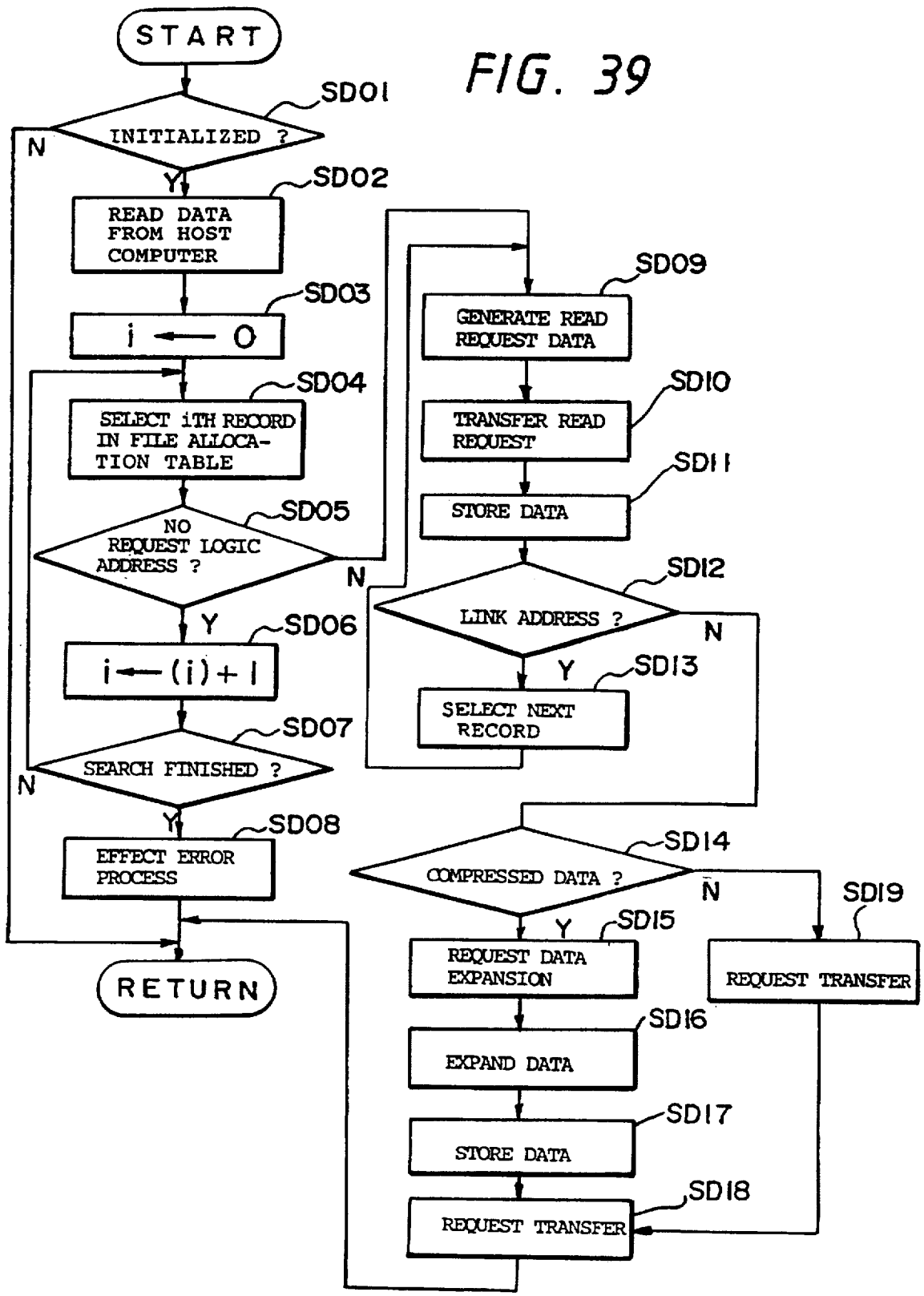
FIG. 39 is a flowchart of a processing operation of the reading means of the request processing means in the data transmitting apparatus according to the third embodiment.

According to the reading means 501, i.e., the reading subroutine, as shown in FIG. 39, the decision means 502 determines, in a step SD01, whether the magnetooptical disk D loaded in the external memory device 52 has been initialized or not based on whether the 1-byte data of the third byte in the attribute data stored in the attribute data storage area is "01" or not.

If the 1-byte data is "01" indicating that the magnetooptical disk D has been initialized, control goes to a next step SD02 in which the data receiving means 503 receives read request data supplied from the host computer 51. The read request data is composed of an identification code indicative of a read request, a read starting sector address (starting logic sector address), and a write data length (100 sectors in this example).

In a next step SD03, the index register i is initialized, i.e., an initial value "0" is stored in the index register i.

In a next step SD04, a record corresponding to the value of the index register i of the file allocation table FAT is selected among the attribute data stored in the attribute data storage area of the data RAM 174.

In a next step SD05, the decision means 502 determines whether the logic sector address stored in the starting logic sector address storage area "a" of the selected record is the same as the logic sector address read in the step SD02.

If these logic sector addresses are not the same as each other, then control proceeds to a step SD06 in which the value of the index register i is incremented by +1. In a next step SD07, the decision means 502 determines whether the search process is finished or not based on whether the value of the index register i is the same as the final record number N of the file allocation table FAT or not. If the value of the index register i is smaller than the final record number N, then control returns to the step SD04 in which a next record is selected in the file allocation table FAT, and it is determined whether a corresponding address is stored in the starting logic sector address storage area "a" of the selected record. This process is repeatedly carried out until a corresponding address is found. If a corresponding address is not found when the value of the index register i reaches the final record number N, then control goes to a step SD08 in which the error processing means 508 effects an error process, and ends the reading subroutine shown in FIG. 39.

The error process may specifically be carried out by transferring message data for indicating that no data can be read to the operator to the host computer 51, and displaying a message "DATA CANNOT BE READ" to the display unit connected to the host computer 51, thereby indicating to the operator that new data cannot be read from the presently loaded magnetooptical disk D.

If a corresponding address is found in the step SD05, control proceeds to a step SD09 in which the read request data generating means 504 generates read request data to read data of one physical block from an address corresponding to the logic sector address on the magnetooptical disk D. Specifically, read request data is generated in which there are recorded an identification code indicative of a read request, a read starting sector address, and a read data length.

An absolute sector address is registered as the read starting sector address. Specifically, an absolute sector address which is produced by adding the number of starting sectors (3 tracks×the number (25) of sectors in a track=75 sectors) of the user area UE to the physical sector address stored in the starting physical sector address storage area "c" of the selected record in the file allocation file FAT, is registered as the read starting sector address, and the number m of sectors of one physical sector is registered as the read data length.

In a next step SD10, the read request means 505 transfers the read request data through the interface 167 to the system controller 166.

Based on the read request data from the data processing apparatus 1, the system controller 166 controls the servo controller 165 and various mechanisms, and reads, through the optical pickup 152, compressed or uncompressed data of one physical block (m sectors) from an address indicated by the read starting sector address contained in the read request data on the magnetooptical disk D, and supplies the read data of one physical block through the interface 167 to the data processing apparatus 1.

According to the reading subroutine, the read data of one physical block sent from the system controller 166 is stored into the data storage area allotted to the data RAM 174 in a step SD11.

In a next step SD12, the decision means 502 determines whether a link address exists or not based on whether there is a link address in the link address storage area "e" of the ith record selected in the step SD04. If there is a link address, then control proceeds to a step SD13 in which a next record is selected. Thereafter, control returns to the step SD09, and the step SD09 and following steps are executed. Specifically, data of one physical block is read from the physical sector address stored in the starting physical sector address storage area "c" of the record selected in the step SD13 on the magnetooptical disk D is read and stored into an empty area of the data storage area allotted to the data RAM 174.

The above process is repeatedly carried out until it is determined in the step SC12 that there is no link address in the link address storage area "e" of the selected record.

When it is determined that there is no link address, control proceeds to a step SD14 in which the decision means 502 determines whether the presently read data is compressed data or not based on whether the last 1-byte data of 3-byte data stored in the link address storage area "e" of the selected final record is "01" or not.

If the last 1-byte data is "01", then control goes to a next step SD15 in which the read data stored in the data storage area is outputted to the data expansion circuit 180. The data expansion circuit 180 effects a loss-less data expanding process on the supplied data using the buffer memory 179 in a step SD16.

In a next step SD17, the expanded data storing means 506 stores the expanded data from the data expansion circuit 180 into the expanded data storage area of the data RAM 174.

In a next step SD18, the transfer requesting means 507 outputs a transfer request to transfer the expanded data to the host computer 51. Specifically, transfer request data is generated by adding the expanded data to a header in which there are registered an identification code indicative of a transfer request, a destination starting sector address, and a transfer data length.

A logic sector address stored in the starting logic sector address storage area "a" of the record in the file allocation table FAT which has been selected in the step SD04 is registered as the destination starting sector address, and the number of sectors of one logic block is registered as the transfer data length.

The generated transfer request data is transferred through the interface 168 to the host computer 51, whereupon the reading subroutine is finished. Based on the transfer request data from the data processing apparatus 1, the host computer 51 reads the destination starting sector address from the header of the transfer request data, and thereafter stores the expanded data into an address corresponding to the destination starting sector address of the data RAM connected through the data bus.

If the last 1-byte data is "00" in the step SD14, then control goes to a next step SD19 in which the transfer requesting means 507 outputs a transfer request to transfer the unexpanded data (data sent directly from the system controller 166) to the host computer 51. Specifically, transfer request data is generated by adding the unexpanded data (the data from the system controller 166 which has been stored into the data storage area of the data RAM 174 by the data receiving means 503 in the step SD11) to a header in which there are registered an identification code indicative of a transfer request, a destination starting sector address, and a transfer data length.

A logic sector address stored in the starting logic sector address storage area "a" of the record in the file allocation table FAT which has been selected in the step SD04 is registered as the destination starting sector address, and the number of sectors of one logic block is registered as the transfer data length.

The generated transfer request data is transferred through the interface 168 to the host computer 51, whereupon the reading subroutine is finished. Based on the transfer request data from the data processing apparatus 1, the host computer 51 reads the destination starting sector address from the header of the transfer request data, and thereafter stores the unexpanded data into an address corresponding to the destination starting sector address of the data RAM (not. shown) connected through the data bus.

If the presently loaded magnetooptical disk D has not been initialized in the step SD01, then, as with the step S408 in the main routine shown in FIG. 25, message data representing an initialization prompt is transferred to the host computer 51. The host computer 51 then displays a message "INITIALIZE DISK" on the display unit connected thereto, indicating to the operator that the presently loaded magnetooptical disk D has not been initialized.

If the request from the host computer 51 is not a reading request in the step S605 shown in FIG. 28, then control goes to a step S607 in which the decision means 210 (see FIG. 24) determines whether the request from the host computer 51 is a data deleting request or not.

If the request from the host computer 51 is a data deleting request, then control goes to a step S608, entering a data deleting subroutine which is the data deleting means 601.

Figure 40:
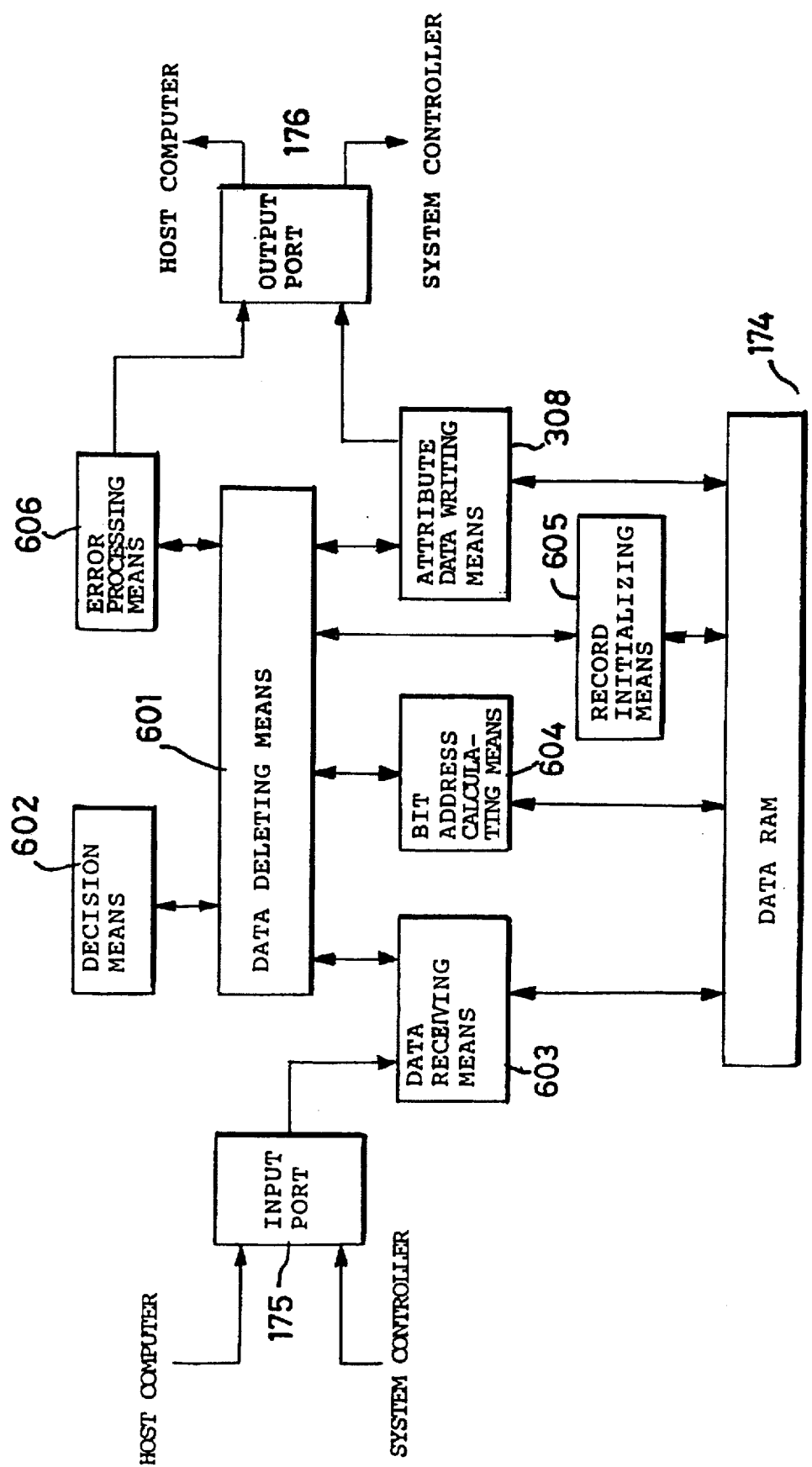
FIG. 40 is a functional block diagram showing a processing operation of a data deleting means of the request processing means in the data transmitting apparatus according to the third embodiment.

As shown in FIG. 40, the data deleting means 601 has, in addition to the attribute data writing means 308 (see FIG. 29), a decision means 602 for making various decisions, a data receiving means 603 for receiving data deletion request data supplied from the host computer 51 through the interface 168 to the input port 175, a bit address calculating means 604 for calculating a bit address on the record status table of a physical sector address corresponding to a logic sector address from the host computer 51, a record initializing means 605 for initializing a record corresponding to the logic sector address of the file allocation table FAT, and an error processing means 606 for processing an error if there is no physical sector address corresponding to a logic sector address.

Figure 41:
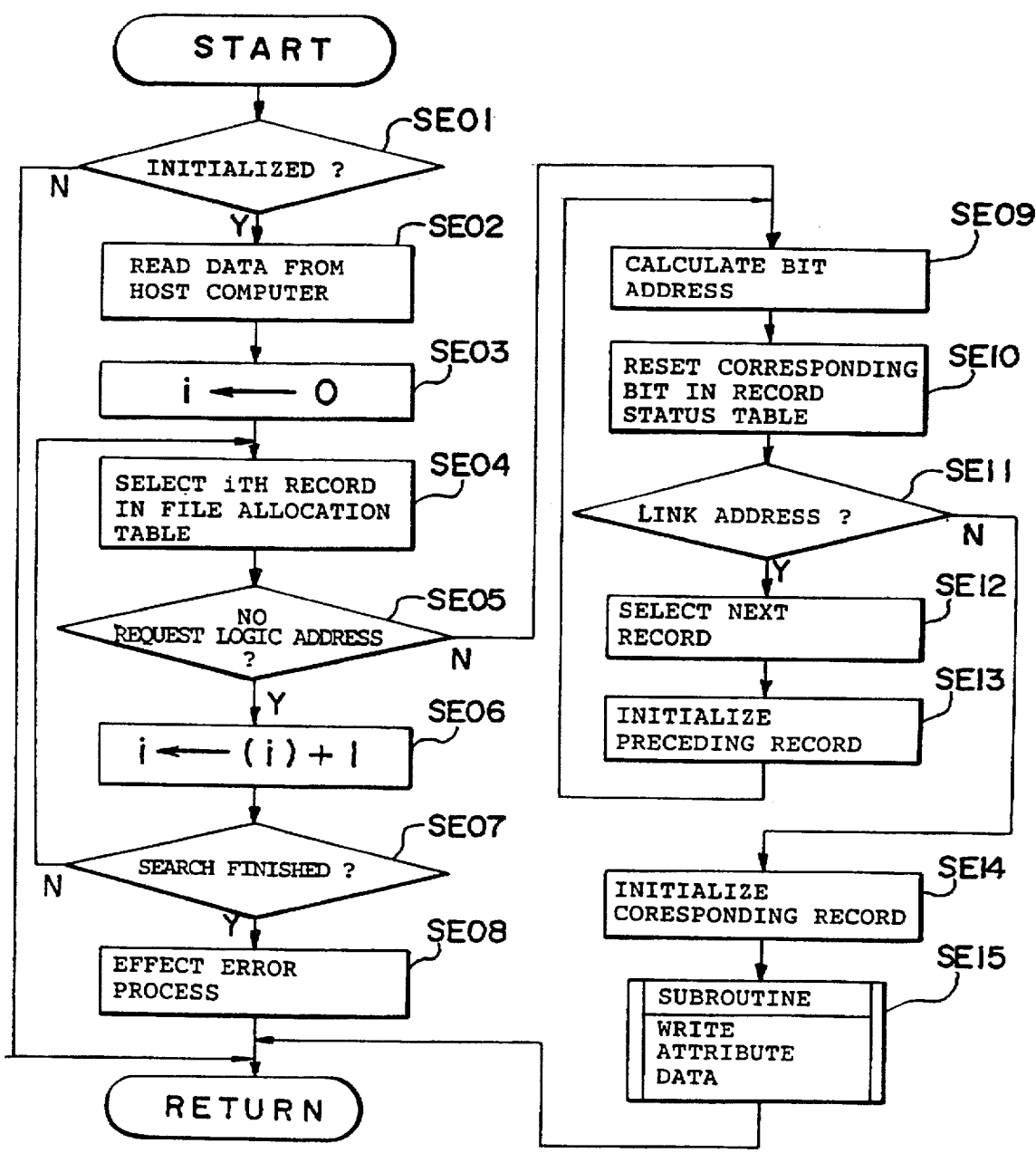
FIG. 41 is a flowchart of a processing operation of the data deleting means of the request processing means in the data transmitting apparatus according to the third embodiment.

According to the data deleting means 601, i.e., the data deleting subroutine, as shown in FIG. 41, the decision means 602 determines, in a step SE01, whether the magnetooptical disk D loaded in the external memory device 52 has been initialized or not based on whether the 1-byte data of the third byte in the attribute data stored in the attribute data storage area is "01" or not.

If the 1-byte data is "01" indicating that the magnetooptical disk D has been initialized, control goes to a next step SE02 in which the data receiving means 603 reads data deletion request data supplied from the host computer 51. The data deletion request data is composed of an identification code indicative of a data deletion request, a data deletion starting sector address (starting logic sector address), and a deletion data length (100 sectors in this example).

In a next step SE03, the index register i is initialized, i.e., an initial value "0" is stored in the index register i.

In a next step SE04, a record corresponding to the value of the index register i of the file allocation table FAT is selected among the attribute data stored in the attribute data storage area of the data RAM 174.

In a next step SE05, the decision means 602 determines whether the logic sector address stored in the starting logic sector address storage area "a" of the selected record is the same as the logic sector address received in the step SE02.

If these logic sector addresses are not the same as each other, then control proceeds to a step SE06 in which the value of the index register i is incremented by +1. In a next step SE07, the decision means 602 determines whether the search process is finished or not based on whether the value of the index register i is the same as the final record number N of the file allocation table FAT or not. If the value of the index register i is smaller than the final record number N, then control returns to the step SE04 in which a next record is selected in the file allocation table FAT, and it is determined whether a corresponding address is stored in the starting logic sector address storage area "a" of the selected record. This process is repeatedly carried out until a corresponding address is found. If a corresponding address is not found when the value of the index register i reaches the final record number N, then control goes to a step SE08 in which the error processing means 606 effects an error process, and ends the data deleting subroutine shown in FIG. 41.

The error process may specifically be carried out by transferring message data for indicating that no data can be deleted to the operator to the host computer 51, and displaying a message "DATA CANNOT BE DELETED" to the display unit connected to the host computer 51, thereby indicating to the operator that there is no data which can be deleted from the presently loaded magnetooptical disk D.

If a corresponding address is found in the step SE05, control proceeds to a step SE09 in which the bit address calculating means 604 reads a physical sector address from the starting physical sector address storage area "c" of the selected record, and calculates a bit address "b" corresponding to the physical sector address in the string of bits making up the record status table. The bit address "b" is calculated according to b=S/m where S is the physical sector address and m is the number of sectors of one physical block.

In a next step SE10, a bit corresponding to the bit address "b" calculated by the bit address calculating means 604 in the string of bits making up the record status table is set to "1". That is, bit setting processing is carried out.

In a next step SE11, the decision means 602 determines whether a link address exists or not based on whether a link address is stored in the link address storage area "e" of the record selected in the step SE04. If there is a link address, then control proceeds to a step SE12 in which a next record is selected. In a next step SE13, the record initializing means 605 initializes the preceding record, i.e., "0" is stored into the preceding record.

Thereafter, control returns to the step SE09, and the step SD09 and following steps are executed. Specifically, a physical sector address is read from the starting physical sector address storage area "c" of the record selected in the step SE12, a bit address of the record status table corresponding to the physical sector address is calculated, and a bit corresponding to the bit address "b" obtained by the above bit address calculation in the string of bits making up the record status table is set to "0".

The above process is repeatedly carried out until it is determined in the step SE11 that there is no link address in the link address storage area "e" of the selected record. When it is determined that there is no link address in the step SE11, control goes to a step SE14 in which the record initializing means 605 initializes the presently selected record, i.e., "0" is stored into the presently selected record.

In a next step SE15, control enters an attribute data writing subroutine which is the attribute data writing means 308. Since this attribute data writing subroutine is the same as the attribute data writing subroutine shown in FIG. 31, details of the attribute data writing subroutine will not be described below except that updated attribute data of 3 sectors stored in the attribute data storage area of the data RAM 174 is recorded in the sectors 0~2 of the track 0, the sectors 12~14 of the track 1, the sectors 0~2 of the track 9997, and the sectors 12~14 of the track 9998 on the magnetooptical disk D.

When the attribute data writing subroutine is finished, the data deleting subroutine is also finished.

If the presently loaded magnetooptical disk D has not been initialized in the step SE01, then as with the step S408 in the main routine shown in FIG. 25, message data representing an initialization prompt is transferred to the host computer 51. The host computer 51 then displays a message "INITIALIZE DISK" on the display unit connected thereto, indicating to the operator that the presently loaded magnetooptical disk D has not been initialized.

If the request from the host computer 51 is not a data deleting request, then control goes to a step S609, other processing is carried out depending on a request from the host computer 51.

Referring back to the main routine shown in FIG. 25, the decision means 202 determines, in a next step S411, whether a disk unloading request has been inputted or not based on whether an internal interrupt signal generated by a command input which corresponds to a disk unloading request and is applied to the key input means such as a keyboard connected to the host computer 51, or by operation of a disk unloading key on a control panel mounted on an outer casing of the external memory device 52, is supplied through the input port 175 or not.

If no internal interrupt signal is supplied, indicating that there is no disk unloading request, then control returns to the step S409, waiting for a next processing request from the host computer 51. If an internal interrupt signal is supplied, indicating that there is a disk unloading request, then control proceeds to the step S412 in which a disk unloading request is outputted to the system controller 166 through the output port 176 and the interface 167.

Based on a disk unloading request signal from the data processing apparatus 1, the system controller 166 controls a disk loading mechanism in the external memory device 52 to move the magnetooptical disk D mounted on the turntable 154 on the spindle motor 151 to an unloading slot, which doubles as a loading slot, i.e., to a position where the operator can easily remove the magnetooptical disk D out of the external memory device 52. At this time, the process of unloading the magnetooptical disk D is finished.

Then, the decision means 202 determines, in a step S413, whether there is a program finishing request or not based on whether there is a finishing request interrupt input such as a power supply turn-off input.

If there is no program finishing request in the step S413, then control returns to the step S403 to wait for the loading of a next magnetooptical disk D. If there is a program finishing request in the step S413, then the data processing program 201 comes to an end.

Two other preferable functions that are added to the data processing apparatus according to the third embodiment will be described below.

The first function is to indicate a remaining data recording capacity of the magnetooptical disk D to the host computer 51.

Specifically, when a read capacity request command for confirming a remaining data recording capacity of the magnetooptical disk D is inputted from the host computer 51 to the data processing apparatus 1, the CPU 181 can usually calculate a remaining data recording capacity, or stated otherwise, an unrecorded physical data recording capacity represented by X[KB] or XKB, by subtracting used physical sector addresses obtained by referring to data management information on the magnetooptical disk D of the file allocation table FAT stored in the attribute data storage area of the data RAM 174, from a known entire data recording size in the user area UE, which may be calculated from data (the number of tracks in the user area UE and the number of sectors per track) recorded as pre-pits in a suitable area on the magnetooptical disk D.

Then, the equation: the expected compression ratio $\beta \times$ the remaining physical data recording capacity x=the remaining logic data recording capacity Y is calculated to indicate the resulting remaining logic data recording capacity $Y=\beta \cdot X$ [KB] to the host computer 51.

The host computer 51 can now recognize at present that at most as much data as the remaining logic data recording capacity Y can be recorded on the magnetooptical disk D.

According to the loss-less data compression technique, however, the actual compression ratio $\epsilon$ for data compression is not constant, but cannot accurately be determined unless data is compressed. If the remaining data recording capacity of the magnetooptical disk D is managed as ($\beta \cdot X = Y$), when data of the same capacity (the same length) as the remaining maximum pre-compression data Y is transferred to the data processing apparatus, the transferred pre-compression data may not be recorded in its entirety, either compressed or uncompressed, on the magnetooptical disk D provided the actual compression ratio $\epsilon$ of the data is smaller than the expected compression ratio $\beta$.

To avoid the above situation, a special recording area is provided on the magnetooptical disk D for recording an overflow of data produced after the data is compressed if the actual compression ratio $\epsilon$ of the data is smaller than the expected compression ratio $\beta$ and when the data length of the compressed data is equal to or greater than the remaining physical data recording capacity X. The special recording area comprises a recording area composed of 100 sectors back from the sector 24 of the final track 9947 of the user area UE, for example. These 100 sectors are subtracted from the remaining physical data recording capacity X when the remaining logic recording capacity Y is calculated in the CPU of the data processing apparatus. The area of the 100 sectors is a recording area (capacity) that is concealed from the host computer 51.

The alternate area AE is usually designed to leave a sufficient area even when the user area UE is used in its entirety. Therefore, the above concealed recording area may comprise such an extra area left in the alternate area AE, thereby preventing the recording capacity of the user area UE from being reduced.

According to another technique to avoid a situation in which the transferred pre-compression data Y may not be recorded in its entirety, either compressed or uncompressed, on the magnetooptical disk D, when a read capacity request command is inputted from the host computer 51, an apparent logic data recording capacity with the expected compression ratio $\beta$ reduced depending on a reduction in the physical unrecorded data recording capacity on the magnetooptical disk D may be reported to the host computer 51.

Figure 42:
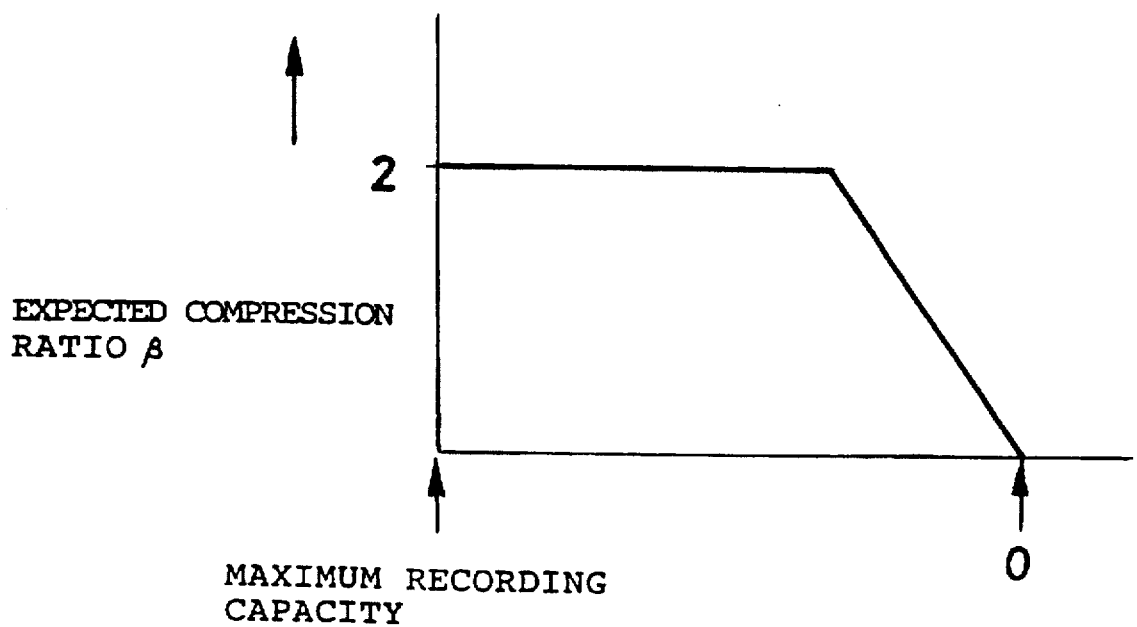
FIG. 42 is a diagram showing an apparent logic data recording capacity with a predicted compression ratio β reduced in a manner to correspond to a reduction in a physical unrecorded data recording capacity on a magnetooptical disk.
Figure 43:
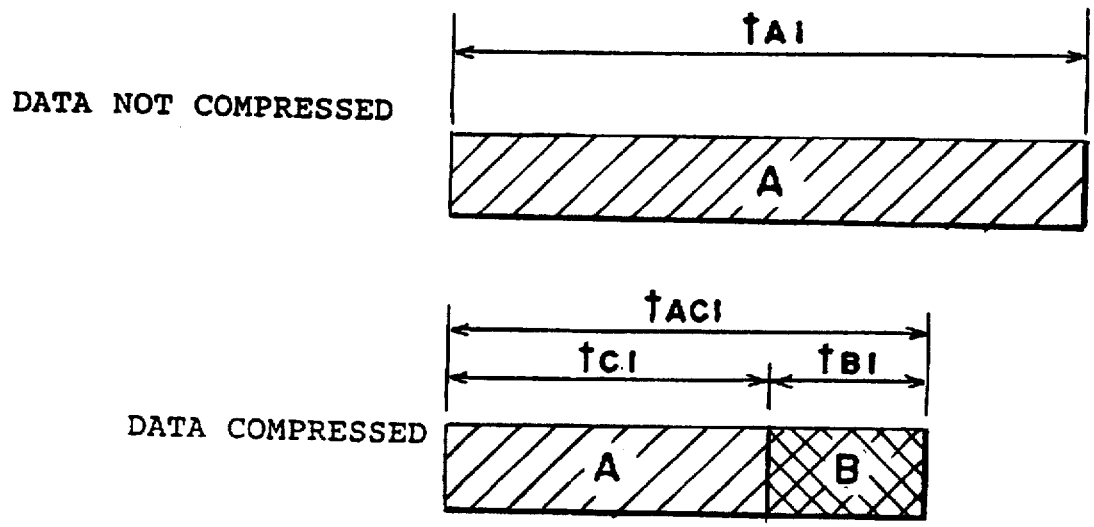
FIG. 43 is a diagram illustrative of a transfer time for data compressed according to the loss-less data compression technique.
Figure 44:
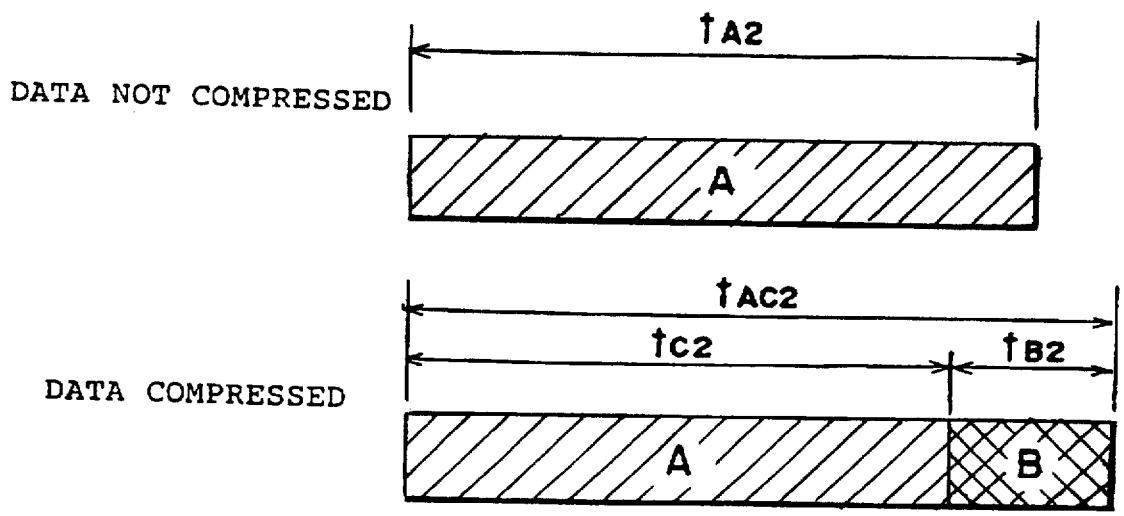
FIG. 44 is a diagram illustrative of a transfer time for data compressed at a low compression ratio.

FIG. 42 illustrates such another technique. As shown in FIG. 42, the expected compression ratio $\beta$ is $\beta=2$ when the physical unrecorded data capacity Y ranges from a maximum recording capacity to a certain value, and is gradually reduced when the physical unrecorded data capacity Y ranges from the certain value to a physical unrecorded data capacity 0. For example, if the physical unrecorded data capacity Y is 10 MB, then it may be reported to the host computer 19 that the physical unrecorded data capacity Y is 20 MB, and if the physical unrecorded data capacity Y is 1 MB, then it may be reported to the host computer 19 that the physical unrecorded data capacity Y is 1.5 MB. In this manner, even when maximum data of the remaining physical unrecorded data capacity Y is sent from the host computer 51, the possibility that the compressed data will overflow the recordable area on the magnetooptical disk D can be reduced.

An actual compression ratio $\epsilon$ calculated when data is compressed may be stored, and the value of the expected compression ratio $\beta$ may be replaced with the stored actual compression ratio $\epsilon$ in a next accessing cycle. The expected compression ratio $\beta$ may also be recorded in the DDS sector of the magnetooptical disk D, and updated.

The other function is to rearrange mutually related data randomly recorded in physical blocks on the magnetooptical disk D into data that are successively arranged in physical blocks.

In the above example, according to the writing means (writing subroutine) 400, particularly the processing routine from the steps SA05~SA15 shown in FIGS. 34 and 35, i.e., the processing routine executed by the random individual record searching means 409, when data of one logic block is compressed into compressed data of two or more physical blocks by the data compression circuit 178, if there are not found successive areas, i.e., as many successive areas as the number of produced physical blocks, for recording the compressed data or uncompressed data, then the data are randomly recorded in units of one physical block at physical sector addresses where no data has been recorded.

Therefore, the mutually related data are recorded separately at positions spaced from each other on the magnetooptical disk D. In this case, when the data are to be read from the magnetooptical disk D, the process of seeking the data is time-consuming, resulting in an increased access time.

According to this embodiment, no branching process is carried out by the request processing means 204 in the data processing means 201, but a rearranging program is incorporated which is started periodically or irregularly by the OS in the absence of an access request from the host computer 51. The rearranging program will be described below.

It is assumed that write data of one logic block represented by the logic sector addresses 4900~4999 is divided into uncompressed data of 50 sectors beginning from the physical sector address 2000 and uncompressed data of 50 sectors beginning from the physical sector address 3560. In the absence of an access request from the host computer 51, the rearranging program refers to the file allocation table FAT, and arranges the positions where the block data are separately recorded.

Specifically, if the physical sector addresses 2050~2099 become empty, the uncompressed data at the physical addresses 3561~4110 is shifted to the empty physical sector addresses. Alternatively, the 100 sectors, i.e., the 50 sectors at the physical sector addresses 2000~2049 and the 50 sectors at the physical sector addresses 3560~4109, of the uncompressed data may be shifted to a completely different data recording position.

When there is a request from the host computer 51 to read data of one logic block, therefore, since data of two physical blocks corresponding to the data of one logic block are successively recorded on the magnetooptical disk D, the process of seeking the data is prevented from being excessively time-consuming, and the access time can greatly be shortened.

In the data processing apparatus (data transmitting apparatus) 1 according to the third embodiment which is incorporated in the external memory device 52, therefore, the data processing means 201 searches the attribute data recorded in the attribute data recording areas of the magnetooptical disk D, i.e., the record status of physical blocks of data recorded in the user area UE based on the file allocation table FAT, to generate a record status table of 1 bits (1/0= recorded/unrecorded) each for one physical block. Therefore, when there is a data writing request from the host computer 51, the writing means (writing subroutine) 401 searches the statuses of the bits of a bit string making up the record status table to determine at which physical sector address data is to be recorded. Consequently, the search time can be made shorter than if physical sector addresses stored in the starting physical sector address storage area "c" of the file allocation table FAT were directly searched. Since the record statuses can be recognized by simple bits of 1/0, the time required for program debugging, system maintenance, etc. is shorter than if the record statuses were recognized from physical sector addresses having a complex bit arrangement in data structure.

According to the third embodiment, furthermore, in the writing means 401, when data of one block from the host computer 51 is compressed by the data compression circuit 178, if the data length of the compressed data is equal to or less than the number of sectors of one physical block and the actual compression ratio $\epsilon$ is equal to or greater than $\beta/(\beta-1)$, then the data compressed by the data compression circuit 178 is recorded on the magnetooptical disk D, and if the actual compression ratio $\epsilon$ is in the range of $0<\epsilon<\beta/(\beta-1)$, i.e., if the data length (the number of physical blocks) of the data compressed by the data compression circuit 178 is substantially equal to or greater than one logic block, then data (uncompressed data) directly supplied from the host computer 51 is recorded on the magnetooptical disk D. Consequently, the recorded data with its actual compression ratio $\epsilon$ being in the range of $0<\epsilon<\beta/(\beta-1)$, among the data recorded on the magnetooptical disk D, is not required to be expanded, so that the speed at which the data is read from the magnetooptical disk D can be increased for increased performance of the external memory device.

The above process needs new information for distinguishing compressed data and uncompressed data from each other. According to the present embodiment, decision data for distinguishing compressed data and uncompressed data from each other is stored together with information indicative of no link address in the link address storage area "e" of the file allocation table FAT. Therefore, it is not necessary to keep a storage area for registering the decision data on the magnetooptical disk D, with the result that the problem of a reduced data recording capacity is alleviated.

According to this embodiment, furthermore, for recording data over two or more physical blocks, the writing means 401 has the random successive record searching means 410 for searching for successive recording areas to record these data over two or more physical blocks and registering the recording areas in the file allocation table FAT. Accordingly, the data over two or more physical blocks are prevented from being recorded in physically spaced positions, and the seek time for reading data can effectively be shortened.

In the above embodiments, the present invention is applied to rewritable magnetooptical (MO) disks. However, the principles of the present invention are also applicable to hard disks which comprise magnetic disks. If the principles of the present invention are applied to a WORM (write-once read-multiple) disk where data can be written only once, then data can be shifted to a completely different recording position. However, when data is shifted to a completely different recording position on the WORM disk, the data recording capacity available on the WORM disk is reduced. Therefore, this data shifting process is usually not carried out though it may be effected. The present invention can be applied to a technique to record the file allocation table FAT on the magnetooptical disk D.

We claim:

1. An apparatus for recording data, comprising:

data recording means for recording data on a recording medium;

data compressing means for compressing input data;

data holding means for pre-compression data which comprises input data that is not compressed and compressed data from the data compressing means;

decision means for determining data to be transmitted, based on data lengths of the pre-compression data and the compressed data and a preset condition; and data output means for outputting either one of the pre-compression data and the compressed data held by the data holding means to the data recording means, based on decision results from the decision means;

wherein the decision means outputs decision results indicating the data to be transmitted as the compressed data if an actual difference between the data lengths of the pre-compression data and the compressed data is at least a preset difference and also if an actual compression ratio of the data length of the pre-compression data to the data length of the compressed data is at least a preset compression ratio, and outputs decision results indicating the data to be transmitted as the pre-compression data otherwise.

2. An apparatus according to claim 1, wherein the actual compression ratio $\epsilon$ must be $<\beta(\beta-1)$ where $\beta$ is a compression ratio to be expected when the pre-compression data is compressed.

3. An apparatus according to claim 2, wherein addresses defined in the input data are referred to as logic addresses with reference to unit logic blocks determined by a data length of the input, and addresses defined by address allocation in recording the compressed data on the recording medium are referred to as physical addresses with reference to unit physical blocks determined by the data length of the compressed data produced after the input data is compressed at the same actual compression ratio $\epsilon$ as the expected compression ratio $\beta$ by the data compressing means, and wherein the data output means outputs the compressed data or the pre-compression data to the data recording means while specifying a writing physical address of the compressed data or the pre-compression data.

4. An apparatus according to claim 3, further comprising recording means for recording an allocation table representing a correspondence between reading logic addresses of the input data and writing physical addresses of the compressed data or the pre-compression data in a predetermined area of the recording medium.

5. An apparatus according to claim 4, further comprising table generating means for generating a record status table composed of record statuses of data recorded on the recording medium as bit information in units of physical blocks, based on the physical addresses registered in the allocation table.

6. An apparatus according to claim 5, wherein the table generating means comprises bit calculating means for calculating bits corresponding to the physical addresses registered in the allocation table based on unit physical blocks, and set bit processing means for setting bits calculated by the bit calculating means, in a string of bits making up the record status table.

7. An apparatus according to claim 3, further comprising:

individual area searching means for searching a substantially unrecorded area on the recording medium in units of physical blocks to detect a physical address in the unrecorded area;

the data output means comprising means for outputting the compressed data or the pre-compression data to the data recording means while specifying the physical address in the unrecorded area detected by the individual area searching means.

8. An apparatus according to claim 7, wherein the individual area searching means detects the physical address in the unrecorded area based on the bit information of the record status table generated by the table generating means.

9. An apparatus according to claim 3, further comprising successive area searching means for searching a substantially unrecorded area on the recording medium in units of at least two successive physical blocks to detect a physical address in the unrecorded area if the actual compression ratio is smaller than the predicted compression ratio and the compressed data extends over at least two physical blocks, wherein the data output means outputs the compressed data or the pre-compression data to the data recording means while specifying the physical address in the unrecorded area detected by the successive area searching means.

10. An apparatus according to claim 9, wherein the successive area searching means detects the physical address in the unrecorded area based on bit string information corresponding to the at least two physical blocks, in the record status table generated by the table generating means.

11. An apparatus according to claim 4, wherein the allocation table has:

a first registering area in which the reading logic addresses of the input data and the writing physical addresses of the compressed data or the pre-compression data corresponding to the reading logic addresses are registered; and a second registering area in which the physical addresses of the respective physical blocks, except for a starting physical address, are registered as respective link addresses if the compressed data or the pre-compression data extends over at least two physical blocks; and wherein information indicative of no link address and decision data representing whether the data to be recorded on the recording medium is the compressed data or the pre-compression data are registered in an area corresponding to a final physical block in the second registering area.

12. A method of recording data, comprising the steps of:

determining data to be recorded, based on a data length of pre-compression data which comprises input data that is not compressed, a data length of compressed data which comprises input data that is compressed, and a preset condition; and recording either one of the pre-compression data and the compressed data on a recording medium based on decision results;

wherein the compressed data is recorded if the decision results indicate that an actual difference between the data lengths of the pre-compression data and the compressed data is at least a preset difference and also that an actual compression ratio of the data length of the pre-compression data to the data length of the compressed data is at least a preset compression ratio, and the pre-compression data is recorded otherwise.

13. A method according to claim 12, wherein the actual compression ratio $\epsilon$ must be $<\beta(\beta-1)$ where $\beta$ is a compression ratio to be expected when the pre-compression data is compressed.

14. A method according to claim 13, wherein addresses defined in the input data are referred to as logic addresses with reference to unit logic blocks determined by a data length of the input, and addresses defined by address allocation in recording the compressed data on the recording medium are referred to as physical addresses with reference to unit physical blocks determined by the data length of the compressed data produced after the input data is compressed at the same actual compression ratio $\epsilon$ as the expected compression ratio $\beta$, and wherein the compressed data or the pre-compression data is recorded while specifying a writing physical address of the compressed data or the pre-compression data.

15. A method according to claim 14, wherein an allocation table representing a correspondence between reading logic addresses of the input data and writing physical addresses of the compressed data or the pre-compression data is recorded in a predetermined area of the recording medium.

16. A method according to claim 15, wherein a record status table composed of record statuses of data recorded on the recording medium as bit information in units of physical blocks is recorded based on the physical addresses registered in the allocation table.

17. A method according to claim 16, wherein bits corresponding to the physical addresses registered in the allocation table are calculated based on unit physical blocks, and the calculated bits in a string of bits making up the record status table are subjected to a set bit process.

18. A method according to claim 14, wherein a substantially unrecorded area on the recording medium is searched in units of physical blocks to detect a physical address in the unrecorded area, and the compressed data or the pre-compression data is recorded while specifying the physical address in the unrecorded area which is detected.

19. A method according to claim 18, wherein the physical address in the unrecorded area is detected based on the bit information of the record status table.

20. A method according to claim 14, wherein a substantially unrecorded area on the recording medium is searched in units of at least two successive physical blocks to detect a physical address in the unrecorded area if the actual compression ratio is smaller than the predicted compression ratio and the compressed data extends over at least two physical blocks, and wherein the compressed data or the pre-compression data is recorded while specifying the physical address in the unrecorded area which is detected.

21. A method according to claim 20, wherein the physical address in the unrecorded area is detected based on bit string information corresponding to the at least two physical blocks, in the record status table.

22. A method according to claim 15, wherein the allocation table has:

a first registering area in which the reading logic addresses of the input data and the writing physical addresses of the compressed data or the pre-compression data corresponding to the reading logic addresses are registered; and a second registering area in which the physical addresses of the respective physical blocks, except for a starting physical address, are registered as respective link addresses if the compressed data or the pre-compression data extends over at least two physical blocks; and wherein information indicative of no link address and decision data representing whether the data to be recorded on the recording medium is the compressed data or the pre-compression data are registered in an area corresponding to a final physical block in the second registering area.

* * * * *